(12) United States Patent
Kawashima et al.

(10) Patent No.: US 9,064,570 B2
(45) Date of Patent: Jun. 23, 2015

(54) NON-VOLATILE MEMORY DEVICE AND METHOD FOR MANUFACTURING THE SAME

(71) Applicant: Panasonic Intellectual Property Management Co., Ltd., Osaka (JP)

(72) Inventors: Yoshio Kawashima, Osaka (JP); Yukio Hayakawa, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 63 days.

(21) Appl. No.: 13/985,435

(22) PCT Filed: Dec. 17, 2012

(86) PCT No.: PCT/JP2012/008033
§ 371 (c)(1),
(2) Date: Aug. 14, 2013

(87) PCT Pub. No.: WO2013/094169
PCT Pub. Date: Jun. 27, 2013

(65) Prior Publication Data
US 2014/0063913 A1    Mar. 6, 2014

(30) Foreign Application Priority Data

Dec. 19, 2011    (JP) ................................. 2011-277723

(51) Int. Cl.
*G11C 13/00*    (2006.01)
*H01L 27/24*    (2006.01)
*H01L 45/00*    (2006.01)

(52) U.S. Cl.
CPC ........ *G11C 13/0064* (2013.01); *G11C 13/0007* (2013.01); *G11C 13/004* (2013.01);
(Continued)

(58) Field of Classification Search
CPC ............ G11C 13/0064; G11C 13/004; G11C 13/0069; G11C 13/0007; G11C 2213/72; G11C 2213/56; G11C 2013/0054; H01L 27/2481; H01L 27/2409; H01L 27/2463; H01L 45/1233; H01L 45/1625; H01L 45/1675; H01L 45/08; H01L 45/146
See application file for complete search history.

(56) References Cited

U.S. PATENT DOCUMENTS 4,479,200 A    10/1984    Sato et al.
6,753,561 B1    6/2004    Rinerson et al.
(Continued)

FOREIGN PATENT DOCUMENTS

JP    58-118087    7/1983
JP    06-208350    7/1994
(Continued)

OTHER PUBLICATIONS
International Search Report issued Jan. 22, 2013 in International (PCT) Application No. PCT/JP2012/008033.

*Primary Examiner* — J. H. Hur
(74) *Attorney, Agent, or Firm* — Wenderoth, Lind & Ponack, L.L.P.

(57) ABSTRACT

A non-volatile memory device includes: a memory cell array including a plurality of memory cells each including a variable resistance element and a first current steering element; and a current steering element parameter generation circuit. The current steering element parameter generation circuit includes: a third line placed between a substrate and a second interlayer dielectric; a fourth line placed above the second interlayer dielectric; and a second current steering element which is connected between the third line and the fourth line without the variable resistance element being interposed therebetween when the variable resistance element is removed between the third line and the fourth line and has the same non-linear current steering characteristics as the first current steering element.

21 Claims, 44 Drawing Sheets

(52) U.S. Cl.
CPC .... *G11C13/0069* (2013.01); *G11C 2013/0054* (2013.01); *G11C 2213/56* (2013.01); *G11C 2213/72* (2013.01); *H01L 45/08* (2013.01); *H01L 45/1233* (2013.01); *H01L 45/146* (2013.01); *H01L 45/1625* (2013.01); *H01L 45/1675* (2013.01); *H01L 27/2409* (2013.01); *H01L 27/2463* (2013.01); *H01L 27/2481* (2013.01)

(56) References Cited

U.S. PATENT DOCUMENTS

| | | | |
|---|---|---|---|
| 8,009,456 | B2 | 8/2011 | Shimomura et al. |
| 8,022,502 | B2 | 9/2011 | Kanzawa et al. |
| 8,300,444 | B2 | 10/2012 | Nagashima et al. |
| 8,345,466 | B2 | 1/2013 | Maejima et al. |
| 8,445,319 | B2 | 5/2013 | Kanzawa et al. |
| 8,477,525 | B2 | 7/2013 | Ito |
| 2009/0180310 | A1 | 7/2009 | Shimomura et al. |
| 2009/0283736 | A1 | 11/2009 | Kanzawa et al. |
| 2009/0321711 | A1 | 12/2009 | Takagi et al. |
| 2010/0226164 | A1 | 9/2010 | Nagashima et al. |
| 2010/0314598 | A1* | 12/2010 | Park .................. 257/2 |
| 2011/0002157 | A1 | 1/2011 | Shimomura et al. |
| 2011/0032746 | A1 | 2/2011 | Maejima et al. |
| 2011/0228587 | A1 | 9/2011 | Ito |
| 2011/0294259 | A1 | 12/2011 | Kanzawa et al. |
| 2012/0092946 | A1* | 4/2012 | Kim et al. ............. 365/203 |
| 2012/0326113 | A1 | 12/2012 | Yoneda et al. |

FOREIGN PATENT DOCUMENTS

| | | |
|---|---|---|
| JP | 2009-099199 | 5/2009 |
| JP | 2009-170006 | 7/2009 |
| JP | 2010-049776 | 3/2010 |
| JP | 2011-054259 | 3/2011 |
| JP | 2011-198407 | 10/2011 |
| WO | 2008/047530 | 4/2008 |
| WO | 2008/149484 | 12/2008 |
| WO | 2011/155210 | 12/2011 |

\* cited by examiner

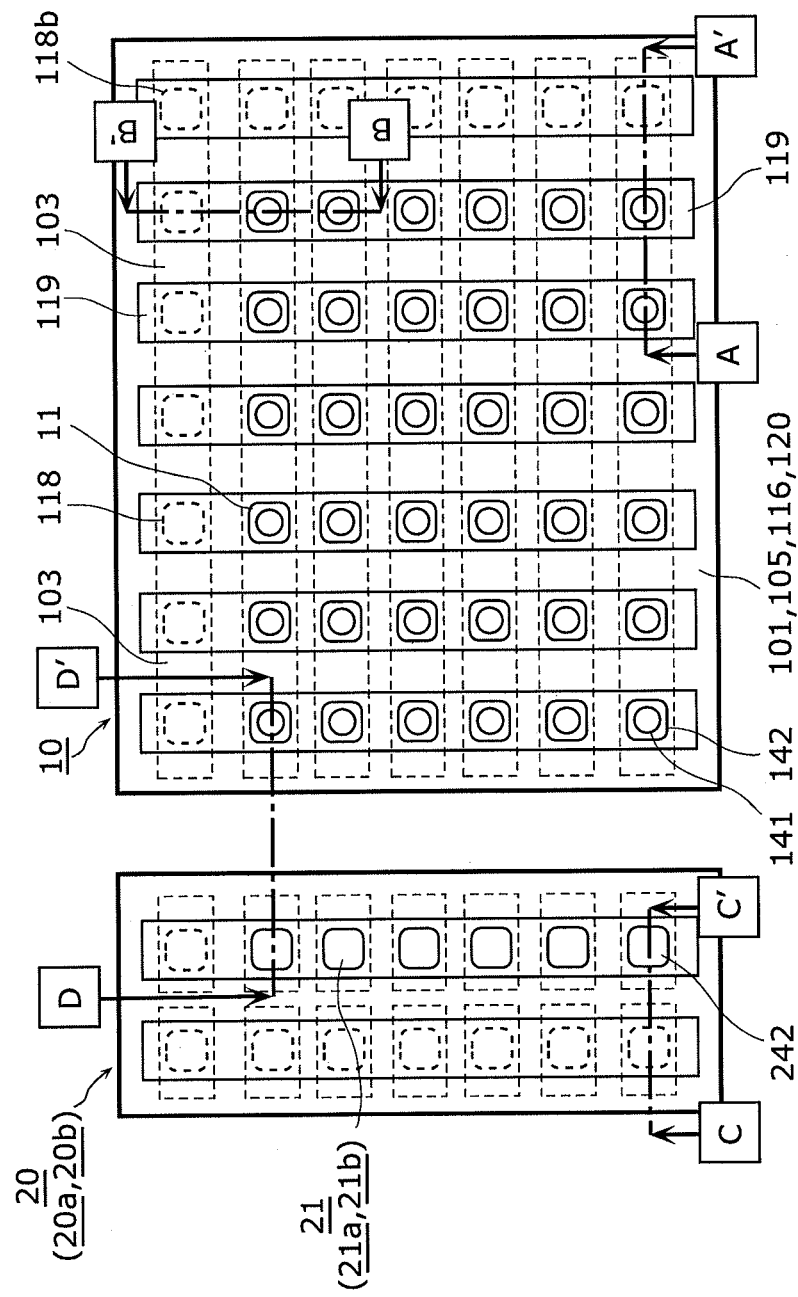

NON-VOLATILE MEMORY DEVICE AND METHOD FOR MANUFACTURING THE SAME

TECHNICAL FIELD

The present invention relates to a variable-resistance non-volatile memory device and a method for manufacturing the same.

BACKGROUND ART

Recently, with advancement in digital techniques used in electric devices, non-volatile memory devices having a large capacity have been actively developed for storage of data such as music, images, and other information. For example, non-volatile memory devices including ferro-electric capacitor elements have already been used in many fields.

Other than such non-volatile memory devices including ferro-electric capacitor elements, memory devices have been focused because of their characteristics of being easily compatible with conventional semiconductor manufacturing processes and being made in smaller size. Examples of such focused memory devices include: non-volatile memory devices including memory devices of a magneto resistive effect type such as tunneling magnetoresistive (TMR) devices; and non-volatile memory devices (referred to as ReRAM) including memory devices (variable resistance devices) of a variable resistance type having a resistance value variable with application of an electrical pulse and keeping a variable resistance state.

For example, Patent Literature 1 discloses a structure in which a variable resistance element and a diode are arranged in series in a vertical direction, a variable resistance film is formed in contact holes and to be a variable resistance element, and the diode is formed above the contact holes, for allowing the diode to have an effective area size larger than the effective area size of the variable resistance element.

Patent Literature 2 discloses a cross-point structure as a structure for realizing high integration of non-volatile memory devices. The non-volatile memory device having a cross-point structure disclosed in Patent Literature 2 includes a memory cell array including a plurality of memory devices each having a variable resistance element. The memory devices are arranged in via holes in a cross-point area in which a plurality of first lines and a plurality of second lines are arranged orthogonal to each other. In addition, in each memory device, elements having a non-linear current-voltage characteristic (non-linear elements or current steering elements) are arranged in series. These elements having a non-linear current-voltage characteristic selectively activate given ones of the memory devices in the memory cell array. More specifically, for example, use of diodes of a metal-insulator-metal (MIM) type as current steering elements allows the memory devices to perform bi-directional current steering.

CITATION LIST

Patent Literature

[PTL 1]
  PCT International Publication No. 2008/047530
[PTL 2]
  U.S. Pat. No. 6,753,561, Specification

SUMMARY OF INVENTION

Technical Problem

However, in the conventional non-volatile memory device having a cross-point structure including memory devices (memory cells) in each of which a variable resistance element and a non-linear current steering element are connected in series, current steering elements may have different non-linear current steering characteristics on a surface above a wafer substrate (a substrate on which a plurality of non-volatile memory devices are formed).

In view of these things, the present invention was made with an aim to provide a non-volatile memory device capable of detecting non-linear current steering characteristics of memory cells in each of chips.

Solution to Problem

In order to achieve the aforementioned object, a non-volatile memory device according to an aspect of the present invention includes: a memory cell array including a plurality of memory cells each having a stack structure in which a first current steering element and a variable resistance element are connected in series; and a current steering element parameter generation circuit (i) including a second current steering element for determining a current steering characteristic of the first current steering element, (ii) electrically connected to the memory cell array, and (iii) causing the memory cells to operate, wherein a first stack is formed in an area including an area in which the memory cell array is formed and an area in which the current steering element parameter generation circuit is formed, the first stack (i) including a current steering element lower electrode layer, a current steering layer, and a current steering element upper electrode layer, and (ii) functioning as the first current steering element and as the second current steering element, a second stack is formed above the first stack, the second stack (i) including a variable resistance element lower electrode layer, a first oxide layer including a first metal oxide of an oxygen deficient type, a second oxide layer including a second metal oxide having a small oxygen deficiency and a high resistance value compared to the first metal oxide, and a variable resistance element upper electrode layer, and (ii) functioning as the variable resistance element, and a part of the second stack is removed to allow the second current steering element and a layer positioned above the second current steering element to be connected in the area in which the current steering element parameter generation circuit is formed without the second oxide layer being interposed therebetween.

The non-volatile memory device configured as described above may be manufactured according to a non-volatile memory device manufacturing method including: forming a first stack in an area including an area in which the memory cell array is formed and an area in which the current steering element parameter generation circuit is formed, the first stack (i) including a current steering element lower electrode layer, a current steering layer, and a current steering element upper electrode layer, and (ii) being for forming the first current steering element and the second current steering element; forming a second stack above the first stack in the area including the area in which the memory cell array is formed and the area in which the current steering element parameter generation circuit is formed, the second stack (i) including a variable resistance element lower electrode layer, a first oxide layer including a first metal oxide of an oxygen deficient type, a second oxide layer including a second metal oxide having a small oxygen deficiency and a high resistance value compared to the first metal oxide, and a variable resistance element upper electrode layer, and (ii) being for forming the variable resistance element; and removing a part of or an entirety of the second stack to allow the second current steering element and a layer positioned above the second current steering element to be connected in an area in which the second current steering element is formed without the second oxide layer being interposed therebetween.

Advantageous Effects of Invention

With this structure, the first current steering element and the second current steering element have the same current steering characteristics. By detecting the current steering characteristics of the second current steering element in this way makes it possible to detect the current steering characteristics of the first current steering element formed in each of the memory cells. As a result, it is possible to provide a non-volatile memory device capable of detecting the non-linear current steering characteristics of the current steering element included in the memory cell and providing a feedback for setting a write voltage and a read voltage.

BRIEF DESCRIPTION OF DRAWINGS

FIG. 1 is a block diagram showing a part of a structure of a non-volatile memory device according to Embodiment 1 of the present invention.

[FIG.2]
FIG. 2 is a plan view of an exemplary structure of the non-volatile memory device according to Embodiment 1 of the present invention.

FIG. 3A is a cross-sectional view of an exemplary structure of a memory cell array according to Embodiment 1 of the present invention.

FIG. 3B is a cross-sectional view of an exemplary structure of a memory cell array according to Embodiment 1 of the present invention.

FIG. 3C is a cross-sectional view of an exemplary structure of the non-volatile memory device according to Embodiment 1 of the present invention.

FIG. 4 is a cross-sectional view of an exemplary structure of a current steering element parameter generation circuit according to Embodiment 1 of the present invention.

FIG. 5 is a cross-sectional view for explaining a method for manufacturing the non-volatile memory device according to Embodiment 1 of the present invention.

FIG. 6 is a cross-sectional view for explaining the method for manufacturing the non-volatile memory device according to Embodiment 1 of the present invention.

FIG. 7 is a cross-sectional view for explaining the method for manufacturing the non-volatile memory device according to Embodiment 1 of the present invention.

FIG. 8 is a cross-sectional view for explaining the method for manufacturing the non-volatile memory device according to Embodiment 1 of the present invention.

FIG. 9 is a cross-sectional view for explaining the method for manufacturing the non-volatile memory device according to Embodiment 1 of the present invention.

FIG. 10 is a cross-sectional view for explaining the method for manufacturing the non-volatile memory device according to Embodiment 1 of the present invention.

FIG. 11 is a cross-sectional view for explaining the method for manufacturing the non-volatile memory device according to Embodiment 1 of the present invention.

FIG. 12 is a cross-sectional view for explaining the method for manufacturing the non-volatile memory device according to Embodiment 1 of the present invention.

FIG. 13 is a cross-sectional view for explaining the method for manufacturing the non-volatile memory device according to Embodiment 1 of the present invention.

FIG. 14 is a cross-sectional view for explaining the method for manufacturing the non-volatile memory device according to Embodiment 1 of the present invention.

FIG. 15 is a cross-sectional view for explaining the method for manufacturing the non-volatile memory device according to Embodiment 1 of the present invention.

FIG. 16A is a cross-sectional view of an exemplary structure of a current steering element parameter generation circuit according to Embodiment 2 of the present invention.

FIG. 16B is a cross-sectional view of an exemplary structure of the non-volatile memory device according to Embodiment 2 of the present invention.

FIG. 17 is a cross-sectional view for explaining a method for manufacturing the non-volatile memory device according to Embodiment 2 of the present invention.

FIG. 18 is a cross-sectional view for explaining the method for manufacturing the non-volatile memory device according to Embodiment 2 of the present invention.

FIG. 19 is a cross-sectional view for explaining the method for manufacturing the non-volatile memory device according to Embodiment 2 of the present invention.

FIG. 20 is a cross-sectional view for explaining the method for manufacturing the non-volatile memory device according to Embodiment 2 of the present invention.

FIG. 21 is a cross-sectional view for explaining the method for manufacturing the non-volatile memory device according to Embodiment 2 of the present invention.

FIG. 22 is a cross-sectional view for explaining the method for manufacturing the non-volatile memory device according to Embodiment 2 of the present invention.

FIG. 23 is a cross-sectional view for explaining the method for manufacturing the non-volatile memory device according to Embodiment 2 of the present invention.

FIG. 24 is a cross-sectional view for explaining the method for manufacturing the non-volatile memory device according to Embodiment 2 of the present invention.

FIG. 25 is a cross-sectional view for explaining the method for manufacturing the non-volatile memory device according to Embodiment 2 of the present invention.

FIG. 26 is a cross-sectional view for explaining the method for manufacturing the non-volatile memory device according to Embodiment 2 of the present invention.

FIG. 27 is a cross-sectional view for explaining the method for manufacturing the non-volatile memory device according to Embodiment 2 of the present invention.

FIG. 28 is a cross-sectional view for explaining the method for manufacturing the non-volatile memory device according to Embodiment 2 of the present invention.

FIG. 29 is a cross-sectional view of an exemplary structure of a current steering element parameter generation circuit according to Embodiment 2 of the present invention.

FIG. 30A is a cross-sectional view of an exemplary structure of a current steering element parameter generation circuit according to Embodiment 3 of the present invention.

FIG. 30B is a cross-sectional view of the exemplary structure of the non-volatile memory device according to Embodiment 3 of the present invention.

FIG. 31 is a cross-sectional view for explaining a method for manufacturing the non-volatile memory device according to Embodiment 3 of the present invention.

FIG. 32 is a cross-sectional view for explaining the method for manufacturing the non-volatile memory device according to Embodiment 3 of the present invention.

FIG. 33 is a cross-sectional view for explaining the method for manufacturing the non-volatile memory device according to Embodiment 3 of the present invention.

FIG. 34 is a cross-sectional view for explaining the method for manufacturing the non-volatile memory device according to Embodiment 3 of the present invention.

FIG. 35 is a cross-sectional view for explaining the method for manufacturing the non-volatile memory device according to Embodiment 3 of the present invention.

FIG. 36 is a cross-sectional view for explaining the method for manufacturing the non-volatile memory device according to Embodiment 3 of the present invention.

FIG. 37 is a cross-sectional view for explaining the method for manufacturing the non-volatile memory device according to Embodiment 3 of the present invention.

FIG. 38 is a cross-sectional view for explaining the method for manufacturing the non-volatile memory device according to Embodiment 3 of the present invention.

FIG. 39 is a cross-sectional view for explaining the method for manufacturing the non-volatile memory device according to Embodiment 3 of the present invention.

FIG. 40 is a cross-sectional view for explaining the method for manufacturing the non-volatile memory device according to Embodiment 3 of the present invention.

DESCRIPTION OF EMBODIMENTS

Figure 1:
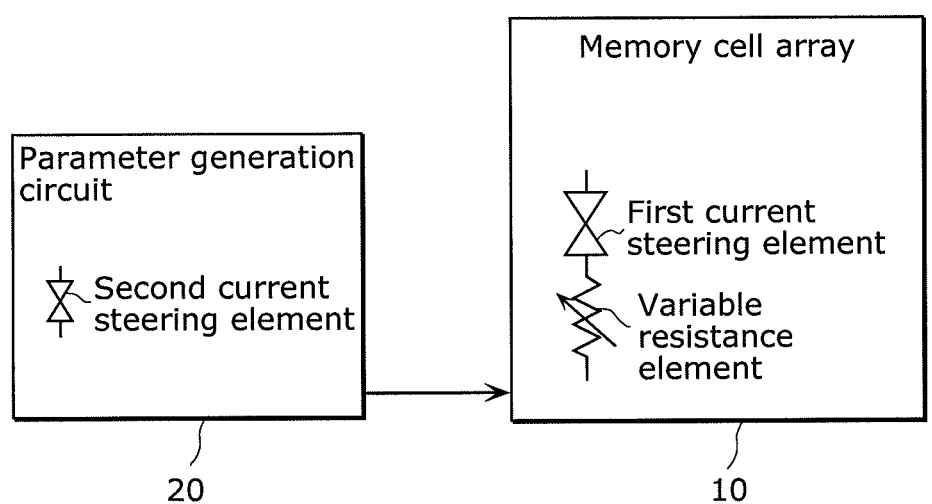
[FIG.1]

The inventors have found that the non-volatile memory device described in the Background Art section has a problem indicated below.

As described earlier, in the conventional non-volatile memory device having a cross-point structure including memory devices (memory cells) in each of which a variable resistance element and a non-linear current steering element are connected in series, current steering elements may have different non-linear current steering characteristics on a surface above a wafer substrate (a substrate on which a plurality of non-volatile memory devices are formed). In this case, the current steering elements in the chips (each of which is a substrate on which a single non-volatile memory device is formed) formed by separating the wafer substrate have different non-linear current steering characteristics, and thus a voltage to be applied to each of variable resistance elements is not an optimum voltage. As a result, an error operation occurs or fluctuation occurs in a signal read or write operation. In view of this problem, if it is possible to detect the non-linear current steering characteristics of the memory cells in the respective chips, it is possible to reduce such an error operation and fluctuation by optimizing the read or write operation using the result of the detection.

In view of this, a non-volatile memory device according to an aspect of the present invention includes: a memory cell array including a plurality of memory cells each having a stack structure in which a first current steering element and a variable resistance element are connected in series; and a current steering element parameter generation circuit (i) including a second current steering element for determining a current steering characteristic of the first current steering element, (ii) electrically connected to the memory cell array, and (iii) causing the memory cells to operate, wherein a first stack is formed in an area including an area in which the memory cell array is formed and an area in which the current steering element parameter generation circuit is formed, the first stack (i) including a current steering element lower electrode layer, a current steering layer, and a current steering element upper electrode layer, and (ii) functioning as the first current steering element and as the second current steering element, a second stack is formed above the first stack, the second stack (i) including a variable resistance element lower electrode layer, a first oxide layer including a first metal oxide of an oxygen deficient type, a second oxide layer including a second metal oxide having a small oxygen deficiency and a high resistance value compared to the first metal oxide, and a variable resistance element upper electrode layer, and (ii) functioning as the variable resistance element, and a part of the second stack is removed to allow the second current steering element and a layer positioned above the second current steering element to be connected in the area in which the current steering element parameter generation circuit is formed without the second oxide layer being interposed therebetween.

With this structure, the first current steering element and the second current steering element have the same current steering characteristics. By detecting the current steering characteristics of the second current steering element in this way makes it possible to detect the current steering characteristics of the first current steering element formed in each of the memory cells.

Furthermore, by forming the second current steering element in the control circuit electrically connected to the memory cell array in each chip, it is possible to detect current steering characteristics in each chip even when current steering characteristics vary above the wafer substrate. For this reason, in an exemplary case where the control circuit is a circuit which generates a voltage to be applied to the memory cells, it is possible to detect the current steering characteristics of the memory cells. Thus, it is possible to apply the voltage optimum for causing the memory cells to operate, and to thereby prevent an error operation or fluctuation from occurring in the current steering characteristics.

The non-volatile memory device may further includes a substrate, wherein the memory cell array may include: an interlayer dielectric formed above the substrate; a plurality of first lines arranged parallel to each other above the substrate between the substrate and the interlayer dielectric; a plurality of second lines arranged parallel to each other above the interlayer dielectric, and the plurality of second lines three-dimensionally cross the plurality of first lines; and the plurality of memory cells arranged at cross-points of the plurality of first lines and the plurality of second lines in the interlayer dielectric, the current steering element parameter generation circuit may include: a third line placed between the substrate and the interlayer dielectric; a fourth line placed above the interlayer dielectric; and the second current steering element placed between the third line and the fourth line and connected to the third line and the fourth line without the second oxide layer being interposed therebetween, and the first current steering element and the second current steering element may have a same non-linear current steering characteristic.

In addition, the non-volatile memory device may further include: a control circuit; a write circuit which applies, to one or more predetermined memory cells among the plurality of memory cells, a voltage for writing information to the one or more predetermined memory cells; and a read circuit which applies, to the one or more predetermined memory cells, a voltage for reading the information from the one or more predetermined memory cells, the current steering element parameter generation circuit may obtain a non-linear current steering characteristic parameter indicating a non-linear current steering characteristic of the second current steering element, and outputs a non-linear current steering characteristic parameter signal corresponding to the non-linear current steering characteristic parameter to the control circuit, the control circuit may generate a control signal for controlling the write circuit and the read circuit based on the non-linear current steering characteristic parameter signal, and output the control signal to at least one of the write circuit and the read circuit, and the at least one of the write circuit and the read circuit may determine the voltage to be applied to the one or more predetermined memory cells based on the control signal.

In addition, a first current steering layer included in the first current steering element and a second current steering layer included in the second current steering element may have a same composition and a same film thickness.

In addition, the first current steering layer and the second current steering layer may be formed in a single process.

In addition, each of the memory cells may have a structure in which the first current steering element and the variable resistance element are connected in series.

In addition, the first current steering element may include: a first current steering element lower electrode layer; a first current steering layer formed above the first current steering element lower electrode layer; and a first current steering element upper electrode layer formed above the first current steering layer, the second current steering element may include: a second current steering element lower electrode layer; a second current steering layer formed above the second current steering element lower electrode layer; and a second current steering element upper electrode layer formed above the second current steering layer, the first current steering element lower electrode layer and the second current steering element lower electrode layer may have a same composition and a same film thickness, the first current steering layer and the second current steering layer may have a same composition and a same film thickness, and the first current steering element upper electrode layer and the second current steering element upper electrode layer may have a same composition and a same film thickness.

At this time, the variable resistance element may include: a first variable resistance element lower electrode layer formed above the first current steering element upper electrode layer; a variable resistance layer formed as a stack of a first oxide layer including a first metal oxide of an oxygen deficient type formed above the first variable resistance lower electrode layer and a second oxide layer including a second metal oxide having a small oxygen deficiency and a high resistance value compared to the first metal oxide; and a first variable resistance element upper electrode layer formed above the variable resistance layer.

In addition, the first variable resistance element upper electrode layer may include a noble metal including iridium, platinum, or palladium.

In addition, each of the first metal oxide and the second metal oxide may include a tantalum oxide $TaO_x$ ($0<x<2.5$), a hafnium oxide $HfO_x$ ($0<x<2.0$), or a zirconium oxide $ZrO_x$ ($0<x<2.0$).

With this structure, the variable resistance element included in each memory cell performs its variable resistance operation in the second oxide layer which is a high resistance layer having a small oxygen deficiency and being in contact with the first variable resistance element upper electrode layer. Thus, it is possible to realize fast operations and prevent crosstalk from occurring. Therefore, it is possible to realize memory cells having reversibly stable rewriting characteristics and excellent retention characteristics.

In addition, it is possible to realize the memory cells which have a high resistance layer and are free from process damage.

In addition, the current steering element parameter generation circuit may include a resistor formed between the second current steering element and the fourth line, the resistor may include: a second variable resistance element lower electrode layer formed above the second current steering element upper electrode layer; a resistance layer formed above the second variable resistance element lower electrode layer, including the first metal oxide, and not including the second metal oxide; and a second variable resistance element upper electrode layer formed above the resistance layer, the first variable resistance element lower electrode layer and the second variable resistance element lower electrode layer may have a same composition and a same film thickness, and the first variable resistance element upper electrode layer and the second variable resistance element upper electrode layer may have a same composition.

In addition, the current steering element parameter circuit may include a resistor formed between the second current steering element and the fourth line, the resistor may include: a second variable resistance element lower electrode layer formed above the second current steering element upper electrode layer; and a second variable resistance element upper electrode layer formed above the second variable resistance element lower electrode layer and in contact with the second variable resistance element lower electrode layer, the first variable resistance element lower electrode layer and the second variable resistance element lower electrode layer may have a same composition, and the first variable resistance element upper electrode layer and the second variable resistance element upper electrode layer may have a same composition.

In addition, the current steering element parameter generation circuit may include a resistor formed between the second current steering element and the fourth line, the resistor may include: a second variable resistance element lower electrode layer formed above the second current steering element upper electrode layer; a resistance layer formed as a stack of a third oxide layer including the first metal oxide formed above the second variable resistance element lower electrode layer and a fourth oxide layer including the second metal oxide; and a second variable resistance element upper electrode layer formed above the resistance layer, the resistor may further include a contact connected to the fourth line, the contact penetrating through the second variable resistance element upper electrode layer and the fourth oxide layer, the first variable resistance element lower electrode layer and the second variable resistance element lower electrode layer may have a same composition and a same film thickness, the first variable resistance element upper electrode layer and the second variable resistance element upper electrode layer may have a same composition, the third oxide layer and the first oxide layer may have a same composition and a same film thickness, and the fourth oxide layer and the second oxide layer may have a same composition and a same film thickness.

With this structure, since the memory cells have a high resistance layer and are free from process damage, the second current steering element is connected to the line without the high resistance layer of the variable resistance element being interposed therebetween even when each of the memory cells has the variable resistance element which changes to a high resistance state. Accordingly, by detecting the current steering characteristics of the second current steering element makes it possible to detect the current steering characteristics of the first current steering element formed in each of the memory cells.

In addition, a non-volatile memory device manufacturing method according to an aspect of the present invention is a method for manufacturing a non-volatile memory device which includes: a memory cell array including a plurality of memory cells each having a stack structure in which a first current steering element and a variable resistance element are, connected in series; and a current steering element parameter generation circuit (i) including a second current steering element for determining a current steering characteristic of the first current steering element, (ii) electrically connected to the memory cell array, and (iii) causing the memory cells to operate, the method for manufacturing the non-volatile memory device including: forming a first stack in an area including an area in which the memory cell array is formed and an area in which the current steering element parameter generation circuit is formed, the first stack (i) including a current steering element lower electrode layer, a current steering layer, and a current steering element upper electrode layer, and (ii) being for forming the first current steering element and the second current steering element; forming a second stack above the first stack in the area including the area in which the memory cell array is formed and the area in which the current steering element parameter generation circuit is formed, the second stack (i) including a variable resistance element lower electrode layer, a first oxide layer including a first metal oxide of an oxygen deficient type, a second oxide layer including a second metal oxide having a small oxygen deficiency and a high resistance value compared to the first metal oxide, and a variable resistance element upper electrode layer, and (ii) being for forming the variable resistance element; and removing a part of or an entirety of the second stack to allow the second current steering element and a layer positioned above the second current steering element to be connected in an area in which the second current steering element is formed without the second oxide layer being interposed therebetween.

According to this manufacturing method, it is possible to manufacture the first current steering element and the second current steering element having the same current steering characteristics. Accordingly, by detecting the current steering characteristics of the second current steering element makes it possible to detect the current steering characteristics of the first current steering element formed in each of the memory cells.

Here, the non-volatile memory device manufacturing method may include: forming the current steering element lower electrode layer above the substrate; forming the current steering layer above the current steering element lower electrode layer; forming the current steering element upper electrode layer above the current steering layer; forming the variable resistance element lower electrode layer above the current steering element upper electrode layer; forming the first oxide layer above the variable resistance element lower electrode layer, and forming the second oxide layer above the first oxide layer; forming the variable resistance element upper electrode layer above the second oxide layer; forming the variable resistance element by patterning the variable resistance element upper electrode layer, the first oxide layer, the second oxide layer, and the variable resistance element lower electrode layer, and subsequently forming, at the same time, (i) the first current steering element formed below to be in contact with the variable resistance element, and (ii) the second current steering element isolated from the variable resistance element, by patterning the current steering element upper electrode layer, the current steering layer, and the current steering element lower electrode layer; and forming a line electrically connected to the first current steering element and the variable resistance element and a line electrically connected to the second current steering element, wherein in the forming by patterning of the first current steering element and the second current steering element, a same mask may be used in patterning for forming the variable resistance element and in patterning for forming the first current steering element, and the second oxide layer may be selectively removed in the area in which the second current steering element is formed, in any one of the forming of the variable resistance element upper electrode layer, the forming by patterning of the first current steering element and the second current steering element, and the forming of lines.

At this time, in the forming by patterning of the first current steering element and the second current steering element, the variable resistance element upper electrode layer, the first oxide layer, and the second oxide layer in the area in which the second current steering element may be formed are removed when the variable resistance element is formed.

According to this method, the first current steering element and the second current steering element of each memory cell have the same current steering characteristics because they have been formed to include the same electrode layers and current steering layers. For this reason, by detecting the current steering characteristics of the second current steering element makes it possible to detect the current steering characteristics of the first current steering element formed in each of memory cells.

Furthermore, since the second oxide layer in the area in which the variable resistance element is formed is covered by the second upper electrode layer at the time of the removal of the second oxide layer in which the second current steering element is formed, it is possible to form the variable resistance layer in which the variable resistance element performs its variable resistance operation without causing process damage on the variable resistance layer.

Furthermore, it is possible to manufacture such a non-volatile memory device using semiconductor manufacturing processes using conventional CMOS manufacturing processes. Accordingly, there is no need to perform a unique and special semiconductor manufacturing process in each of the processes of forming the variable resistance element and the current steering element. Therefore, it is possible to realize a manufacturing method highly compatible with increasingly finer semiconductor manufacturing processes.

In addition, in the forming of the variable resistance element upper electrode layer, the variable resistance element upper electrode layer and the second oxide layer may be sequentially removed in the area in which the second current steering element is formed, and the variable resistance element upper electrode layer may be re-formed above the variable resistance element upper electrode layer and the first oxide layer which has been exposed by the removal.

In addition, in the forming of the variable resistance element upper electrode layer, the variable resistance element upper electrode layer, the second oxide layer, and the first oxide layer may be sequentially removed in the area in which the second current steering element is formed, and the variable resistance element upper electrode layer may be re-formed above the variable resistance element upper electrode layer and the variable resistance element lower electrode layer which has been exposed by the removal.

According to this manufacturing method, the layer corresponding to the variable resistance layer of the variable resistance element is completely removed by etching in the area in which the second current steering element is formed. Accordingly, flexibility in the process is increased. Examples of gases which may be used here include a gas which damages metal oxides when applied to the metal oxides in etching, and thereby changes the metal oxides into a high resistance state, as an etching gas for dry etching the second metal oxide layer and the first metal oxide layer.

In addition, in the forming of the variable resistance element upper electrode layer, the variable resistance element upper electrode layer before the removal may have a film thickness smaller than a film thickness of the variable resistance element upper electrode layer which is formed above the variable resistance element upper electrode layer after the removal.

According to this manufacturing method, it is possible to reduce the fluctuation in the film thickness and size of the second resistance upper electrode layers between the memory cell array and the control circuit. Thus, it is possible to reduce, in the current steering characteristics between the current steering elements, a fluctuation which occurs when the variable resistance element is connected to the first current steering element but the variable resistance element is not connected to the second current steering element.

In addition, in the forming of lines, a contact hole may be formed penetrating through the variable resistance element upper electrode layer and the second oxide layer in the area in which the second current steering element has been formed, and a plug may be formed in the contact hole and connected to the line electrically connected to the second current steering element.

According to this manufacturing method, it is possible to stably manufacture the second current steering elements having a small resistance value while completely preventing process damage on the memory cells (variable resistance elements).

Hereinafter, a non-volatile memory device and a method for manufacturing the same according to this embodiment are described with reference to the drawings. It is to be noted that the same reference signs are assigned to substantially the same structural elements, operations, effects and the like in the drawings, and the same descriptions may be skipped. In addition, the drawings schematically show the structural elements for better understanding. Thus, the shapes and the like are not exactly correct, and the numbers of respective kinds of structural elements etc. are also exemplary numbers for simplicity. Among the structural elements in the embodiments below, the structural elements not recited in the independent claims defining the most generic concept of the present invention are described as non-essential structural elements.

[Embodiment 1]

Descriptions are given of a structure of a non-volatile memory device according to Embodiment 1 of the present invention and a method for manufacturing the same.

FIG. 1 is a block diagram showing a part of the structure of the non-volatile memory device according to this embodiment.

This non-volatile memory device includes: a memory cell array 10, a current steering element parameter generation circuit 20 (hereinafter simply referred to as a parameter generation circuit) electrically connected to the memory cell array 10. It is to be noted that the non-volatile memory device may further include, for example, an amplifier which connects the memory cell array 10 and the current steering element parameter generation circuit 20.

The memory cell array 10 includes: a plurality of bit lines and a plurality of word lines which three-dimensionally cross each other; and a plurality of memory cells which are arranged at cross-points of the plurality of bit lines and the plurality of word lines and in each of which a variable resistance element and a first current steering element are connected in series. Each memory cell has an end connected to a corresponding one of the bit lines and an end connected to a corresponding one of the word lines. The memory cell array 10 further includes: a bit line selection circuit, a word line selection circuit, a write driver circuit which applies, to one or more predetermined memory cells among the plurality of memory cells, a voltage for writing information thereto; a read driver circuit which applies, to the one or more predetermined memory cells, a voltage for reading information from the one or more predetermined memory cells; a power source circuit, and a control circuit which controls these circuits. The current steering element parameter generation circuit 20 includes a plurality of current steering element characteristics reference cells (hereinafter simply referred to as reference cells) each including a second current steering element. The reference cells are included as elements for determining non-linear current steering characteristics of a corresponding one of the first current steering elements. In other words, the current steering element parameter generation circuit 20 generates non-linear current steering characteristic parameter values indicating the non-linear current steering characteristics which are of the second current steering elements and correspond to the non-linear current steering characteristics of the first current steering elements. More specifically, the current steering element parameter generation circuit 20 measures the non-linear current steering characteristics of the second current steering elements and extracts (obtains) the non-linear current steering characteristic parameters indicating the non-linear current steering characteristics such as a threshold voltage (VF) etc. for the second current steering elements, and supplies (outputs) the values indicating the non-linear current steering characteristic parameters to the control circuit for the memory cell array 10 (here, the values correspond to non-linear current steering characteristic parameter signals corresponding to the obtained non-linear current steering characteristic parameters. The control circuit for the memory cell array 10 calculates an application voltage required for a read operation or a write operation from a given non-liner current steering characteristic parameter value, and outputs the control signal to the power source circuit, and the write driver circuit or the read circuit, etc. In other words, the control circuit generates a control signal which controls the write driver circuit and the read circuit based on the non-liner current steering characteristic parameter signal, and outputs the control signal to at least one of the write driver circuit and the read circuit. The power source circuit, and the write driver circuit or the read circuit etc. outputs an appropriate application voltage according to the input control signal. In other words, at least one of the power source circuit, and the write driver circuit or the read circuit determines the voltage to be applied to the one or more predetermined memory cells based on the control signal.

Here, a reference cell does not always need to include a variable resistance element. The first current steering element and the second current steering element have substantially the same form. The first current steering element and the second current steering element may show the same non-linear current steering characteristics. Here, "the same non-linear current steering characteristics" means that the second current steering element have substantially the same characteristics such as the threshold voltage, an off current, an on current etc. other than a parasitic resistance component as those of the first current steering element because the fluctuation is approximately within a range of 10%.

Figure 3A:
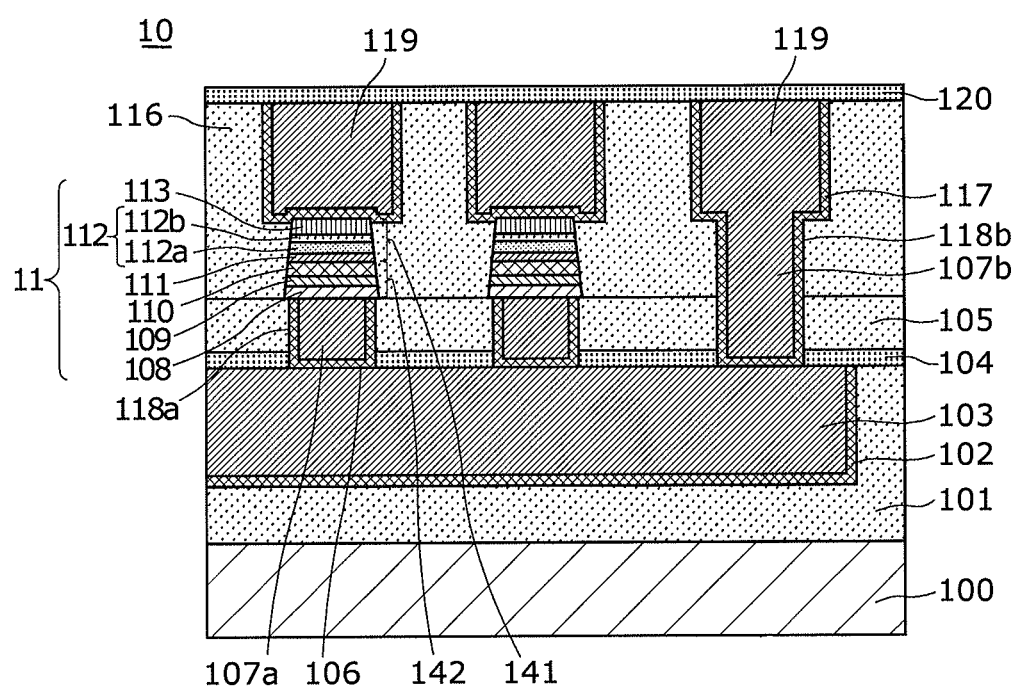
[FIG.3A]
Figure 3B:
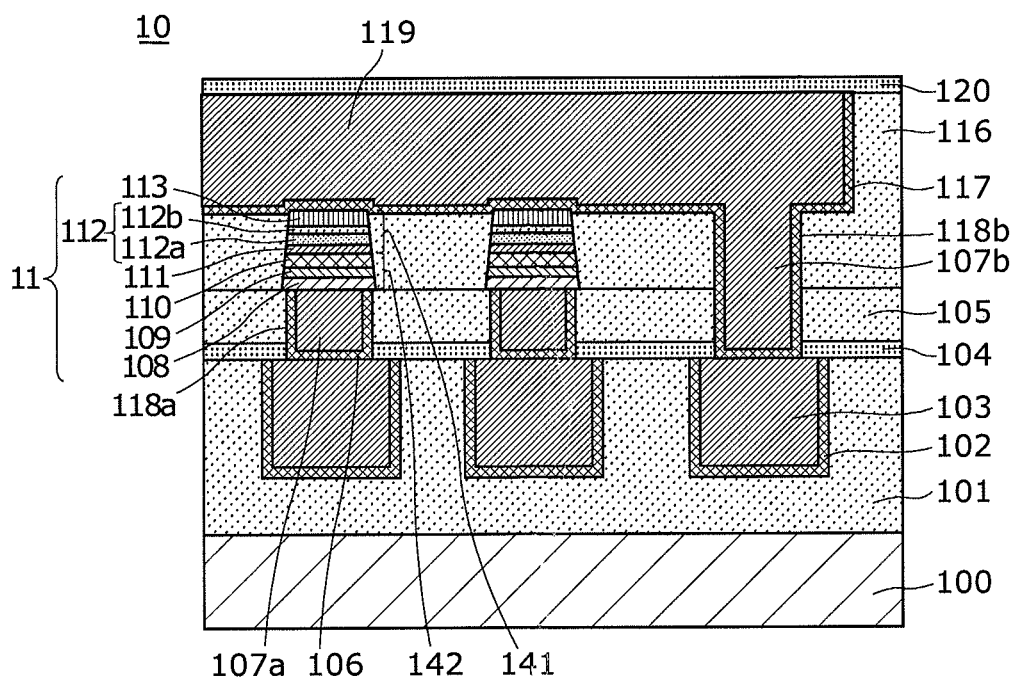
[FIG.3B]
Figure 3C:
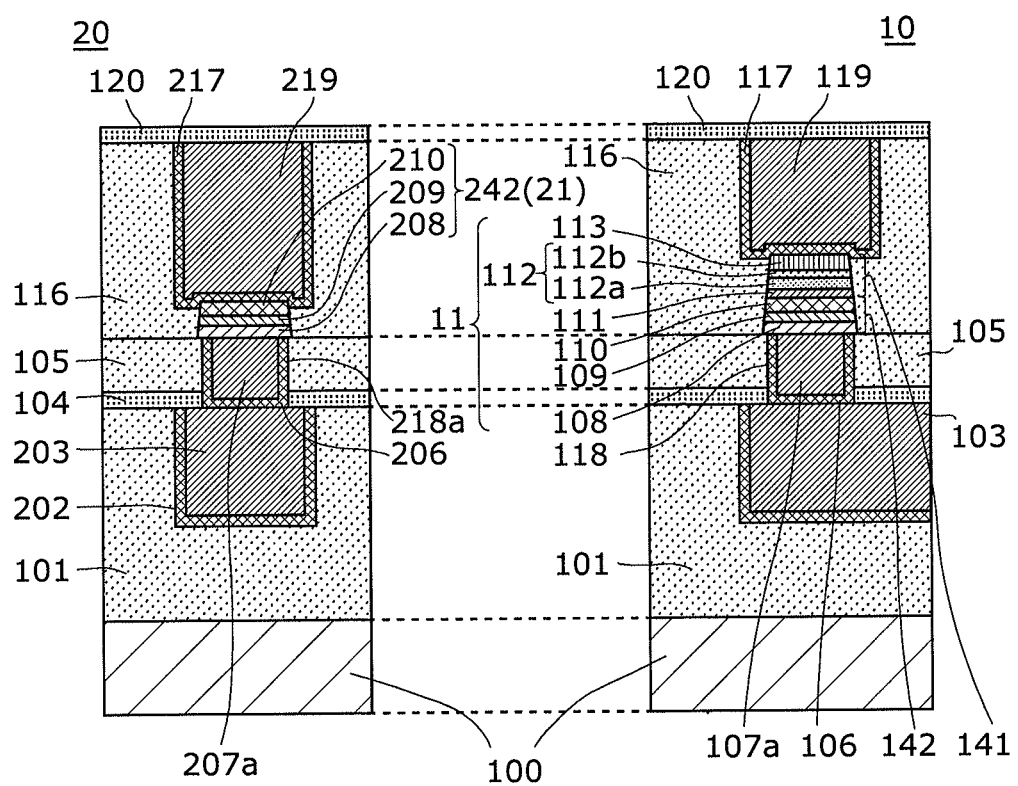
[FIG.3C]

FIG. 2 is a plan view showing a part of the structure of the non-volatile memory device according to this embodiment. Each of FIG. 3A and FIG. 3B is a cross-sectional view of an exemplary structure of the memory cell array 10 according to this embodiment. FIG. 3C is a cross-sectional view showing exemplary structures of the memory cell array 10 and the current steering element parameter generation circuit 20 according to this embodiment. FIG. 3A is a cross-sectional view of the cross section along the alternate long and short dash line shown in the A-A' in FIG. 2 when seen in the arrow direction. FIG. 3B is a cross-sectional view of the cross section along the alternate long and short dash line shown in the B-B' in FIG. 2 when seen in the arrow direction. FIG. 3C is a cross-sectional view of the cross section along the alternate long and short dash line shown in the D-D' in FIG. 2 when seen in the arrow direction.

The non-volatile memory device according to this embodiment includes, in an area including an area in which a memory cell array 10 is formed and an area in which a current steering element parameter generation circuit 20 is formed, a first stack which (i) includes first lower electrode layers 108 and 208, current steering layers 109 and 209, and first upper electrode layers 110 and 210 and (ii) functions as a first current steering element 142 and a second current steering element 242. The non-volatile memory device further includes, above the first stack, a second stack which includes a third lower electrode layer 111, a first oxide layer 112a including a first metal oxide of an oxygen deficiency type, a second oxide layer 112b including a second metal oxide having a small oxygen deficiency and a high resistance value compared to the first metal oxide, and a second upper electrode layer 113. In the area in which the current steering element parameter generation circuit 20 is formed, at least part of the second stack is removed such that the second current steering element 242 and a layer positioned above the second current steering element 242 are connected without the second oxide layer 112b being interposed therebetween.

As shown in FIG. 3C, this embodiment describes a structural example where the entirety of the second stack is removed in the area in which the current steering element parameter generation circuit 20 is formed, and thus the second stack is fully removed. It is to be noted that structural examples where the second stack is partly removed and partly remains are described in Embodiments 2 and 3 later.

More specifically, the non-volatile memory device according to this embodiment includes: a substrate 100; a first interlayer dielectric 101 formed above the substrate 100; a second interlayer dielectric 105; a third interlayer dielectric 116; a plurality of first lines 103 arranged in stripes parallel to each other above the substrate 100 between the substrate 100 and the second interlayer dielectric 105; a plurality of second lines 119 arranged in stripes parallel to each other in the third interlayer dielectric 116 such that the plurality of second lines 119 in stripes three-dimensionally cross the plurality of first lines 103; a memory cell array 10 including a plurality of memory cells 11 which are arranged in the third interlayer dielectric 116 positioned at the cross-points of the first lines 103 and the second lines 119 and each of which includes a variable resistance element 141 and a first current steering element 142; third lines 203 (formed in the layer in which the first lines are formed) placed above the substrate 100 between the substrate 100 and the second interlayer dielectric 105, and a current steering element parameter generation circuit 20 (only a second current steering element and a wiring part thereof are shown) including fourth lines 219 (formed in the layer in which the second line is formed) placed above the second interlayer dielectric 105.

The current steering element parameter generation circuit 20 may further include a second current steering element 242 which is formed within the third interlayer dielectric 116 placed between the third lines 203 and the fourth lines 219, is connected to the third lines 203 and the fourth lines 219 without any variable resistance element being interposed therebetween, and is for determining non-linear current steering characteristics of the first current steering element 142. In addition, the first current steering element 142 and the second current steering element 242 may have the same non-linear current steering characteristics.

In addition, the first current steering layer 109 of the first current steering element 142 and the second current steering layer 209 of the second current steering element 242 may have the same composition and the same film thickness. Here, "the same composition" and "the same film thickness" mean a composition and a film thickness with which the first current steering element 142 and the second current steering element 242 have substantially the same non-linear current steering characteristics. In other words, "substantially the same composition" is a composition indicating an equivalent non-linear current steering characteristic in the case of a same film thickness, and "substantially the same film thickness" is a film thickness indicating an equivalent non-linear current steering characteristic in the case of a same composition.

In addition, the first current steering layer 109 and the second current steering layer 209 may be formed in a single process.

In addition, the memory cell 11 has a stack structure in which the first current steering element 142 and the variable resistance element 141 are connected in series.

In addition, the first current steering element 142 may include: a first lower electrode layer 108, a first current steering layer 109 formed above the first lower electrode layer 108, and a first upper electrode layer 110 formed above the first current steering layer 109. The second current steering element 242 may include: a second lower electrode layer 208, a second current steering layer 209 formed above the second lower electrode layer 208, and a second upper electrode layer 210 formed above the second current steering layer 209. The first lower electrode layer 108 and the second lower electrode layer 208 may have substantially the same composition and substantially the same film thickness. The first upper electrode layer 110 and the second upper electrode layer 210 may have substantially the same composition and substantially the same film thickness.

In addition, the variable resistance element 141 includes: a third lower electrode layer 111 formed above the first upper electrode layer 110, a variable resistance layer 112 formed to be a stack of a first oxide layer 112a including a first metal oxide of an oxygen deficiency type formed above the third lower electrode layer 111 and a second oxide layer 112b including a second metal oxide having a small oxygen deficiency and a high resistance value compared to the first metal oxide, and a third upper electrode layer 113 formed above the variable resistance layer 112.

At this time, the third upper electrode layer 113 includes a noble metal comprising iridium, platinum, or palladium. In addition, each of the first metal oxide and the second metal oxide includes one of a tantalum oxide $TaO_x$ ($0<x<2.5$), a hafnium oxide $HfO_x$ ($0<x<2.0$), and a zirconium oxide $ZrO_x$ ($0<x<2.0$) etc. which are of an oxygen deficiency type. Here, a material of an oxygen deficiency type is a material having a stoichiometric composition, refers to a metal oxide having a less oxygen content atomic percentage than a metal oxide exhibiting an insulation, property, and is normally shows characteristics of semiconductors.

The non-volatile memory device according to this embodiment is described in detail below.

The memory cell array 10 shown in FIG. 2 includes: a plurality of first lines 103, a plurality of second lines 119, and a plurality of memory cells 11 each including a variable resistance element 141 and a first current steering element 142.

The plurality of first lines 103 are formed above the substrate 100 on which transistors etc. are formed. The plurality of first lines 103 are formed in stripes parallel to each other. The plurality of second lines 119 are formed in stripes parallel to each other. It is to be noted that the first lines 103 and the second lines 119 are arranged orthogonal to each other in the description below, but these lines do not always need to be arranged orthogonal to each other as long as they are arranged to cross each other three-dimensionally. In addition, at the respective cross-points at which the plurality of first lines 103 and the plurality of second lines 119 cross each other three-dimensionally, memory cells 11 are formed each of which includes the variable resistance element 141 and the first current steering element 142.

A specific structure of the memory cell array 10 is described below.

As shown in each of FIGS. 3A, 3B, and 3C, the memory cell array 10 is formed above the substrate 100 and includes: a first interlayer dielectric 101, a first barrier metal layer 102, first lines 103, a first liner layer 104, a second interlayer dielectric 105, a second barrier metal layer 106, plugs 107a and 107b, a variable resistance element 141, a first current steering element 142, a third interlayer dielectric 116, a third barrier metal layer 117, contact holes 118a and 118b, second lines 119, and a second liner layer 120.

The first barrier metal layer 102 is formed within a wiring gutter formed to embed the first lines 103 in the first interlayer dielectric 101. This first barrier metal layer 102 is formed, for example, by sequentially depositing a tantalum nitride having a thickness from 5 nm to 40 nm and a tantalum having a thickness from 5 nm to 40 nm.

The first lines 103 are formed in the first interlayer dielectric 101, and include, for example, cupper or the like. More specifically, the first lines 103 are formed such that the wiring gutter is fully filled with the first lines 103 and the first barrier metal layer 102 above the first barrier metal layer 102 formed in the wiring gutter of the first interlayer dielectric 101.

The first liner layer 104 is formed above the first interlayer dielectric 101 including the first lines 103. This first liner layer 104 includes, for example, a silicon nitride having a thickness from 30 nm to 200 nm.

The second interlayer dielectric 105 is formed above the first liner layer 104, and includes, for example, a silicon oxide having a thickness from 100 nm to 500 nm.

Here, the first liner layer 104 and the second interlayer dielectric 105 include the contact holes 118a and 118b.

The second barrier metal layer 106 is formed in the first liner layer 104 and the second interlayer dielectric layer 105, specifically in the contact holes 118a formed in the first liner layer 104 and the second interlayer dielectric 105. The second barrier metal layer 106 is formed by, for example, sequentially depositing a tantalum nitride having a thickness from 5 nm to 40 nm and a tantalum having a thickness from 5 nm to 40 nm.

The plug 107a is formed in the contact hole 118a in the first liner layer 104 and the second interlayer dielectric 105, and is electrically connected to the first lines 103. More specifically, the plug 107a is formed above the second barrier metal layer 106 and in the contact hole 118a in the first liner layer 104 and the second interlayer dielectric 105, and is electrically connected to the first lines 103. This plug 107a is farmed, for example, to have a diameter from 50 nm to 200 nm.

The plug 107b is formed in the contact hole 118b in the first liner layer 104 and the second interlayer dielectric 105, and is electrically connected to the first lines 103. More specifically, the plug 107b is formed above the third barrier metal layer 117 and in the contact hole 118b in the first liner layer 104 and the second interlayer dielectric 105, and is electrically connected to the first lines 103. This plug 107b is formed, for example, to have a diameter from 50 nm to 200 nm.

The first current steering element 142 is an MIM diode or a Metal Semiconductor Metal (MSM) diode or the like, formed above the second interlayer dielectric 105, and is connected to the plug 107a electrically and physically. This first current steering element 142 includes a first lower electrode layer 108, a first current steering layer 109, and a first upper electrode layer 110.

The first lower electrode layer 108 is formed above the substrate 100 (specifically, above the second interlayer dielectric 105), and includes a tantalum nitride or the like. The first current steering layer 109 is formed above the first lower electrode layer 108, and includes a silicon nitride of a nitrogen-deficiency type or the like. The first upper electrode layer 110 is formed above the first current steering layer 109, and includes a tantalum nitride or the like.

Here, the silicon nitride of a nitrogen-deficiency type is a nitride having a composition in which the component z of the nitride N when the silicon nitride is presented as SiNz (0<z) is less than the amount which realizes a stoichometrically stable state (a stoichometric composition). Here, the silicon nitride includes stoichometrically stable $Si_3N_4$, and thus the silicon nitride is of a nitrogen-deficiency type when $0<z<1.33$ is satisfied. Accordingly, when the nitrogen-deficient silicon nitride is used for the first current steering layer 109 and the tantalum nitride is used as an electrode material for the first lower electrode layer 108 and the first upper electrode layer 110, on condition that $0<z\leq 0.85$ is satisfied, $SiN_z$ shows semiconductor characteristics, and it is possible to configure an MSM diode capable of turning on and off a voltage or current which is sufficient for realizing variable resistance.

The tantalum nitride has a work function of 4.6 eV which is sufficiently higher than an electron affinity of 3.8 eV of silicon, a Schottky barrier is formed at an interface between the first lower electrode layer 108 and the first current steering layer 109 and an interface between the first current steering layer 109 and the first upper electrode layer 110. In addition, a metal such as tantalum having a high melting point and a nitride thereof has an excellent heat resistance, and shows stable characteristics even when a current having a large current density is applied. For the reasons stated above, the electrode material used for the first current steering element 142 as the MSM diode may be tantalum, a tantalum nitride, titanium, a titanium nitride, tungsten, a tungsten nitride, or the like.

The first current steering element 142 is formed as described above.

The variable resistance element 141 is formed to be connected in series to the first current steering element 142 and above the first current steering element 142. This current steering element 141 includes a third lower electrode layer 111, a variable resistance layer 112, and a third upper electrode layer 113.

This variable resistance layer 112 is formed above the third lower electrode layer 111, is interposed between the third lower electrode layer 111 and the third upper electrode layer 113, and has a resistance value which is reversibly variable based on an electric signal given between the third lower electrode layer 111 and the third upper electrode layer 113. For example, the variable resistance layer 112 is a layer in which a change between a high resistance state and a low resistance state is made according to the polarity of a voltage given between the third lower electrode layer 111 and the third upper electrode layer 113. The variable resistance layer 112 is formed by stacking at least two layers of a first oxide layer 112a connected to the third lower electrode layer 111 and a second oxide layer 112b connected to the third upper electrode layer 113.

The first oxide layer 112a includes a first metal oxide of an oxygen deficiency type, and the second oxide layer 112b includes a second metal oxide having an oxygen deficiency smaller than that of the first metal oxide. The second oxide layer 112b of the variable resistance element includes microlocal areas formed therein and having an oxygen deficiency which reversibly variable depending on application of an electric pulse. It is considered that these local areas include filament including oxygen vacant sites.

An oxygen deficiency is a rate of deficient oxygen with respect to the amount of oxygen of an oxide in a stoichiometric composition of a metal oxide (the stoichiometric composition is the one having the highest resistance value when a plurality of stoichiometric compositions are present in the metal oxide). The metal oxide having the stoichiometric composition is stable and has a high resistance value compared to the other metal oxides having the other compositions.

In an exemplary case where the metal is tantalum (Ta), the stoichiometric composition of the oxide is $Ta_2O_5$, and $TaO_{2.5}$ can be presented. The oxygen deficiency of $TaO_{2.5}$ is 0%, and the oxygen deficiency of $TaO_{1.5}$ is 40% according to the expression: oxygen deficiency=(2.5−1.5)/2.5. In addition, an oxygen-excessive metal oxide has a negative-value oxygen deficiency. In this DESCRIPTION, it is assumed that an oxygen deficiency may have a positive value or a negative value unless otherwise specified.

The oxide having a small oxygen deficiency is closer to an oxide having a stoichiometric composition and thus has a high resistance value, and the oxide having a large oxygen deficiency is closer to a metal included in the oxide and thus has a low resistance value An oxygen content atomic percentage is a rate of oxygen atoms in the total number of atoms. For example, the oxygen atomic percentage of $Ta_2O_5$ is 71.4 atm % obtained from the rate (O/(Ta+O)) of the oxygen atoms in the total number of atoms). Accordingly, the oxygen-deficient tantalum oxide has an oxygen atomic percentage having a value larger than 0 and smaller than 71.4 atm %. For example, when a metal included in a first metal oxide and a metal included in a second metal oxide is of a same kind, the oxygen atomic percentage has a correspondence with the oxygen deficiency. In other words, when the second metal oxide has an oxygen atomic percentage larger than the oxygen atomic percentage of the first metal oxide, the second metal oxide has an oxygen deficiency smaller than the oxygen deficiency of the first metal oxide.

As a metal included in the variable resistance layer 112, it is possible to use a transition metal or aluminium (Al). The transition metal used here is tantalum (Ta), titanium (Ti), hafnium (Hf), zirconium (Zr), niobium (Nb), tungsten (W), nickel (Ni), or the like. A transition metal can take a plurality of oxygen states, and thus it is possible to realize different resistance states due to oxidation reduction reaction.

Here is an exemplary case where a tantalum oxide is used. When the first oxide layer 112a has a composition of $TaO_x$ and x is from 0.8 to 1.9, and when the second oxide layer 112b has a composition of $TaO_y$, and y has a value larger than x, it is possible to change the resistance value of the variable resistance layer 112 stably and quickly. In this case, the second oxide layer 112b may have a film thickness from 1 nm to 8 nm.

Here is another exemplary case where a hafnium oxide is used. When the first oxide layer 112a has a composition of $HfO_x$ and x is from 0.9 to 1.6, and when the second oxide layer 112b has a composition of $HfO_y$, and y has a value larger than x, it is possible to change the resistance value of the variable resistance layer 112 stably and quickly. In this case, the second oxide layer 112b may have a film thickness from 3 nm to 4 nm.

Here is an exemplary case where a zirconium oxide is used. When the first oxide layer 112a has a composition of $ZrO_x$ and x is from 0.9 to 1.4, and when the second oxide layer 112b has a composition of $ZrO_y$, and y has a value larger than x, it is possible to change the resistance value of the variable resistance layer 112 stably and quickly. In this case, the second oxide layer 112b may have a film thickness from 1 nm to 5 nm.

Here, different metals may be used as the first metal included in the first metal oxide which becomes the first oxide layer 112a and the second metal included in the second metal oxide which becomes the second oxide layer 112b. In this case, the second metal oxide may have a small oxygen deficiency, in other words, a high resistance value compared to the first metal oxide. With this structure, a voltage applied between the first electrode and the second electrode during resistance change is largely distributed to the second metal oxide, which facilitates oxidation reduction reaction in the second metal oxide.

In addition, when using different materials as the first metal and the second metal, the second metal may have a small standard electrode potential smaller than a standard electrode potential of the first metal. A larger standard electrode material presents a higher oxygen resistance property. In this way, oxidation reduction reaction is facilitated in the second metal oxide having a comparatively small standard electrode potential. It is to be considered that a resistance change phenomenon is a change in a resistance value (oxygen deficiency) made by a change in a filament (an electricity conduction path) made due to oxidation reduction reaction in micro-local areas formed in the highly resistant second metal oxide.

For example, it is possible to realize stable resistance change operations using an oxygen-deficient tantalum oxide ($TzO_x$) as the first metal oxide and using a titanium oxide ($TiO_2$) as the second metal oxide. Titanium (having a standard electrode potential of −1.63 eV) is lower in standard electrode potential than tantalum (having a standard electrode potential of −0.6 eV). In this way, it is possible to facilitate oxidation reduction reaction in the second metal oxide using, as the second metal oxide, the metal oxide having the standard electrode potential lower than the standard electrode potential of the first metal oxide. As another combination, it is possible to use aluminum oxide ($Al_2O_3$) as the second metal oxide which becomes the high resistance layer. For example, it is also good to use an oxygen-deficient tantalum oxide ($TaO_x$) as the first metal oxide, and use an aluminum oxide ($Al_2O_3$) as the second metal oxide.

It is considered that the resistance change phenomenon in the variable resistance layer in the stack structure is a change in a resistance value in any of cases of a resistance change to a high resistance state or a resistance change to a low resistance state made by a change in a filament (an electricity conduction path) in micro-local areas made due to oxidation reduction reaction in the micro-local areas formed in the highly resistant second oxide layer 112b.

In other words, when a voltage which is positive with respect to the third lower electrode layer 111 is applied to the third upper electrode layer 113 connected to the second oxide layer 112b, oxygen ions in the variable resistance layer 112 are drawn to the side of the second oxide layer 112b. In this way, oxidation reaction occurs in the micro-local areas formed in the second oxide layer 112b, with a decrease in the oxygen deficiency. As a result, the filament in the local areas is less active, which increases a resistance value therein.

On the other hand, when a voltage which is negative with respect to the third lower electrode layer 111 is applied to the third upper electrode layer 113 connected to the second oxide layer 112b, oxygen ions in the second oxide layer 112b are pushed to the side of the first oxide layer 112a. In this way, oxidation reduction reaction occurs in the micro-local areas formed in the second oxide layer 112b, with an increase in the oxygen deficiency. As a result, the filament in the local areas is more active, which decreases a resistance value therein.

The third upper electrode layer 113 connected to the second oxide layer 112b including the second metal oxide having the smaller oxygen deficiency includes a material having a standard reference potential higher than a metal such as platinum (Pt), iridium (Ir), and palladium (Pd) included in the second metal oxide and a material included in the third lower electrode layer 111. In addition, the third lower electrode layer 111 connected to the first oxide layer 112a including the first metal oxide having the higher oxygen deficiency may include a material having a standard reference potential further lower than the metal included in the first metal oxide such as tungsten (W), nickel (Ni), tantalum (Ta), titanium (Ti), aluminium (Al), a tantalum nitride (TaN), and a titanium titanium (TiN). A larger standard electrode material presents a higher oxygen resistance property.

In other words, relationships that Vr2<V2 and V1<V2 may be satisfied when V2 denotes the standard electrode potential of the third upper electrode layer 113, Vr2 denotes the standard electrode potential of the metal included in the second metal oxide, Vr1 denotes the standard electrode potential of the metal included in the first metal oxide, and V1 denotes the standard electrode potential of the third lower electrode layer 111. Furthermore, relationships that V2>Vr2 and Vr1≥V1 may also be satisfied.

With the above structure, oxidation reduction reaction selectively occurs in the second metal oxide in the proximity of the interface between the third upper electrode layer 113 and the second metal oxide, which can achieve stable variable resistance phenomena.

Hereinafter, the structure of the variable resistance element 141 is described again.

The third lower electrode layer 111 is formed above the first upper electrode layer 110. The third upper electrode layer 113 is formed above the variable resistance layer 112. It is to be noted that each of the third lower electrode layer 111 and the third upper electrode layer 113 includes a noble metal such as platinum, iridium, and palladium.

Here, platinum, iridium, and palladium have standard reference potentials of 1.18 eV, 1.16 eV, and 0.95 eV, respectively. In general, a reference electrode potential is an indicator of a resistance to oxidation. A larger reference electrode potential value shows a higher resistance to oxidation and a smaller reference electrode potential value shows a lower resistance to oxidation. In other words, a larger fluctuation in standard electrode potential between the electrodes (the third lower electrode layer 111 and the third upper electrode layer 113) and the metal included in the variable resistance layer 112 facilitates such a variable resistance phenomenon, and, as the fluctuation decreases, such a variable resistance phenomenon is unlikely to occur. In view of this, it is estimated that the degree of susceptibility to oxidation of the material included in the variable resistance layer 112 with respect to the electrode material takes a main role in the mechanism of the variable resistance phenomenon.

For example, tantalum has a standard electrode potential of −0.60 eV, and hafnium has a standard electrode potential of −1.55 eV. The standard electrode potentials of tantalum and hafnium are lower than the standard electrode potentials of platinum, iridium, and palladium. In view of this, it is considered that an oxidation reduction reaction occurs in the tantalum oxide or the hafnium oxide in the proximity of the interface between the electrode (the third lower electrode layer 111 or the third upper electrode layer 113) including one of the platinum, iridium, and palladium and the variable resistance layer 112, and thereby oxygen moves causing a variable resistance phenomenon. More specifically, the variable resistance layer 112 including an oxygen-deficient metal oxide such as a tantalum oxide, a hafnium oxide, a zirconium oxide, a titanium oxide changes from a low resistance state to a high resistance state upon receiving a voltage having a first polarity (positive or negative) whose absolute value is larger than or equal to a first threshold value. On the other hand, the variable resistance layer 112 changes from a high resistance state to a low resistance state upon receiving a voltage having a second polarity (negative or positive) whose absolute value is larger than or equal to a second threshold value. Here, the second polarity is different from the first polarity. In other words, this variable resistance layer 112 shows bi-polar variable resistance characteristics.

Here, a detailed description is given of the variable resistance layer 112 formed to have a stack of metal oxides each having a different oxygen deficiency. First, using as a standard, the electrode (the third lower electrode layer 111) in contact with the first oxide layer 112a which is a layer having a high oxygen deficiency, a positive voltage is applied to the electrode (the third upper electrode layer 113) in contact with the second oxide layer 112b which is a layer having a low oxygen deficiency. In this case, the second oxide layer 112b changes from a low resistance state to a high resistance state upon receiving a voltage having a positive polarity whose absolute value is larger than or equal to the first threshold value and oxygen ions in the variable resistance layer 112 are drawn to the proximity of the second oxide layer 112b. On the other hand, using as a standard, the electrode (the third lower electrode layer 111) in contact with the first oxide layer 112a, a negative voltage is applied to the electrode (the third upper electrode layer 113) in contact with the second oxide layer 112b. In this case, the variable resistance layer 112 changes from a high resistance state to a low resistance state upon receiving a voltage having a negative polarity whose absolute value is larger than or equal to the second threshold value and oxygen ions in the second oxide layer 112b are dispersed in the first oxide layer 112a.

In this way, the variable resistance element 141 is formed.

The third interlayer dielectric 116 is formed above the second interlayer dielectric 105 to cover the variable resistance element 141 and the first current steering element 142. In addition, contact holes 118b are formed in the first liner layer 104, the second interlayer dielectric 105, and the third interlayer dielectric 116, and a wiring gutter is formed in the third interlayer dielectric 116. In addition, a plug 107b is embedded in each contact hole 118b, and a second line 119 is embedded in the wiring, gutter.

The third barrier layer 117 is formed in the contact hole 118b and the wiring gutter. The third barrier metal layer 117 is formed by, for example, sequentially depositing a tantalum nitride having a thickness from 5 nm to 40 nm and a tantalum having a thickness from 5 nm to 40 nm.

The second line 119 is formed in the wiring gutter in the third interlayer dielectric 116, and is connected to the third upper electrode layer 113 which is the upper part of the variable resistance element 141. In addition, the second line 119 is connected not only to the plug 107b in the contact hole 118b but also to the first line 103 for wiring the neighborhood of the memory cell array 10.

The memory cell array 10 is configured as described above.

Figure 4:
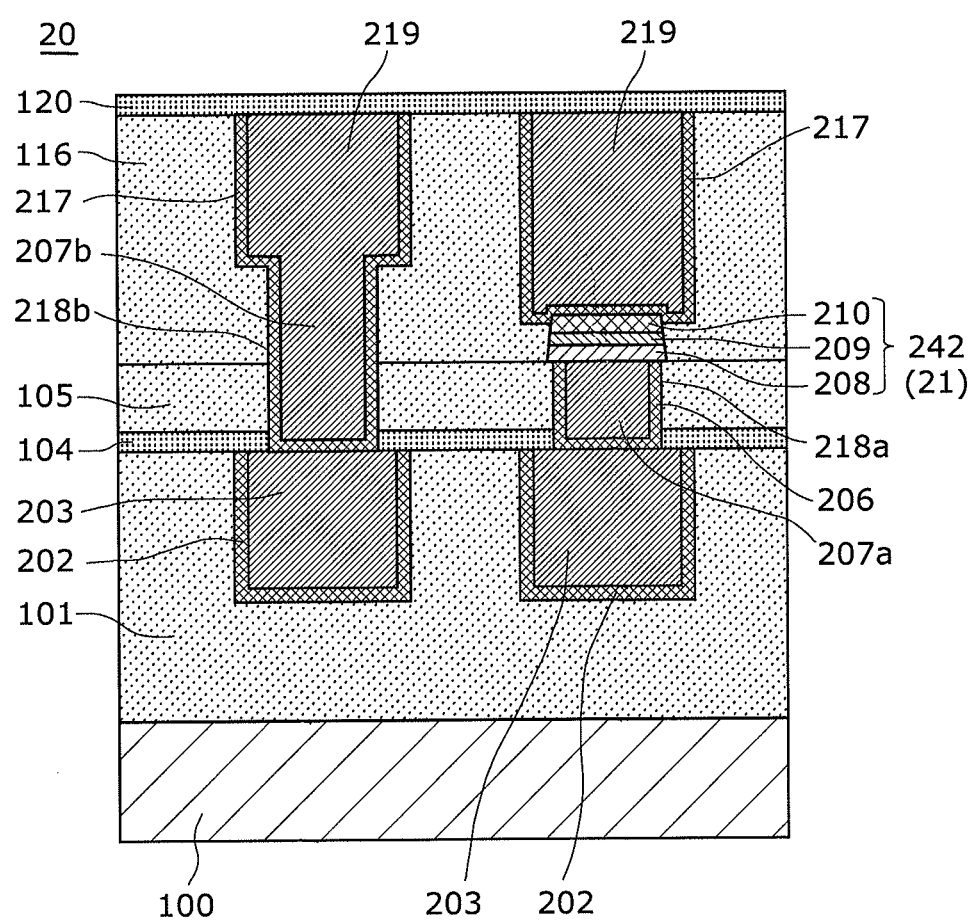
[FIG.4]

FIG. 4 is a cross-sectional diagram showing an exemplary structure of the current steering element parameter generation circuit 20 according to this embodiment. FIG. 4 is a cross-sectional view when the cross section along an alternate long and short dash line between C-C' in FIG. 2 is seen in the direction shown by the arrows.

This current steering element parameter generation circuit 20 is configured by integrating a plurality of reference cells 21 to have a plurality of third lines 203, a plurality of fourth lines 219, and a plurality of second current steering elements 242.

The plurality of third lines 203 are formed above the substrate 100 on which transistors etc. are formed. The plurality of third lines 203 are formed in stripes parallel to each other. The plurality of fourth lines 219 are formed in stripes parallel to each other. At the respective cross-points at which the third lines 203 and the fourth lines 219 cross each other, second current steering elements 242 (reference cells 21) are formed. The third lines 203 and the fourth lines 219 are connected to the reference cells 21, a sense amplifier, a power source, etc.

Hereinafter, elements of the current steering element parameter generation circuit 20 are explained in detail.

As shown in each of FIG. 3C and FIG. 4, the current steering element parameter generation circuit 20 is formed above the substrate 100, and includes: a first interlayer dielectric 101, a first barrier metal layer 202, third lines 203, a first liner layer 104, a second interlayer dielectric 105, a second barrier metal layer 206, plugs 207a and 207b, a second current steering element 242, a third interlayer dielectric 116, a third barrier metal layer 217, contact holes 218a and 218b, fourth lines 219, and a second liner layer 120.

The first barrier metal layer 202 is formed within a wiring gutter formed to embed the third lines 203 to the first interlayer dielectric 101. This first barrier metal layer 202 is formed, for example, by sequentially depositing a tantalum nitride having a thickness from 5 nm to 40 nm and a tantalum having a thickness from 5 nm to 40 nm.

The third lines 203 are formed in the first interlayer dielectric 101, and includes, for example, cupper or the like. More specifically, each third line 203 is formed such that the wiring gutter is fully filled with the third line 203 and the first barrier metal layer 202 above the first barrier metal layer 202 formed in the wiring gutter of the first interlayer dielectric 101.

The first liner layer 104 is formed above the first interlayer dielectric 101 including the third line 203. Each of the first liner layer 104 and the second interlayer dielectric 105 has a contact hole 218a.

The second barrier metal layer 206 is formed in the first liner layer 104 and the second interlayer dielectric layer 105, specifically in the contact hole 218a formed in the first liner layer 104 and the second interlayer dielectric 105. The second barrier metal layer 206 is formed by, for example, sequentially depositing a tantalum nitride having a thickness from 5 nm to 40 nm and a tantalum having a thickness from 5 nm to 40 nm.

The plug 207a is formed in the contact hole 218a in the first liner layer 104 and the second interlayer dielectric 105, and is electrically connected to the third line 203. More specifically, the plug 207a is formed above the second barrier metal layer 206 in the contact hole 218a formed in the first liner layer 104 and the second interlayer dielectric 105, and is electrically connected to the third line 203. This plug 207a is formed, for example, to have a diameter from 50 nm to 200 nm.

The plug 207b is formed in the contact hole 218b in the first liner layer 104 and the second interlayer dielectric 105, and is electrically connected to the third line 203. More specifically, the plug 207b is formed above the third barrier metal layer 217 in the contact hole 218b formed in the first liner layer 104 and the second interlayer dielectric 105, and is electrically connected to the third line 203. This plug 207b is formed, for example, to have a diameter from 50 nm to 200 nm.

The second current steering element 242 is an MSM diode or the like formed above the second interlayer dielectric 105, and is connected to the plug 207a electrically and physically. This second current steering element 242 includes a second lower electrode layer 208, a second current steering layer 209, and a second upper electrode layer 210.

The second lower electrode layer 208 is formed above the substrate 100 (specifically, above the second interlayer dielectric 105), and includes a tantalum nitride or the like. The second current steering layer 209 is formed above the second lower electrode layer 208, and includes a silicon nitride of a nitrogen-deficiency type or the like. The second upper electrode layer 210 is formed above the second current steering layer 209, and includes a tantalum nitride or the like.

The reference cell 21 is formed to have a structure substantially without the following layers: the variable resistance element 141 including the third lower electrode layer 111, the first oxide layer 112a which is a low resistance layer, the second oxide layer 112b which is a high resistance layer, and the third upper electrode layer 113 all included in the memory cell 11 shown in each of FIGS. 3A and 3B.

The memory cell array 10 includes memory cells 11 each including the variable resistance element 141 and the first current steering element 142. The current steering element parameter generation circuit 20 includes reference cells 21 each composed only of the second current steering element 242 which is the same in structure as the first current steering element 142.

The second current steering element 242 of the reference cell 21 and the first current steering element 142 included in the memory cell 11 are formed in the same process, and thus are in the same layer and have the same form (in respects of material, film thickness, composition, thermal history, etc.) It is to be noted that when the second current steering element 242 and the first current steering element 142 are formed in different processes, a step is generated below one of the elements. Here, when they are in the same layer, they are arranged in a horizontal direction parallel to a main surface of the substrate 100 at the same height from the substrate 100.

More specifically, the second lower electrode layer 208 having the same material and film thickness as those of the first lower electrode layer 108 of the first current steering element 142 is formed in the layer in which the first lower electrode layer 108 is formed, the second current steering layer 209 having the same material and film thickness as those of the first current steering layer 109 of the first current steering element 142 is formed in the layer in which the first current steering layer 109 is formed, and the second upper electrode layer 210 having the same material and film thickness as those of the first upper electrode layer 110 of the first current steering element 142 is formed in the layer in which the first upper electrode layer 110 is formed. In this way, the first current steering element 142 and the second current steering element 242 have the same current steering characteristics. For this reason, by detecting the current steering characteristics of the second current steering element 242 of the reference cell 21, it is possible to obtain the current steering characteristics of the first current steering element 142 of the cell 11.

For example, in the case of using a tantalum oxide as an oxygen-deficient metal oxide, in the memory cell 11, a variable resistance layer 112 includes a second oxide layer 112b (TaO$_y$) ($2.1 \leq y \leq 2.5$) which is a layer having a high oxygen content atomic percentage in a range from 67.7 atm % to 71.4 atm %. Accordingly, the variable resistance element 141 has 10 MΩ as an initial resistance value (which is a resistance value in the case where the variable resistance element 141 is in a super high resistance state). Thus, it is difficult to directly detect current steering characteristics of the first current steering element 142 using normal memory cells. However, with the current steering element parameter generation circuit 20 including reference cells 21 having the characteristics equivalent to those of the first current steering element 142, it is easy to detect the current steering characteristics of the first current steering element 142.

The third interlayer dielectric 116 is formed above the second interlayer dielectric 105 to cover the second current steering element 242. In addition, contact holes 218b are formed in the second interlayer dielectric 105, and the third interlayer dielectric 116, and wiring gutters are formed in the third interlayer dielectric 116. In addition, a plug 207b is embedded in the contact holes 218b, and fourth lines 219 are embedded in the wiring gutters.

The third barrier metal layers 217 are formed in the contact holes 218b and the wiring gutters. The third barrier metal layers 217 are formed by, for example, sequentially depositing a tantalum nitride having a thickness from 5 nm to 40 nm and a tantalum having a thickness from 5 nm to 40 nm.

The fourth lines 219 are formed in the wiring gutters in the third interlayer dielectric 116, and is connected to the second upper electrode layer 210 which is the upper part of the second current steering element 242. In addition, the fourth lines 219 are connected not only to the plug 207b in the contact holes 218b but also to the third lines 203.

As described above, with the non-volatile memory device according to this embodiment, the current steering element parameter generation circuit 20 includes the second current steering element 242 having non-linear current steering characteristics equivalent to those of the first current steering element 142 of the memory cell 11. Thus, it is possible to detect non-linear current steering characteristics of the first current steering element 142 by detecting the non-linear current steering characteristics of the second current steering element 242. Accordingly, in the case of generating a voltage to be applied to the memory cells 11, for example, the current steering element parameter generation circuit 20 including the reference cell 21 can detect the current steering characteristics of the second current steering element 242 and output them to the control circuit of the memory cell array 10 for suitable write voltage compensation. Therefore, it is possible to realize a stable non-volatile memory device.

For example, the current steering element parameter generation circuit 20 is formed to include a reference cell (a second current steering element 242), a sense circuit, an electric power circuit, a control circuit etc. The current steering element parameter generation circuit 20 detects a forward direction threshold value voltage Vf, an ON current, and an OFF current of the second current steering element 242, and outputs them to the control circuit of the memory cell array 10. Based on the detection result, the internal voltage generation circuit of the memory cell array 10 generates an offset voltage, optimizes a write voltage, a read voltage, an initial break voltage etc. to the memory cells 11, and applies them to the memory cells 11. This optimization of voltages to be applied may be performed at the time when the non-volatile memory device is tested before shipment, or performed periodically at the times of operation after shipment, or performed before and after shipment. With periodical optimization, it is possible to adapt to aging of the non-volatile memory device. In addition, the current steering element parameter generation circuit 20 includes the plurality of reference cells (second current steering elements 242). Thus, it is possible to increase optimization accuracy by generating an offset voltage using the average of results of detection by the plurality of reference cells (the second current steering elements 242).

Here, it is also good to evaluate each of the reference cells (second current steering elements 242) using external test circuits, for example, by connecting a corresponding one of the fourth lines 219 and a corresponding one of the third lines 203 to the external terminals and connecting the external terminals to a test circuit outside the non-volatile memory device.

Next, a description is given of a method for manufacturing the aforementioned non-volatile memory device, specifically, a method for forming a memory cell array 10 and a current steering element parameter generation circuit 20.

Each of FIG. 5 to FIG. 15 is a cross-sectional view for explaining the method for forming the memory cell array 10 (the memory cell array and the wiring part thereof) and the current steering element parameter generation circuit 20 (the reference cells and the wiring part thereof) according to this embodiment. Here, in general, a large number of memory cells 11 and reference cells 21 are formed above the substrate 100. For simplification, in each of FIG. 5 and FIG. 15, two memory cells 11 are formed, and one reference cell 21 is formed. In addition, for easy understanding, the structure is partly magnified.

The non-volatile memory device manufacturing method according to this embodiment is a method for manufacturing a non-volatile memory device which includes: the memory cell array 10 including a stack of memory cells 11 connected in series to a first current steering element 142 and a variable resistance element 141; a second current steering element 242 for determining current steering characteristics of the first current steering element 142; and the current steering element parameter generation circuit 20 which is electrically connected to the memory cell array 10 and causes the memory cells 11 to operate. The first current steering element 142 and the variable resistance element 141 are formed using the same mask, and the second current steering element 242 and the first current steering element 142 are formed at the same time.

The non-volatile memory device manufacturing method in this embodiment includes three processes of: forming a first current steering element 142 and a second current steering element 242 including a first stack of a first lower electrode layer 308, a current steering layer 309, and a first upper electrode layer 310, in an area including an area in which a memory cell array 10 is formed and an area in which a current steering element current parameter generation circuit 20 is formed; forming a variable resistance element including a second stack of a second lower electrode layer 311, a first oxide layer 312a including an oxygen-deficient first metal oxide, a second oxide layer 312b including a second metal oxide having a smaller oxygen deficiency and a higher resistance value than those of the first metal oxide, and a second electrode layer 313, above the first stack in the area in which the memory cell array 10 is formed and the area in which the current steering element current parameter generation circuit 20 is formed; and partially or fully removing the second stack in the area in which the second current steering element 242 is formed so that the second current steering element 242 and the layer formed above the second current steering element 242 are connected without the second oxide layer 312b being interposed therebetween.

More specifically, the non-volatile memory device manufacturing method may include the following processes of: forming the first lower electrode layer 308 (the current steering element lower electrode layer) above the substrate 100; forming the current steering layer 309 above the lower electrode layer 308; forming the first upper electrode layer 310 (the current steering element upper electrode layer) above the current steering layer 309; forming the second lower electrode layer 311 (the variable resistance element lower electrode layer) above the upper electrode layer 310; forming the first oxide layer 312a including an oxygen-deficiency first metal oxide above the second lower electrode layer 311, and forming, above the first oxide layer 312a, the second oxide layer 312b including an oxygen-deficiency second metal oxide having a higher oxygen content atomic percentage and a high resistance value compared to the first metal oxide; forming the second upper electrode layer 313 (the variable resistance element upper electrode layer) above the second oxide layer 312b; forming the variable resistance element 141 by patterning the second upper electrode layer 313, the first oxide layer 312a, the second oxide layer 312b, and the second lower electrode layer 311, and forming, at the same time, elements which are the first current steering element 142 formed below to be contact with the variable resistance element 141 and the variable resistance element 141, and the second current steering element 242 isolated from the first current steering element 142 and the variable resistance element 141, by patterning the first upper electrode layer 310, the current steering layer 309, and the first lower electrode layer 308; and forming a second line 119 electrically connected to the first current steering element 142 and the variable resistance element 141 and a fourth line 219 electrically connected to the second current steering element 242, wherein in the forming of the elements by patterning, a same hard mask layer 125 may be used in patterning for forming the variable resistance element 141 and in patterning for forming the first current steering element 142, and the second oxide layer 312b may be selectively removed in an area in which the second current steering element 242 is formed, in any one of the forming of the second upper electrode layer 313, the forming of the elements by patterning, and the forming of the second line 119 and the fourth line 219.

In addition, in the process of forming each of the elements by patterning, it is also good to remove the second upper electrode layer 313, the first oxide layer 312a, and the second oxide layer 312b in the area in which the second current steering element 242 is formed, when forming the variable resistance element 141.

The method for manufacturing the non-volatile memory device according to this embodiment is described in detail below.

Figure 5:
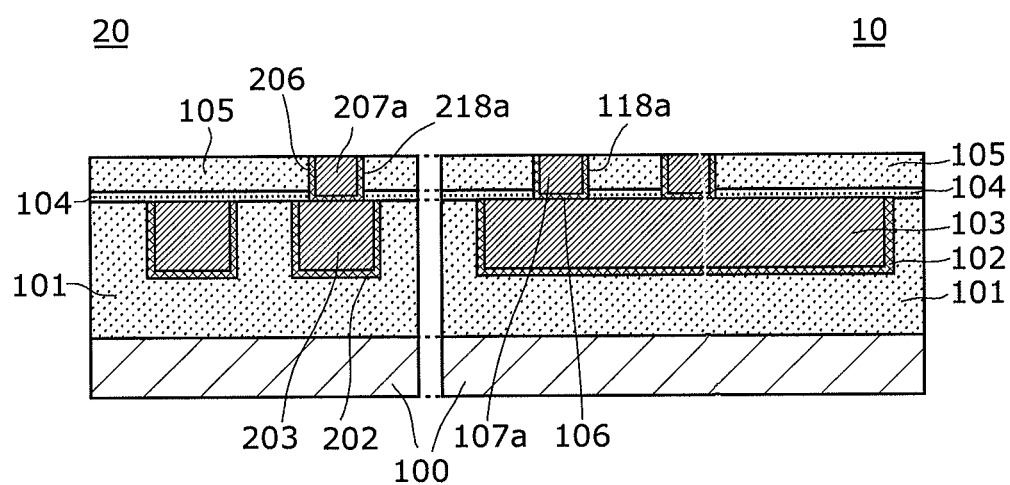
[FIG.5]

First, as shown in FIG. 5, a first line 103 and a third line 203 are formed above the semiconductor substrate 100 on which transistors are formed in advance, and plugs 107a and 207a are formed above the first line 103 and the third line 203 so as to be connected to the first line 103 and the third line 203.

More specifically, a first interlayer dielectric 101 including a silicon oxide is formed above the substrate 100, using plasma CVD or the like. Next, a wiring gutter for embedding the first line 103 and the third line 203 in the first interlayer dielectric 101 is formed using photolithography and dry etching. Next, the following are deposited in the wiring gutter: first barrier metal layers 102 and 202 including a tantalum nitride (from 5 nm to 40 nm) and tantalum (from 5 nm to 40 nm) and cupper (from 50 nm to 300 nm) as a material for wiring. Next, by further depositing cupper as a seed using an electroplating method or the like, the wiring gutter is filled with the cupper as the material for wiring and the first barrier metal layers 102 and 202. Next, by removing unnecessary part of cupper on the surface among the deposited cupper and unnecessary part of the first barrier metal layers 102 and 202 using a CMP method, the first line 103 and the third line 203 are formed to have a flat surface which is flush with the surface of the first interlayer dielectric 101. Next, a first liner layer 104 is formed to cover the first interlayer dielectric 101, the first line 103, and the third line 203 by depositing a silicon nitride approximately from 30 nm to 200 nm above the first interlayer dielectric 101, the first line 103, and the third line 203 using a plasma CVD or the like. Next, a second interlayer dielectric 105 is further deposited above the first liner layer 104. Here, as necessary, steps on the surface are reduced using a CMP method. Next, a contact hole 118a in which the plug 107a to be connected to the first line 103 is formed at a predetermined position above the first line 103 using photolithography and dry etching. Likewise, a contact hole 218a in which the plug 207a to be connected to the third line 203 is formed at a predetermined position above the third line 203. Next, second barrier metal layers 106 and 206 including a tantalum nitride layer (having a thickness from 5 nm to 40 nm) and a tantalum layer (having a thickness from 5 nm to 40 nm) and a cupper layer (having a thickness from 50 nm to 300 nm) are deposited above the second interlayer dielectric 105 including the contact holes 118a and 218a, using a sputtering method or the like. Next, by further depositing cupper as a seed using an electroplating method or the like, the entirety of the contact holes 118a and 218a are filled with the second barrier metal layers 106 and 206 and the cupper. Next, the plugs 107a and 207a are formed to have a flat surface which is flush with the surface of the second interlayer dielectric 105 by removing unnecessary part of cupper on the surface and unnecessary part of the second barrier metal layers 106 and 206 using a CMP method.

Figure 6:
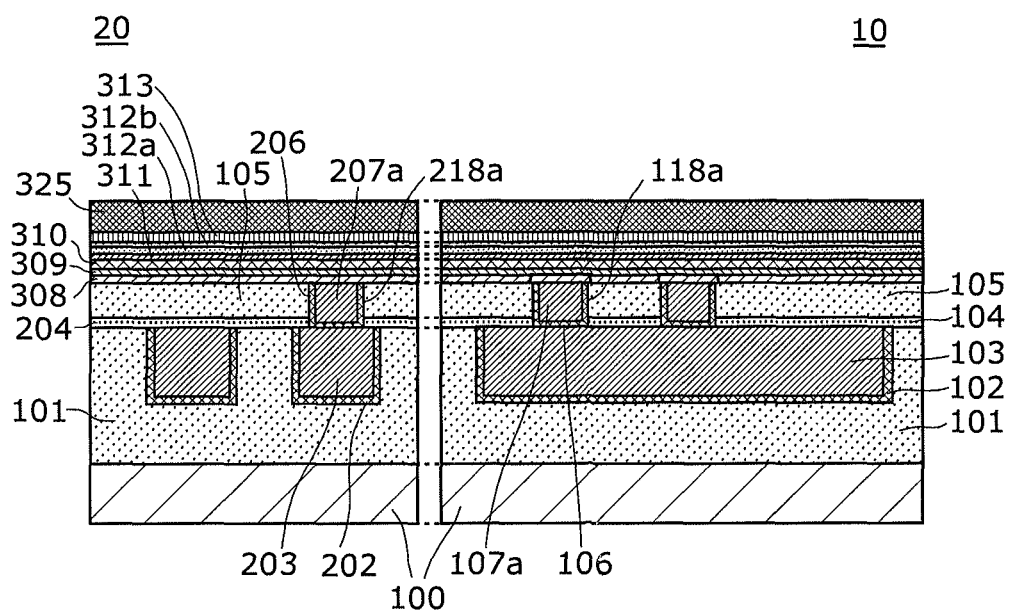
[FIG.6]

Next, as shown in FIG. 6, the following are sequentially deposited above the second interlayer dielectric 105 including the plugs 107a and 207a using a sputtering method or the like: a first lower electrode layer 308 (having a thickness of 20 nm) including a tantalum oxide; a current steering layer 309 (having a thickness of 20 nm) including a nitrogen-deficient silicon nitride; and a first upper electrode layer 310 (having a thickness of 30 nm) including a tantalum nitride. Next, the following are sequentially deposited above the first upper electrode layer 310 using a sputtering method or the like: a second lower electrode layer 311 (having a thickness of 30 nm) including a tantalum nitride; a first oxide layer 312a, a second oxide layer 312b, and a second upper electrode layer 313 (having a thickness of 80 nm) including iridium. Next, as a hard mask for use in dry etching, the following is deposited using a sputtering method or the like: a hard mask layer 325 (having a thickness of 100 nm) which is a conductive layer and includes one of a titanium nitride and a titanium-aluminium nitride (for example, a titanium-aluminium nitride.

Here, the first oxide layer 312a and the second oxide layer 312b are formed by depositing $TaO_x$ ($0<x<2.5$) by 50 nm as a high oxygen-deficient layer (the first oxide layer 312a), and above this high oxygen-deficient layer (first oxide layer 312a), depositing $TaO_y$ ($x<y$) by 5 nm as a low oxygen-deficient layer (the second oxide layer 312b) having an oxygen deficiency smaller than $TaO_x$. At this time, the first oxide layer 312a and the second oxide layer 312b may be formed by depositing $TaO_x$ by 50 nm and performing oxidation on the upper surface of $TaO_x$ by plasma oxidization in an oxygen air, and depositing $TaO_y$ ($x<y$) of the low oxygen-deficient layer (the second oxide layer 312b) having an oxygen content atomic percentage larger than $TaO_x$ by 5 nm above the $TaO_x$ of the high oxygen-deficient layer (first oxide layer 312a). Here, the oxidation method is not limited to such plasma oxidation. For example, it is also good to perform a process for providing a surface oxidation effect such as a heat treatment in oxygen air. In addition, the deposited amount of $TaO_x$ of the high oxygen-deficient layer (first oxide layer 312a) is not limited to 50 nm. For example, it is also good that $TaO_x$ of the high oxygen-deficient layer (first oxide layer 312a) is deposited by 45 nm, and $TaO_y$ ($x<y$) of the low oxygen-deficient layer (the second oxide layer 312b) is deposited by 5 nm instead of performing such an oxidation process. In addition, it is also good to deposit a low oxygen-deficient titanium oxide by 5 nm instead of $TaO_y$ of the low oxygen-deficient layer (the second oxide layer 312b).

Figure 7:
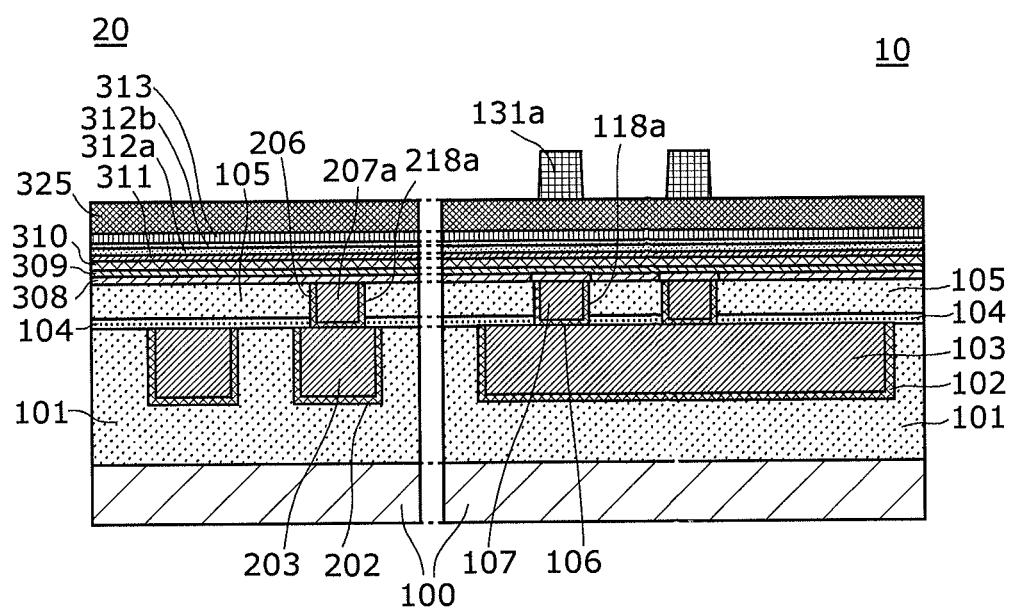
[FIG.7]

Next, as shown in FIG. 7, a first resist mask pattern 131a for forming the variable resistance element 141 is formed above a hard mask 325 using photolithography.

Figure 8:
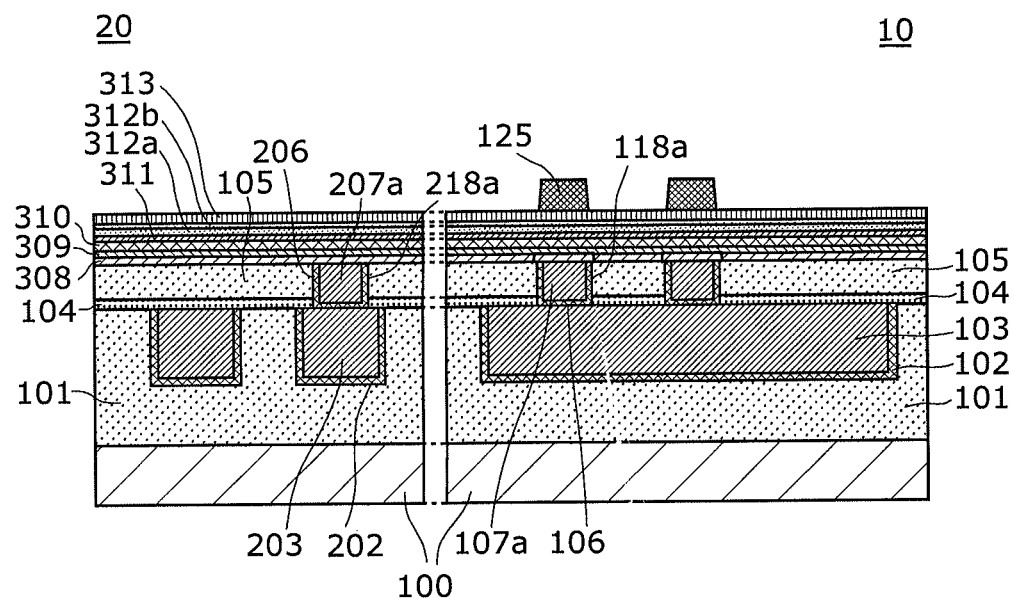
[FIG.8]

Next, as shown in FIG. 8, the hard mask layer 325 is patterned using a first resist mask pattern 131a to form a hard mask layer 125. Next, the first resist mask pattern 131a is removed by performing an ashing process.

Figure 9:
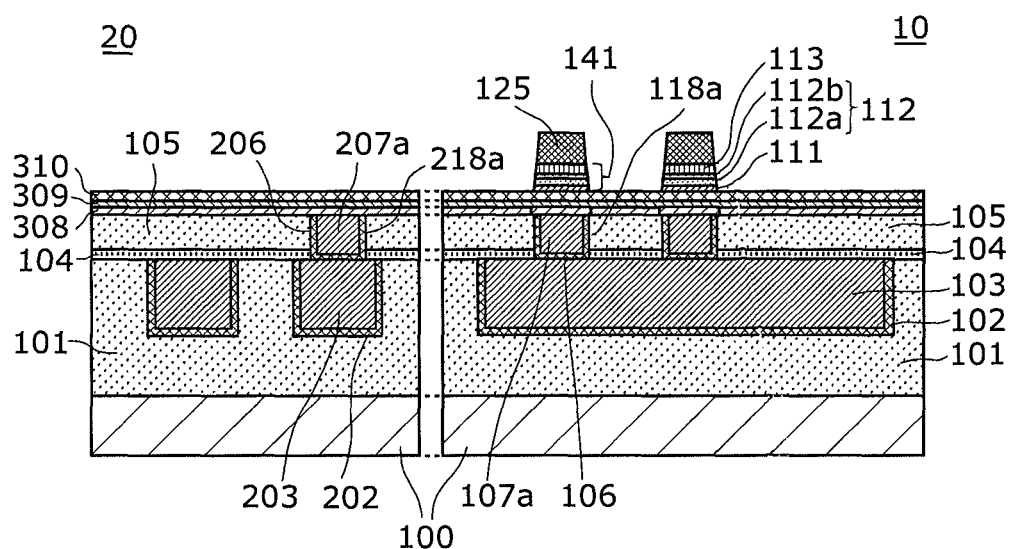
[FIG.9]

Next, as shown in FIG. 9, the second upper electrode layer 313, the first oxide layer 312a, the second oxide layer 312b, and the second lower electrode layer 311 are patterned using the hard mask 125 to form a third upper electrode layer 113 of the variable resistance layer 141, a variable resistance layer 112, and a third lower electrode layer 111. At this time, the second upper electrode layer 313, the first oxide layer 312a, the second oxide layer 312b, and the second lower electrode layer 311 are removed in the area in which the current steering element parameter generation circuit 20 is formed.

Figure 10:
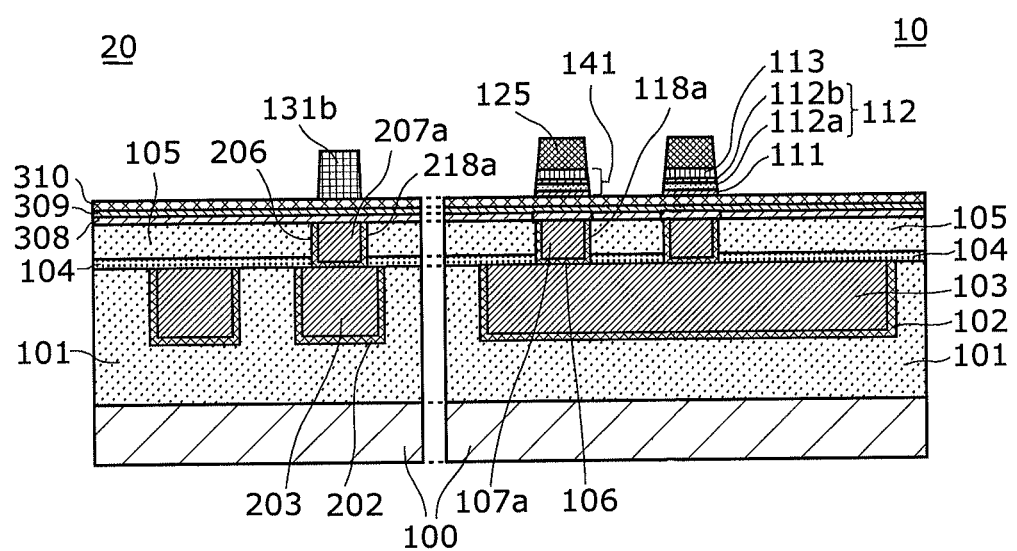
[FIG.10]

Next, as shown in FIG. 10, a second resist mask pattern 131b for forming the second current steering element 242 (reference cell 21) is formed above the first upper electrode layer 310 (the first upper electrode layer 310 in the area in which the current steering element parameter generation circuit 20 is formed) using photolithography.

Figure 11:
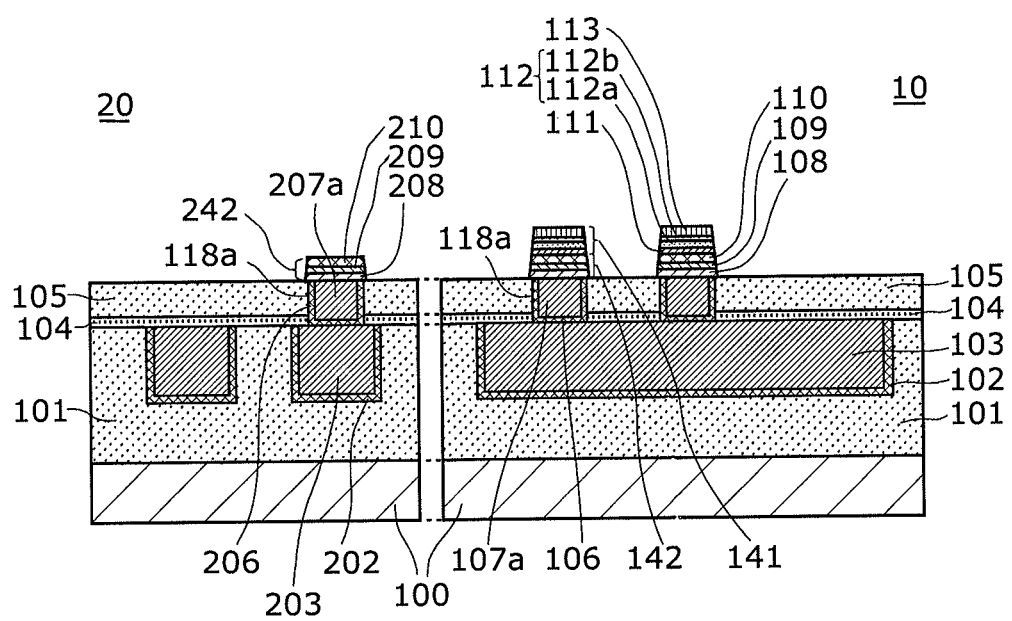
[FIG.11]

Next, as shown in FIG. 11, the first upper electrode layer 110 of the first current steering element 142, the first current steering layer 109, and the first lower electrode layer 108 are formed in the area in which the memory cell array 10 is formed, by patterning the first upper electrode layer 310, the current steering layer 309, and the first lower electrode layer 308 using the hard mask layer 125. At the same time, the second upper electrode layer 210 of the second current steering element 242, the second current steering layer 209, and the second lower electrode layer 208 are formed in the area in which the current steering element parameter generation circuit 20 is formed, by patterning the first upper electrode layer 310, the current steering layer 309, and the first lower electrode layer 308 using the second resist mask pattern 131b. Next, the second resist mask pattern 131b is removed, and the hard mask layer 125 is further removed by etching or the like. Here, there is no need to always remove the hard mask layer 125, and it may be maintained as necessary. In this way, it is possible to form the second current steering element 242 having the same current steering characteristics as those of the first current steering element 142 included in each memory cell 11, in the layer in which the first current steering element 142 is formed.

Figure 12:
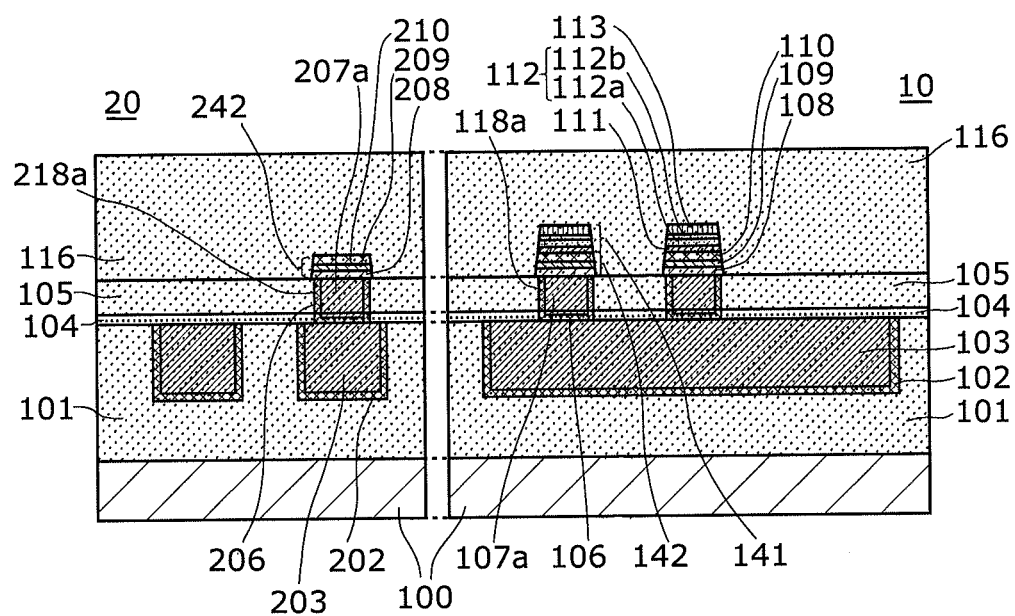
[FIG.12]
Figure 13:
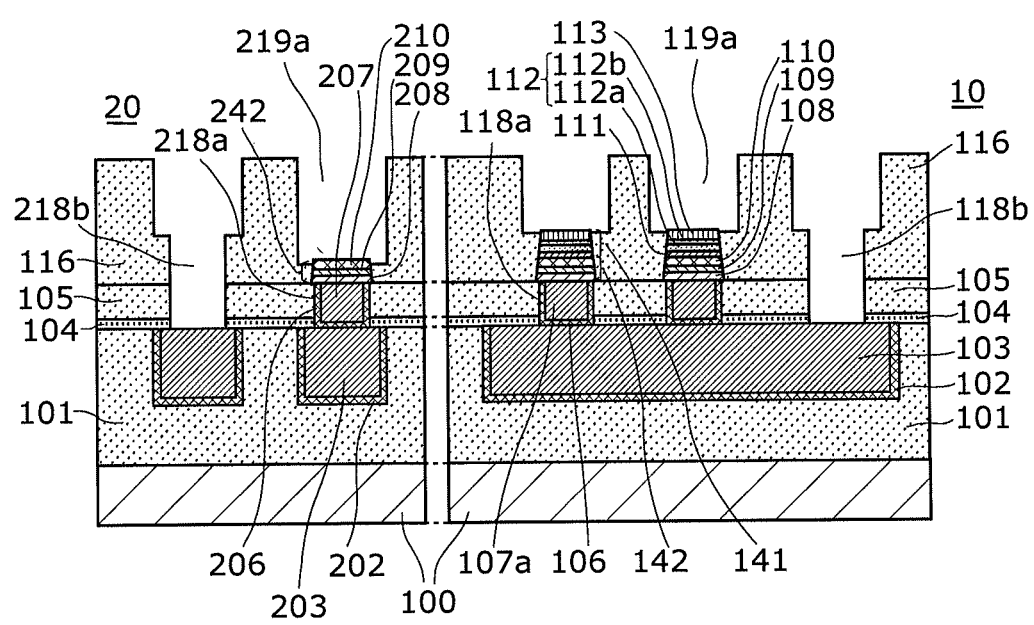
[FIG.13]

Next, as shown in FIGS. 12 and 13, a third interlayer dielectric 116 is formed to cover the variable resistance element 141, the first current steering element 142, and the second current steering element 242. Next, the following are formed in the third interlayer dielectric 116: (i) wiring gutters 119a and 219a for forming a second line 119 and a fourth line 219 which are connected to the third upper electrode layer 113 of the variable resistance element 141 and the second upper electrode layer 210 of the second current steering element 242, and (ii) contact holes 218a and 118b.

More specifically, as shown in FIG. 12, the third interlayer dielectric 116 for embedding the second line 119 and the fourth line 219 are deposited to cover the variable resistance element 141, the first current steering element 142, and the second current steering element 242. Next, as shown in FIG. 13, the wiring gutters 119a and 219a for forming the second line 119 and the fourth line 219 which are connected to the third upper electrode layer 113 of the variable resistance element 141 and the second upper electrode layer 210 of the second current steering element 242 are formed in the third interlayer dielectric 116 by photolithography and dry etching. At the same time, the contact holes 118b and 218b for forming plugs 107b and 207b which are connected to the first line 103 and the third line 203 are formed, by photolithography and dry etching, at predetermined positions without the variable resistance element 141 above the first line 103 and the third line 203, the first element 242.

As a general example, the contact holes 118b and 218b for plugs 107b and 207b as drawing contacts are formed first by first photolithography and dry etching, and the wiring gutters 119a and 219a for the second line 119 and the fourth line 219 are formed by second photolithography and dry etching. However, there is no inconvenience to form the wiring gutters 119a and 219a first.

Figure 14:
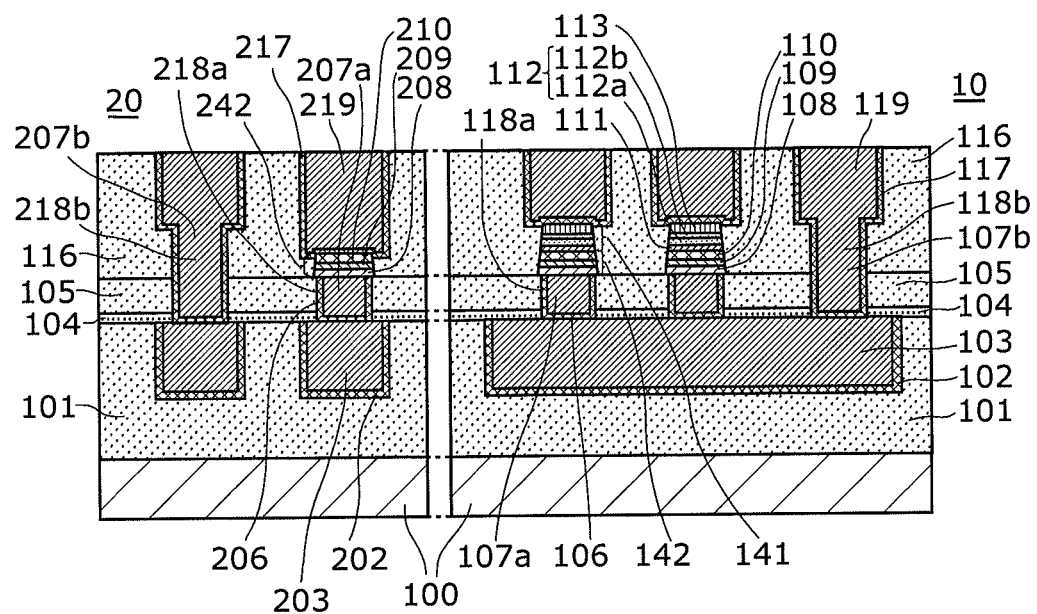
[FIG.14]

Next, as shown in FIG. 14, (i) third barrier metal layers 117 and 217 including a tantalum nitride (5 nm to 40 nm) and tantalum (5 nm to 40 nm) and (ii) cupper (50 nm to 300 nm) for a material for wiring are deposited, using a sputtering method or the like, in the contact holes 118b and 218b and the wiring gutters 119a and 219a. Conditions used here are the same as those in the process for embedding the first line 103 and the third line 203 as shown in FIG. 5. Next, by further depositing cupper as a seed using an electroplating method or the like, the contact holes 118b and 218b and the wiring gutters 119a and 219a are fully filled with the cupper as the material for wiring and the third barrier metal layers 117 and 217. Next, by removing unnecessary part of cupper on the surface and unnecessary part of the third barrier metal layers 117 and 217 using a CMP method, the second line 119 and the fourth line 219 are formed to have a flat surface which is flush with the surface of the third interlayer dielectric 116.

Figure 15:
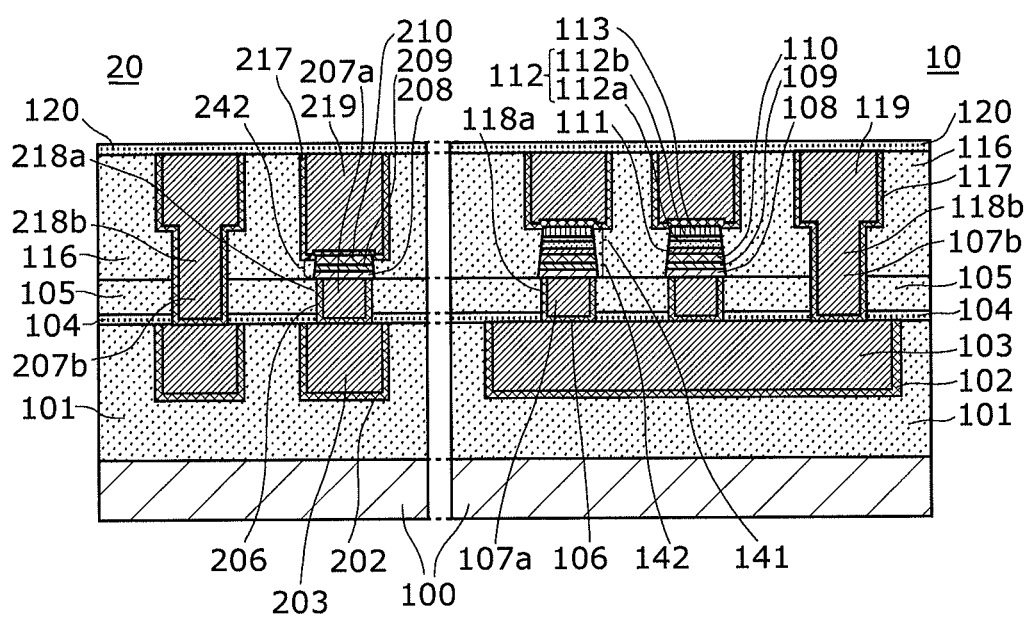
[FIG.15]

Next, as shown in FIG. 15, a second liner layer 120 is formed by depositing a silicon nitride layer by 30 nm to 200 nm, as a specific example, by 50 nm, using a plasma CVD or the like above the second line 119, the fourth line 219, and the third interlayer dielectric 116, so as to cover the second line 119 and the fourth line 219.

As described above, using the method for manufacturing the non-volatile memory device according to this embodiment, it is possible to manufacture a stable non-volatile memory device.

In addition, using the method for manufacturing the non-volatile memory device according to this embodiment, it is possible to manufacture the non-volatile memory device in a semiconductor manufacturing process using a conventional CMOS manufacturing process or the like. Accordingly, there is no need to perform a unique and special semiconductor manufacturing process in each of the processes of forming the variable resistance element and the current steering element. Therefore, it is possible to realize the manufacturing method highly compatible with increasingly finer semiconductor manufacturing processes. As a result, it is possible to realize the stable manufacturing method which facilitates refinement.

In addition, using the method for manufacturing the non-volatile memory device according to this embodiment, it is possible to sequentially form layers of the variable resistance element and the current steering element. Therefore, it is possible to reduce in-process damage of the variable resistance element and the current steering element, and to thereby reduce fluctuation in characteristics.

[Embodiment 2]

Descriptions are given of a structure of a non-volatile memory device according to Embodiment 2 of the present invention and a method for manufacturing the same. Hereinafter, differences from Embodiment 1 are mainly described.

Figure 16A:
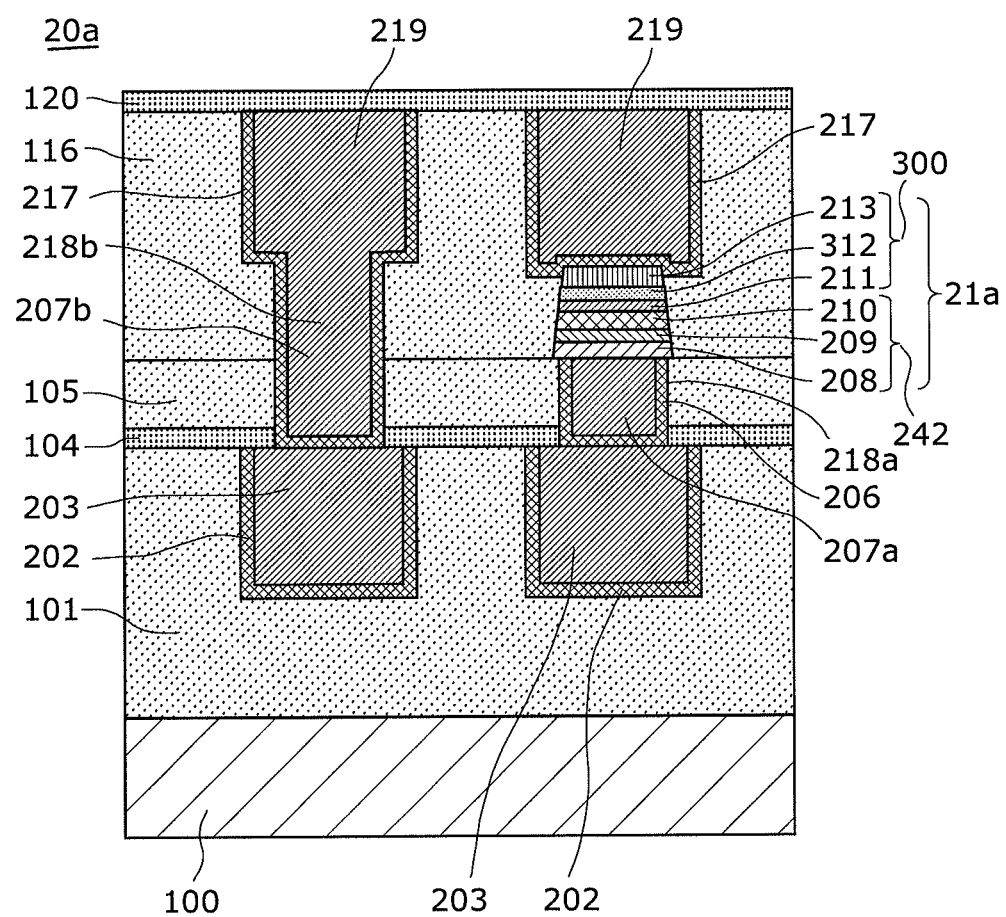
[FIG.16A]
Figure 16B:
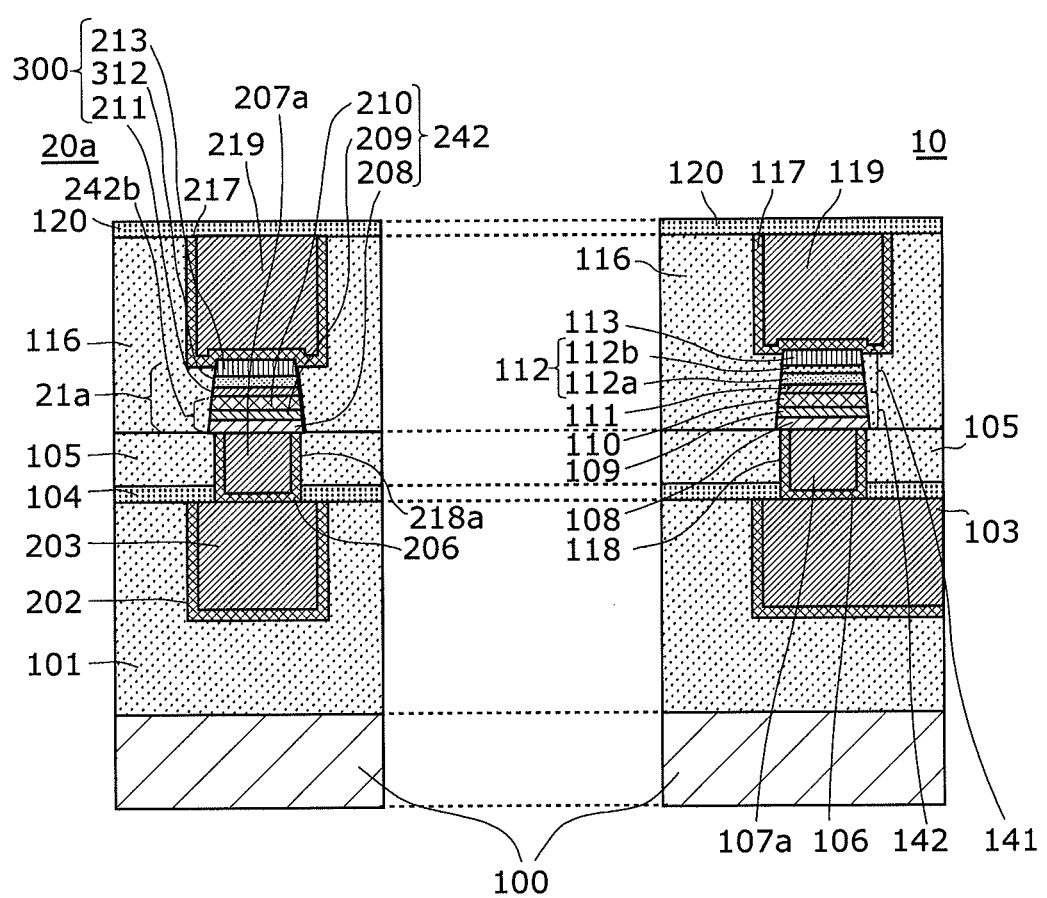
[FIG.16B]

FIG. 16A is a cross-sectional diagram showing an exemplary structure of the current steering element parameter generation circuit 20a according to this embodiment. FIG. 16B is a cross-sectional view of an exemplary structure of the non-volatile memory device according to this embodiment. FIG. 16A is a cross-sectional view of the cross section along the alternate long and short dash line shown in the C-C' in FIG. 2 when seen in the arrow direction. FIG. 16B is a cross-sectional view of the cross section along the alternate long and short dash line shown in the D-D' in FIG. 2 when seen in the arrow direction.

The current steering element parameter generation circuit 20a includes a resistor 300 formed between the second current steering element 242 and the fourth line 219. The resistor 300 is formed (i) above the fourth lower electrode layer 211 above the second upper electrode layer 210 and (ii) above the fourth lower electrode layer 211. The resistor 300 includes a first metal oxide, includes a resistance layer 312 without a second metal oxide, and a fourth upper electrode layer 213 above the resistance layer 312. The third lower electrode layer 111 and the fourth lower electrode layer 211 have the same composition and the same film thickness, and the third upper electrode layer 113 and the fourth upper electrode layer 213 have the same composition.

The non-volatile memory device according to this embodiment is described in detail below.

The current steering element parameter generation circuit 20a is formed to include integrated reference cells 21a, and includes a plurality of third lines 203, a plurality of fourth lines 219, a plurality of resistors 300, and a plurality of second current steering elements 242.

Each of the reference cells 21a in each of FIG. 16A and FIG. 16B does not substantially include any layer corresponding to the second oxide layer 112b which is a high resistance layer with respect to the memory cells 11 shown in each of FIGS. 3A, 3B, and 3C. In other words, each reference cell 21a in each of FIG. 16A and FIG. 16B is formed by adding the resistor 300 between the fourth line 219 and the second current steering element 242, to the structure of the reference cell 21 shown in each of FIGS. 3A, 3B, and 3C.

The reference cell 21a includes the second current steering element 242 and the resistor 300 including the fourth lower electrode layer 211, the resistance layer 312, and the fourth upper electrode layer 213.

The fourth lower electrode layer 211 is formed in the same process in which the third lower electrode layer 111 is formed, and has the same composition and film thickness as those of the third lower electrode layer 111. The resistance layer 312 is formed in the same process in which the first oxide layer 112a is formed, and has the same composition and film thickness as those of the first oxide layer 112a. The fourth upper electrode layer 213 is formed in the same process in which the third upper electrode layer 113 is formed, and has the same composition as that of the third upper electrode layer 113. Accordingly, the resistor 300 does not substantially include any second oxide layer 112b with respect to the variable resistance element 141.

The resistance layer 312 includes a high oxygen-deficient layer (a first oxide layer 112a, a low resistance layer) and does not substantially include any low oxygen-deficient layer (a second oxide layer 112b, a high resistance layer) included in the variable resistance layer 112. The resistance layer 312 has a resistance value sufficiently lower than a resistance value of the variable resistance layer 112 included in the variable resistance element 141. Thus, the resistance layer 312 does not perform any variable resistance operation even with a voltage with which the variable resistance element 141 performs a variable resistance operation. Accordingly, the resistor 300 is a fixed resistor element having a low resistance value.

The second current steering element 242 included in the reference cell 21a and the first current steering element 142 included in the memory cell 11 are formed in the same process, and thus are in the same layer and have the same form.

For example, in the case of using a tantalum oxide as an oxygen-deficient metal oxide, it is possible to set the resistance value of the resistor 300 to 10 kΩ or below because each of the first oxide layer 112a which is a layer having a low oxygen content atomic percentage (a high oxygen-deficient layer) and the resistance layer 312 ($TaO_x$) has an oxygen content atomic percentage from 44.4 atm % to 55.5 atom % ($0.8 \leq x \leq 1.9$). When the first current steering element 142 has a characteristic of requiring a voltage of 1 V to flow a current of 1 μA, each memory cell 11 includes the variable resistance layer 112 including a second oxide layer 112b ($TaO_y$) ($2.1 \leq y \leq 2.5$) which is a layer having a high oxygen content atomic percentage from 67.7 atm % to 71.4 atm %, and thus the initial resistance value of the variable resistance element 141 is 10 MΩ or more. Therefore, it is difficult to detect the current steering characteristics of the memory cell 11. On the other hand, the resistance layer 312 in each reference cell 21a has a resistance value of 10 kΩ which is sufficiently low. Thus, it is possible to fully detect the current steering characteristics of the memory cell 11. In this way, it is possible to detect the current steering characteristics of the memory cell 11 by determining the current steering characteristics of the reference cell 21a without directly determining the current steering characteristics of the memory cell 11.

As described above, the non-volatile memory device according to this embodiment is stable for the same reason as in Embodiment 1.

Next, a description is given of a method for manufacturing the aforementioned non-volatile memory device, specifically, a method for manufacturing a memory cell array 10 and a current steering element parameter generation circuit 20a.

Each of FIG. 17 to FIG. 28 is a cross-sectional view for explaining a method for forming a memory cell array 10 and a current steering element parameter generation circuit 20a according to this embodiment. Here, in general, a large number of memory cells 11 and reference cells 21a are formed above the substrate 100. For simplification of the drawings, in each of FIG. 17 to FIG. 28, two memory cells 11 are formed, and one reference cell 21a is formed. In addition, for easy understanding, the structure is partly magnified.

The method for manufacturing the non-volatile memory device according to this embodiment is intended to perform a process of forming a second upper electrode layer 413 (a variable resistance element upper electrode layer), sequentially remove the second upper electrode layer 413 and the second oxide layer 312b in an area in which the second current steering element 242 is formed, and to form an additional second upper electrode layer 413 above the firstly-formed second upper electrode layer 413 and the first oxide layer 312a exposed by the removal.

Here, in the process of forming the second upper electrode layer 413, the second upper electrode layer 413 before the removal has a film thickness smaller than that of the additional second upper electrode layer 413 formed after the removal.

The method for manufacturing the non-volatile memory device according to this embodiment is described in detail below.

Figure 17:
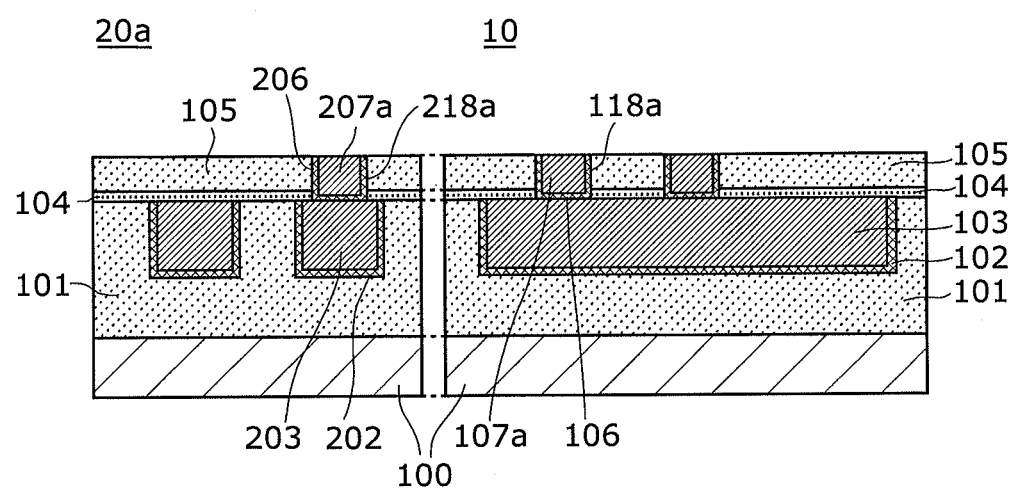
[FIG.17]

First, as shown in FIG. 17, a first line 103 and a third line 203 are formed above the substrate 100 on which transistors are formed in advance, and plugs 107a and 207a are formed above the first line 103 and the third line 203 so as to be connected to the first line 103 and the third line 203. More specifically, processes similar to the processes as known from FIG. 5 are performed.

Figure 18:
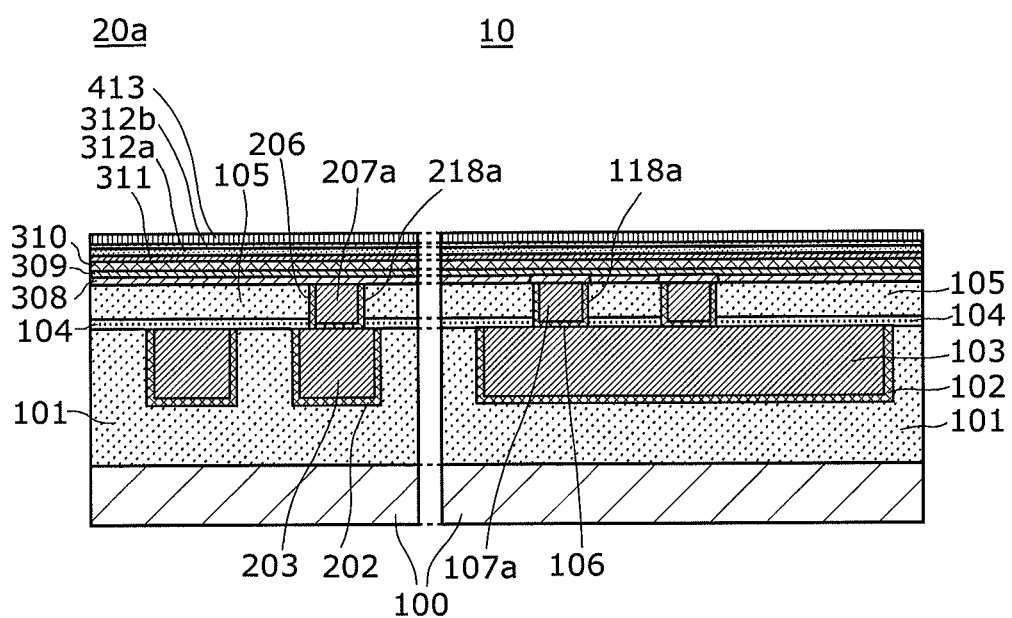
[FIG.18]

Next, as shown in FIG. 18, a first lower electrode layer 308, a current steering layer 309, and a first upper electrode layer 310 are sequentially deposited above the second interlayer dielectric 105 including the plugs 107a and 207a, using a sputtering method. Next, the following are sequentially deposited above the deposited first upper electrode layer 310, using a sputtering method: a second lower electrode layer 311, a first oxide layer 312a and a second oxide layer 312b, and a second upper electrode layer 413 (having a thickness of 10 nm) including iridium.

Here, by depositing the second upper electrode layer 413, it is possible to prevent the second oxide layer 112b included in the variable resistance element 141 is damaged in a downstream process in which a resist mask pattern forming a resistor 300 is removed.

Figure 19:
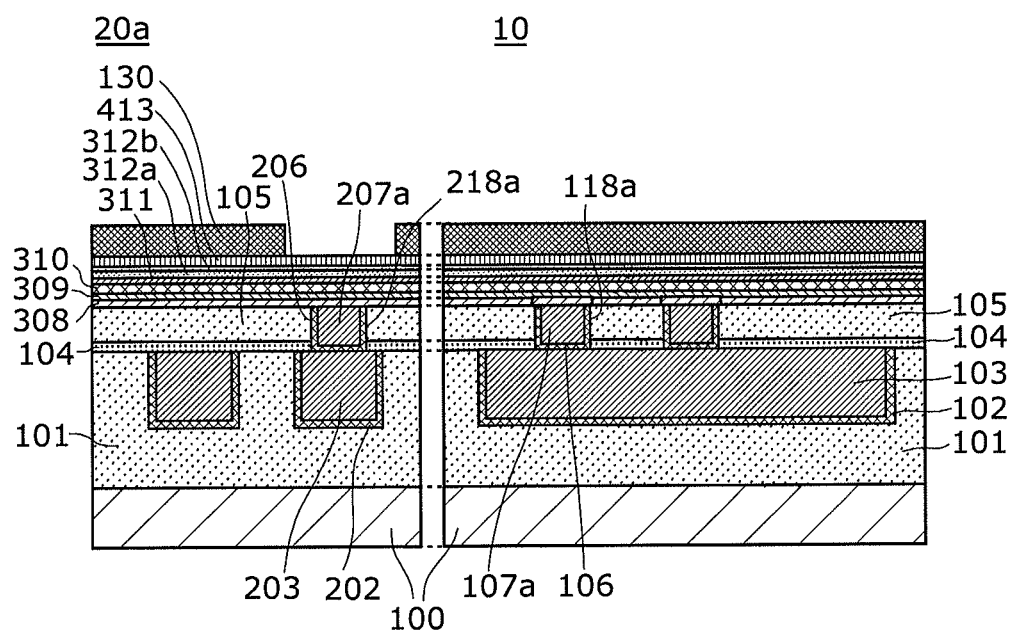
[FIG.19]

Next, as shown in FIG. 19, a first resist mask pattern 130 is formed above the second upper electrode layer 413 using photolithography. The first resist mask pattern 130 is for forming a reference cell 21a and thus has an opening in an area in which the reference cell 21a is formed, and is for selectively removing the second upper electrode layer 413 and the second oxide layer 312b in the area.

Figure 20:
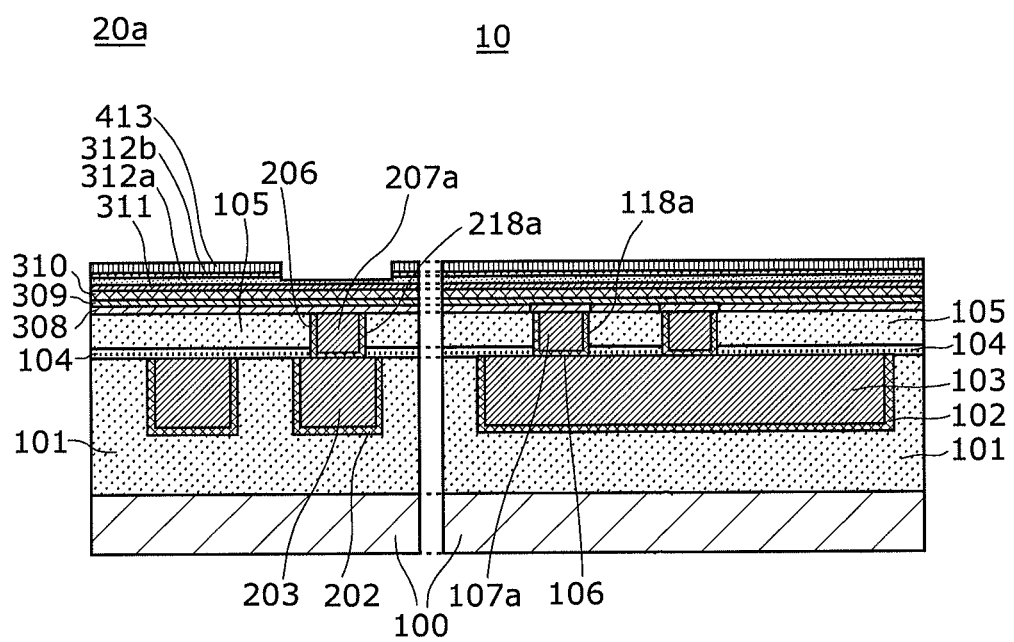
[FIG.20]

Next, as shown in FIG. 20, the second upper electrode layer 413 and the second oxide layer 312b are patterned by dry etching using the first resist mask pattern 130 so that the first oxide layer 312a is exposed. Next, the first resist mask pattern 130 is removed. At this time, an ashing process for oxidization is performed on a surface of a high oxygen-deficient layer (the first oxide layer 312a) with oxygen plasma to form a highly resistant layer. Thus, it is also good to remove the first resist mask pattern 130 using a drug solution such as an ammonium hydrogen-peroxide and a sulfuric acid/hydrogen peroxide mixture.

Figure 21:
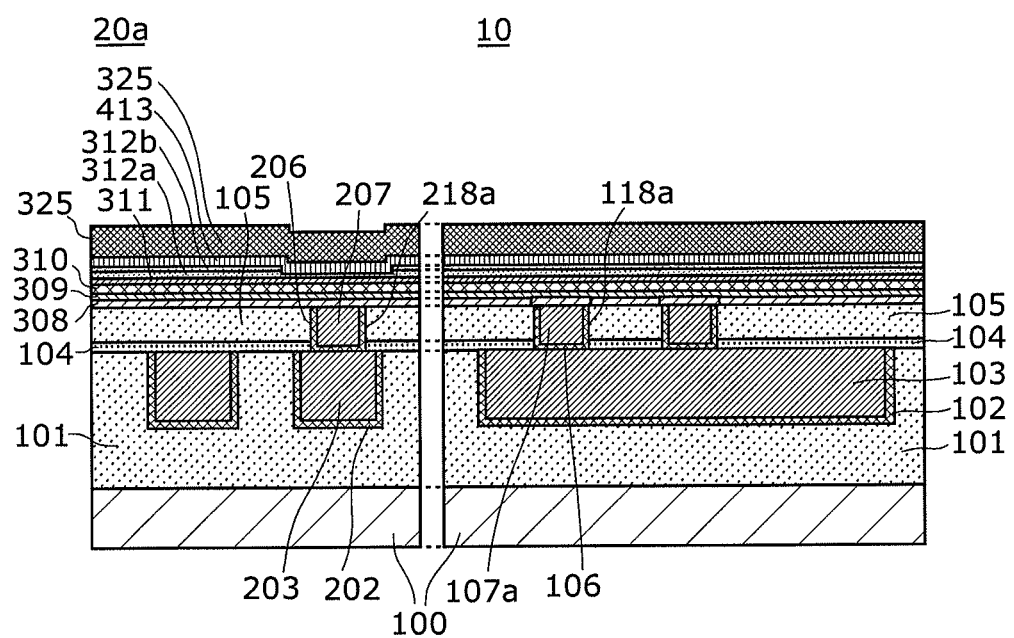
[FIG.21]

Next, as shown in FIG. 21, an additional second upper electrode layer 413 (having a thickness of 70 nm) including iridium is deposited above the firstly-formed second upper electrode layer 413 and the second oxide layer 312b. Next, above the deposited second upper electrode layer 413, a hard mask layer 325 is deposited as a hard mask in dry etching, using a sputtering method or the like.

Figure 22:
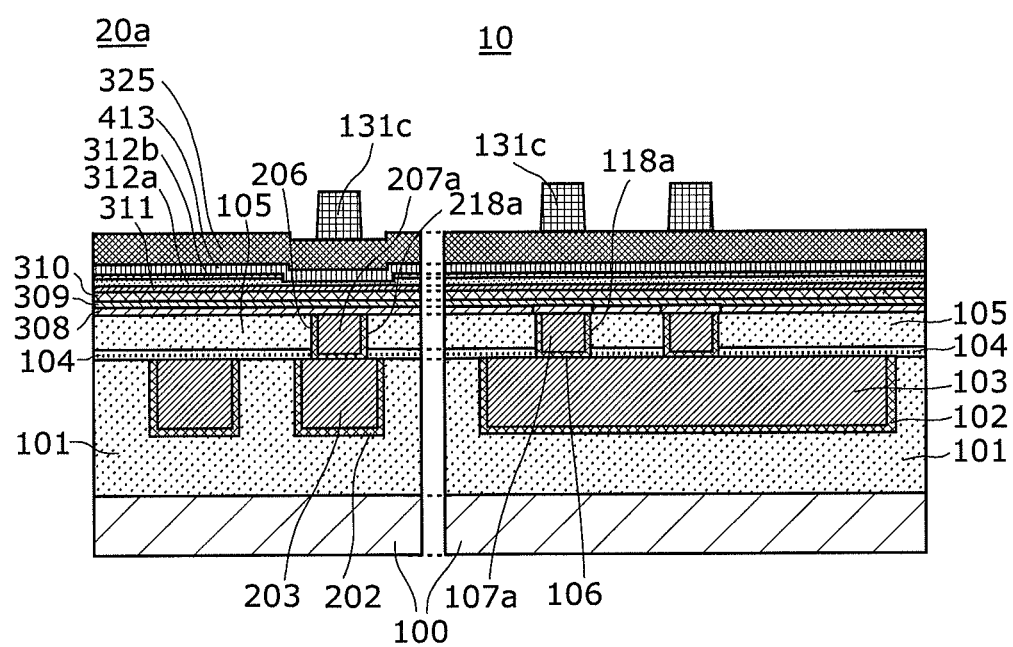
[FIG.22]

Next, as shown in FIG. 22, a dot-shaped second resist mask pattern 131c is also formed using photolithography. This second resist mask pattern 131c is for simultaneously forming (i) a variable resistance element 141 and a first current steering element 142 and (ii) a resistor 300 and a second current steering element 242. At this time, the second resist mask pattern 131c forming the first current steering element 142 and the second current steering element 242 may have a same size.

Figure 23:
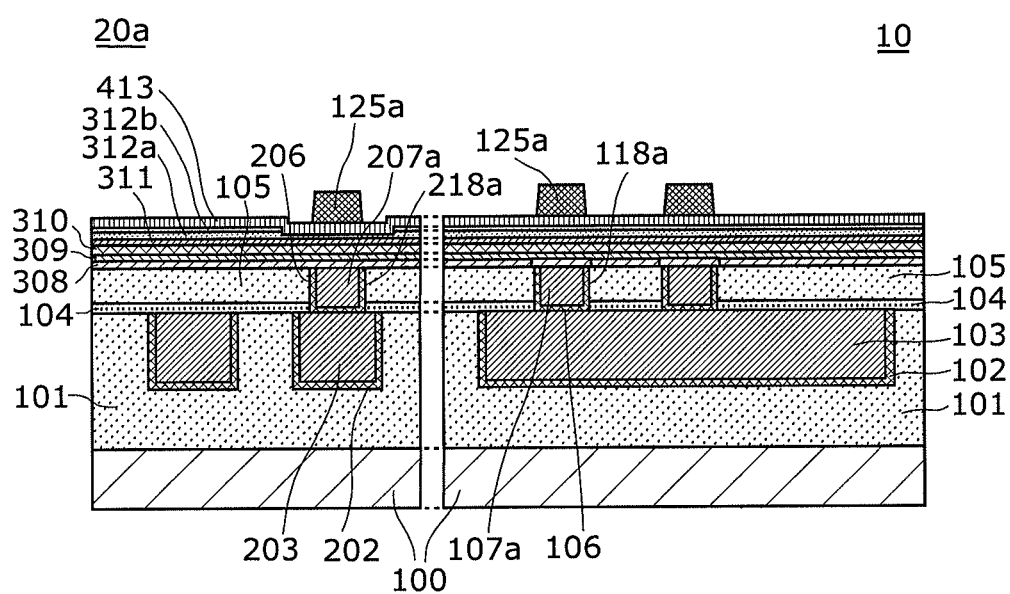
[FIG.23]

Next, as shown in FIG. 23, the hard mask layer 325 is patterned using the second resist mask pattern 131c to form a hard mask layer 125a. Next, the second resist mask pattern 131c is removed by performing an ashing process.

Figure 24:
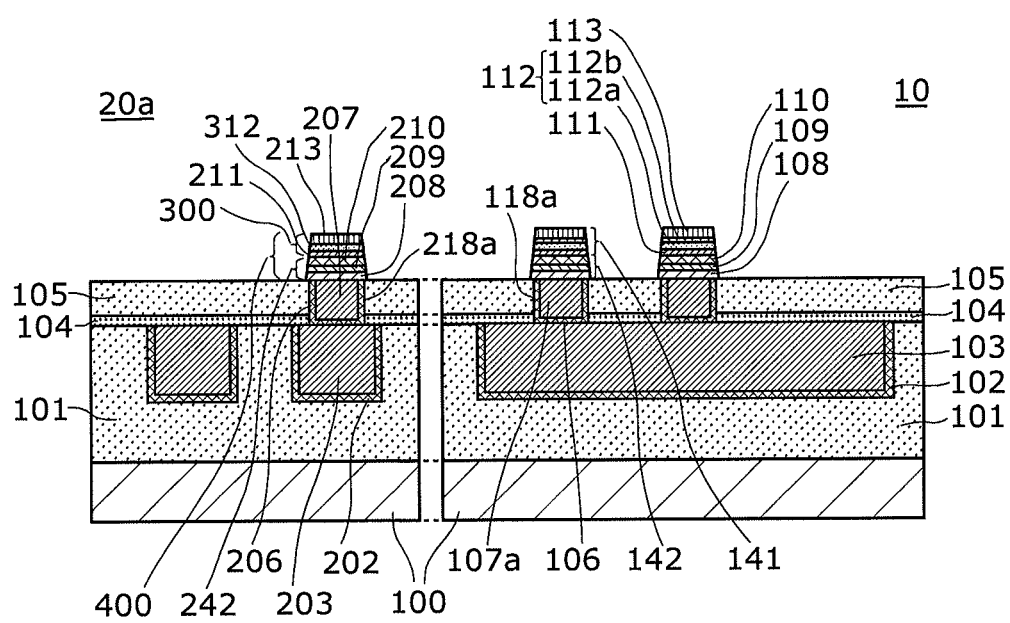
[FIG.24]

Next, as shown in FIG. 24, the variable resistance element 141 and the resistor 300 are simultaneously formed by patterning, with dry etching, the second upper electrode layer 413, the second oxide layer 312b, the first oxide layer 312a, and the second lower electrode layer 311, using the hard mask layer 125a. By sequentially patterning, with dry etching, the first upper electrode layer 310, the current steering layer 309, and the first upper electrode layer 308, a first current steering element 142 and a second current steering element 242 are formed at the same time. Next, the hard mask layer 125a is removed by etching or the like. Here, there is no need to always remove the hard mask layer 125a, and it may be maintained as necessary. In this way, it is possible to form the second current steering element 242 having the same form as that of the first current steering element 142 included in each memory cell 11 and having the same current steering characteristics as those of the same, in the layer in which the first current steering element 142 is formed.

Figure 25:
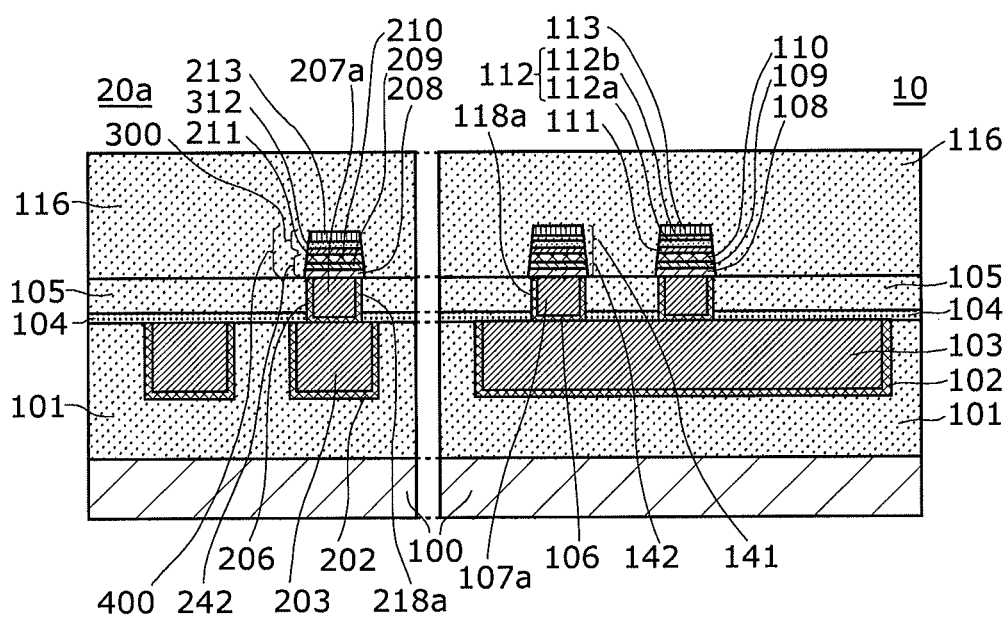
[FIG.25]
Figure 26:
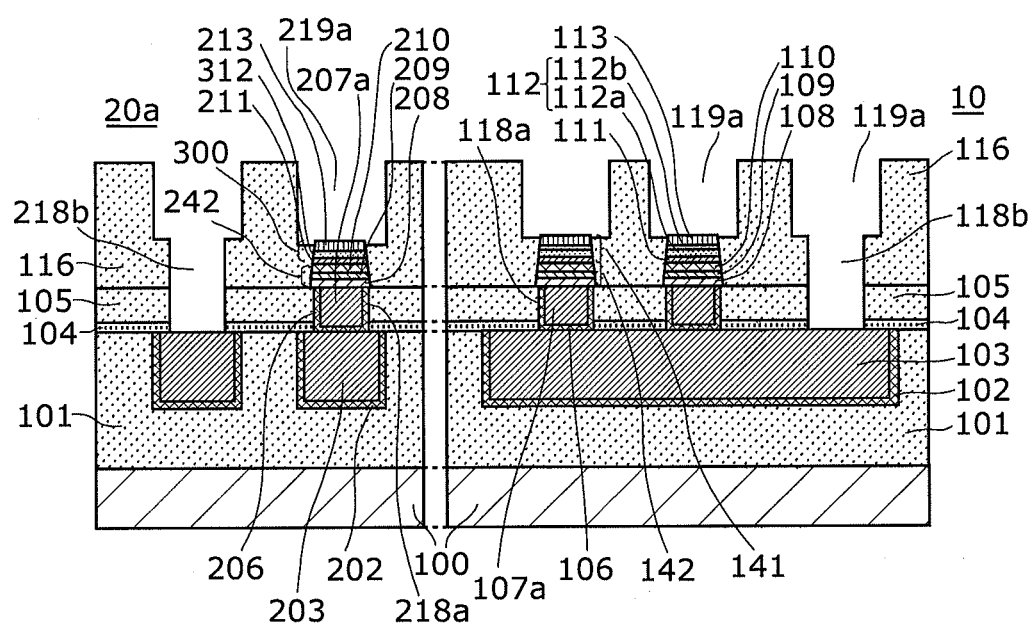
[FIG.26]

Next, as shown in FIGS. 25 and 26, a third interlayer dielectric 116 is formed to cover the variable resistance element 141, the first current steering element 142, the resistor 300, and the second current steering element 242. Next, wiring gutters 119a and 219a and contact holes 218b and 118b are formed in the third interlayer dielectric 116. The wiring gutters 119a and 219a are for forming a second line 119 and a fourth line 219 which are connected to the upper electrode layer 113 included in the variable resistance element 141 and the fourth upper electrode layer 213 included in the resistor 300. More specifically, processes similar to the processes as known from FIGS. 12 and 13 are performed.

Figure 27:
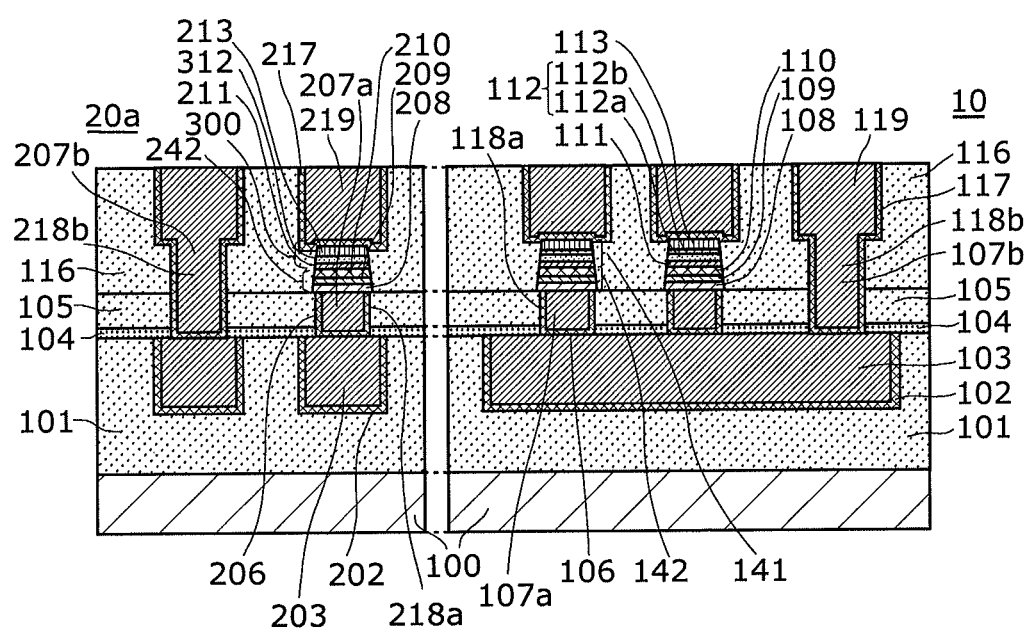
[FIG.27]
Figure 28:
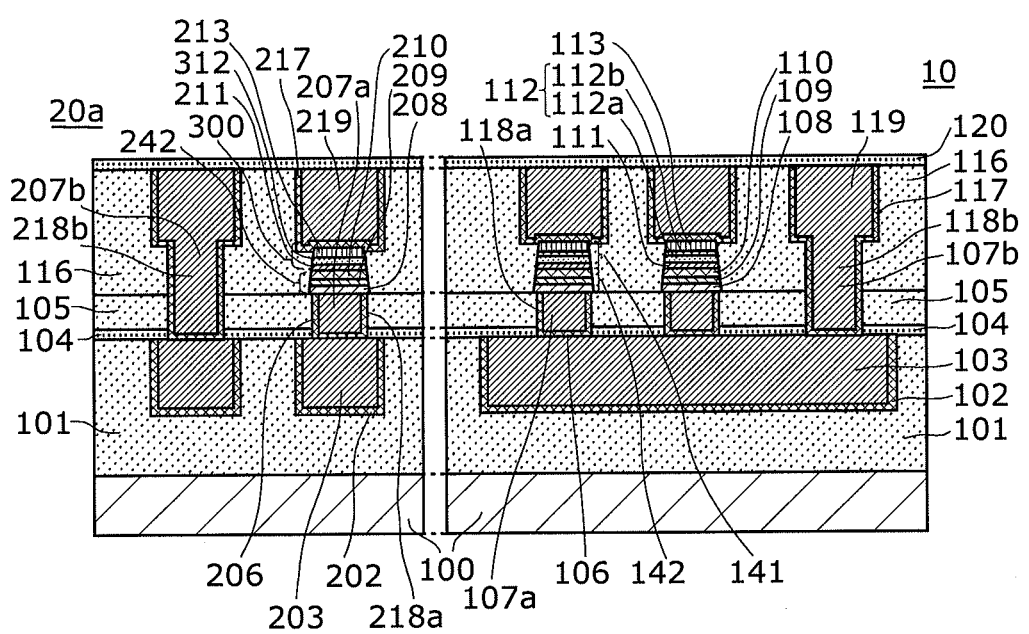
[FIG.28]

Next, as shown in FIG. 27, third barrier metal layers 117 and 217 and cupper (50 nm to 300 nm) for a material for wiring are deposited using a sputtering method in the contact holes 118b and 218b and the wiring gutters 119a and 219a. Conditions used here are the same as those in the process for embedding the first line 103 and the third line 203 as shown in FIG. 17. Next, by further depositing cupper as a seed using an electroplating method or the like, the contact holes 118b and 218b and the wiring gutters 119a and 219a are fully filled with the cupper as the material for wiring and the third barrier metal layers 117 and 217. Next, by removing unnecessary part of cupper on the surface and unnecessary part of the third barrier metal layers 117 and 217 using a CMP method, the second line 119 and the fourth line 219 are formed to have a flat surface which is flush with the surface of the third interlayer dielectric 116.

Next, as shown in FIG. 23, a second liner layer 120 is formed above the second line 119, the fourth line 219, and the third interlayer dielectric 116, so as to cover the second line 119 and the fourth line 219.

As described above, the use of the method for manufacturing the non-volatile memory device according to this embodiment makes it possible to manufacture a stable non-volatile memory device.

In addition, in the same manner as in Embodiment 1, the non-volatile memory device manufacturing method according to this embodiment is highly compatible with increasingly finer semiconductor manufacturing processes.

[Variation of Embodiment 2]

Next, a variation of Embodiment 2 of the present invention is described.

Figure 29:
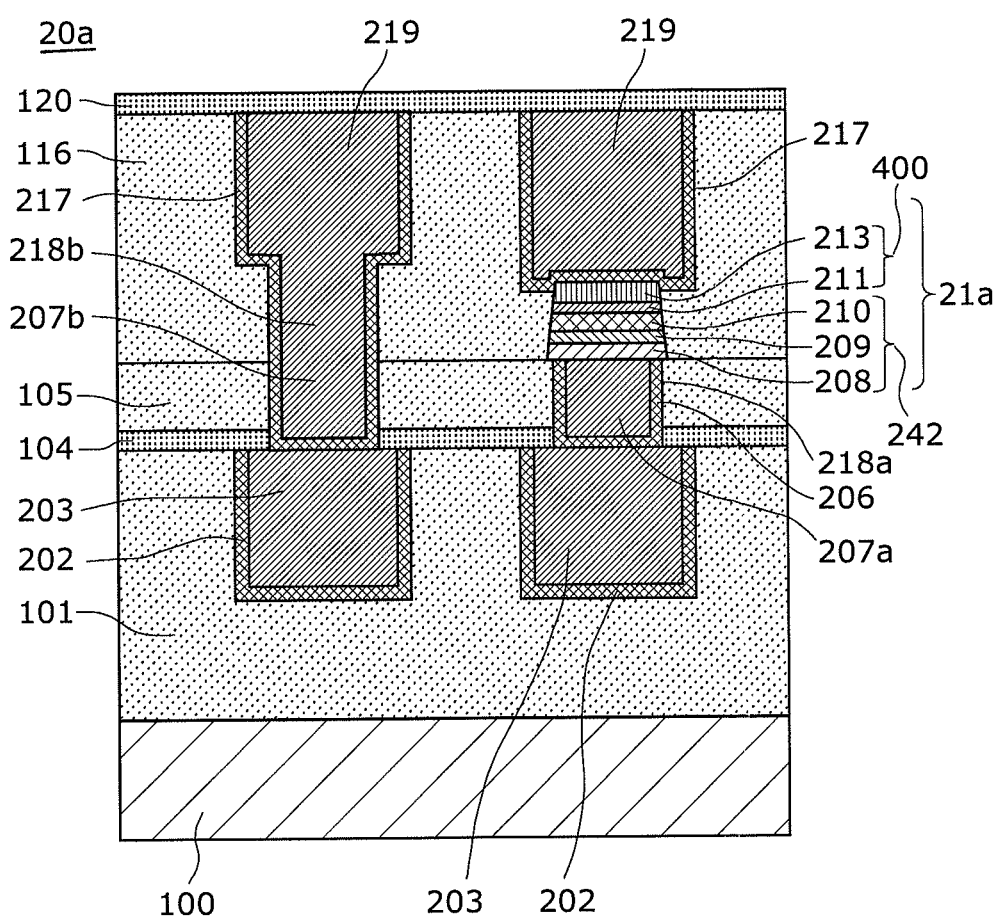
[FIG.29]

FIG. 29 is a cross-sectional diagram showing an exemplary structure of the current steering element parameter generation circuit 20a according to this variation. FIG. 29 is a cross-sectional view when the cross section along an alternate long and short dash line between C-C' in FIG. 2 is seen in the direction shown by the arrows.

A current steering element parameter generation circuit 20a in this variation includes a resistor 400 formed between a second current steering element 242 and a fourth line 219. The resistor 400 includes a fourth lower electrode layer 211 formed above the second upper electrode layer 210 and a fourth, upper electrode layer 213 formed above the fourth lower electrode layer 211, in contact with the fourth lower electrode layer 211. The third lower electrode layer 111 and the fourth lower electrode layer 211 have the same composition, and the third upper electrode layer 113 and the fourth upper electrode layer 213 have the same composition.

More specifically, the reference cell 21a shown in FIG. 29 does not include any resistance layer 312, unlike the reference cell 21a shown in FIGS. 16A and 16B.

The second current steering element 242 includes a second lower electrode layer 208, a second current steering layer 209, and a second upper electrode layer 210. The second current steering element 242 in the reference cell 21a in FIG. 29 is structurally the same as the second current steering element 242 in the reference cell 21a in each of FIG. 16A and FIG. 16B. However, in the reference cell 21a in FIG. 29, the resistor 400 is only composed of a fourth lower electrode layer 211 and a fourth upper electrode layer 213 without including any resistance layer 312.

Since only the upper and lower electrode layers are formed above the second current steering element 242 in the reference cell 21a and no metal oxide layer is formed above the second current steering element 242, the reference cell 21a is in an extremely low resistance state. For this reason, it is possible to detect current steering characteristics of the second current steering element 242 with a high sensitivity. Accordingly, for example, the current steering element parameter generation circuit 20a including the reference cell 21a is a circuit for generating a voltage to be applied to the memory cell 11, it is possible to detect current steering characteristics of the second current steering element 242 and to therewith compensate fluctuation in current steering characteristics of the first current steering element 142 of the memory cell 11. As a result, it is possible to apply a voltage optimum for causing the memory cells 11 to operate in different non-volatile memory devices, and to thereby reduce operation errors in the non-volatile memory devices and fluctuation in current steering characteristics.

Next, a method for manufacturing a non-volatile memory device according to this variation is described.

A non-volatile memory device manufacturing method according to this variation is different in the processes shown in FIGS. 20 and 21, from the non-volatile memory device manufacturing method shown in FIGS. 17 to 28.

The non-volatile memory device manufacturing method according to this variation is intended to form an additional second upper electrode layer 413 in a process of forming the second upper electrode layer 413. First, the second upper electrode layer 413, a second oxide layer 312b, and a first oxide layer 312a are sequentially removed in an area in which a second current steering element 242 is formed, and then the additional second upper electrode layer 413 is formed above the firstly-formed second upper electrode layer 413 and a second lower electrode layer 311 exposed by the sequential removal.

Here, in the process of forming the second upper electrode layer 413, the second upper electrode layer 413 before the removal has a film thickness smaller than that of the second upper electrode layer 413 formed after the removal.

More specifically, the non-volatile memory device manufacturing method according to this variation is intended to simultaneously perform dry etching on the second upper electrode layer 413 and the second oxide layer 312b and further the first oxide layer 312a in the process shown in FIG. 20, so as to expose the second lower electrode layer 311. In the process shown in FIG. 21, the second upper electrode layer 413 is deposited not only above the second upper electrode layer 413 and the second oxide layer 312b, but also above the second lower electrode layer 311. In this way, the layers corresponding to the variable resistance layer 112 are fully removed by etching in the area in which the reference cell 21a is formed. Thus, it is also good to use, as an etching gas for dry etching the second metal oxide layer 312b and the first metal oxide layer 312a in FIG. 20, a gas which damages metal oxides when applied to the metal oxides in etching, and thereby changes the metal oxides into a high resistance state.

[Embodiment 3]

Descriptions are given of a structure of a non-volatile memory device according to Embodiment 3 of the present invention and a method for manufacturing the same. Hereinafter, differences from Embodiment 1 are mainly described.

Figure 30A:
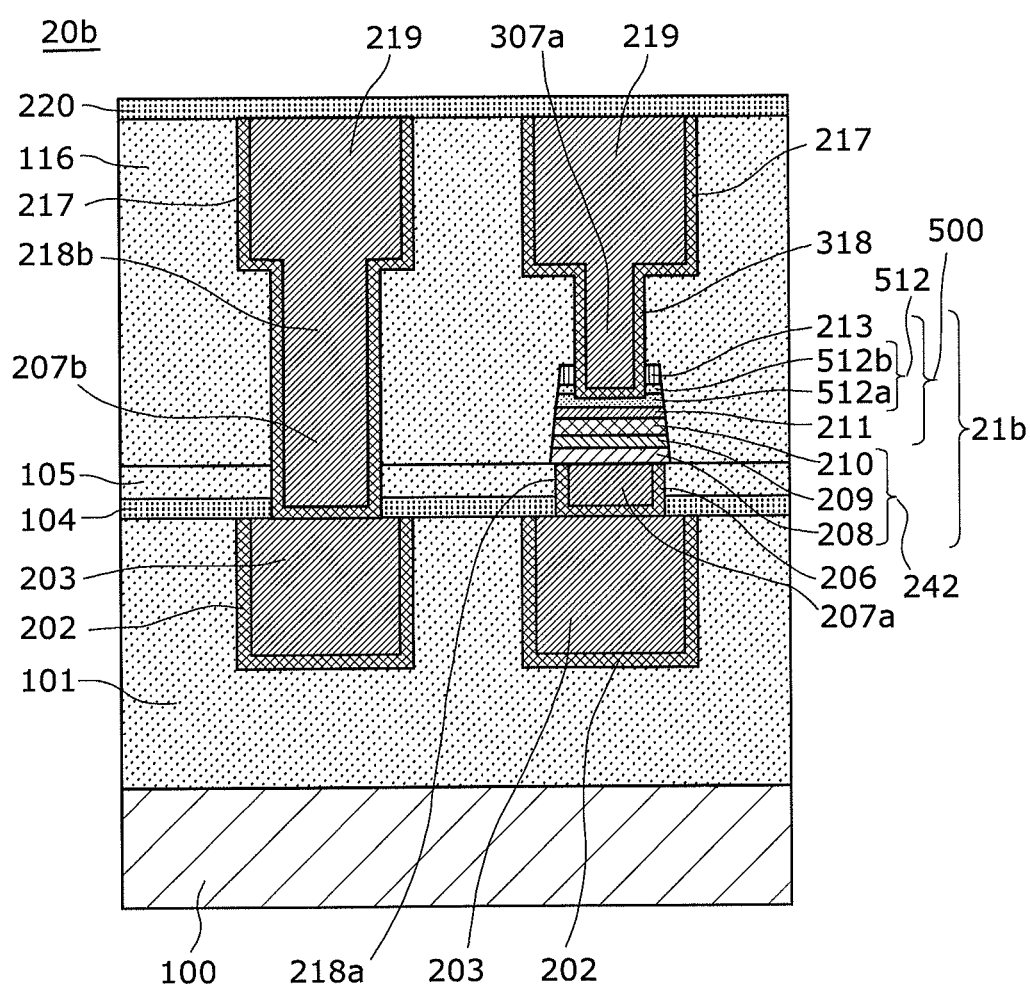
[FIG.30A]
Figure 30B:
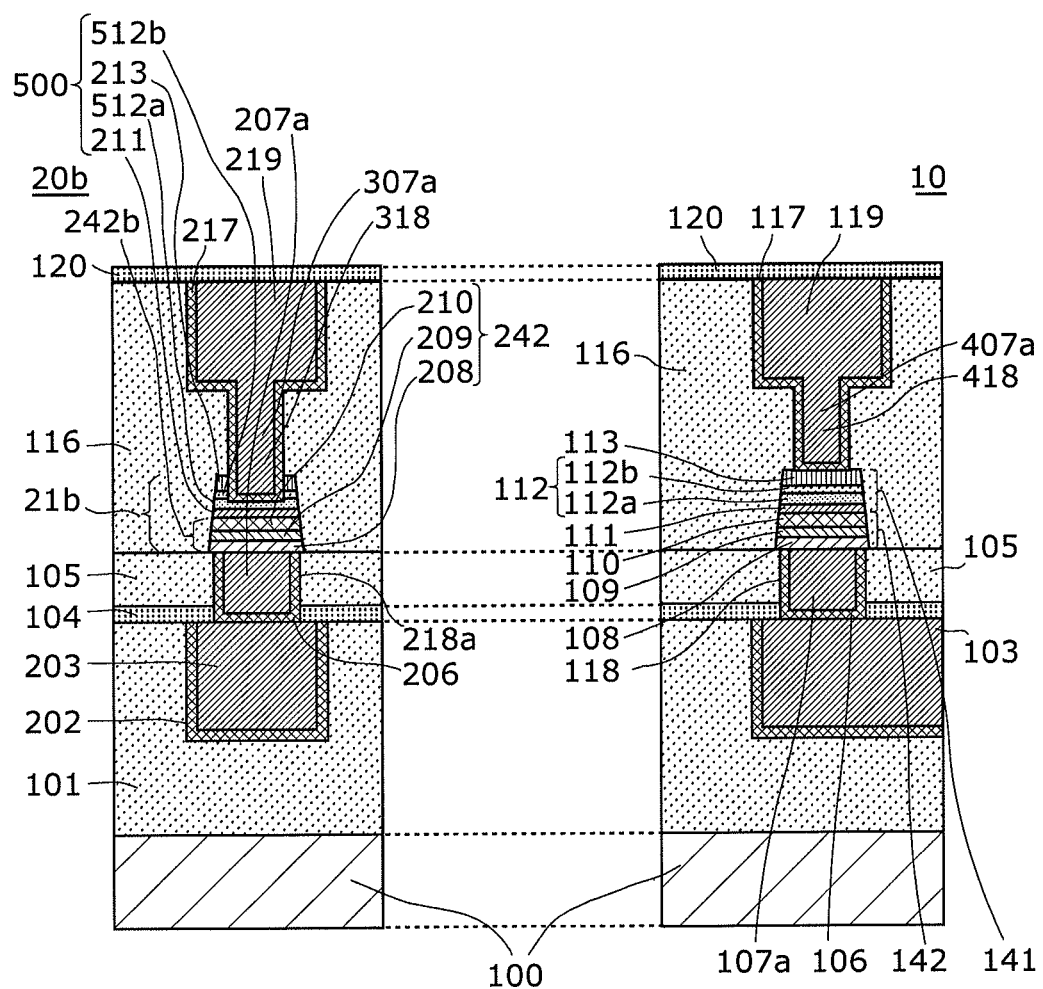
[FIG.30B]

FIG. 30A is a cross-sectional diagram showing an exemplary structure of a current steering element parameter generation circuit 20b according to this embodiment. FIG. 30B is a cross-sectional view of an exemplary structure of the non-volatile memory device according to this embodiment. FIG. 30A is a cross-sectional view of the cross section along the alternate long and short dash line shown in the C-C' in FIG. 2 when seen in the arrow direction. FIG. 30B is a cross-sectional view of the cross section along the alternate long and short dash line shown in the D-D' in FIG. 2 when seen in the arrow direction.

The current steering element parameter generation circuit 20b includes a resistor 500 formed between a second current steering element 242 and a fourth line 219. The resistor 500 includes a fourth lower electrode 211 formed above a second upper electrode layer 210, a resistance layer 512 which is a stack of a first oxide layer (third oxide layer) 512a including a first metal oxide and formed above a fourth lower electrode layer 211, and a second oxide layer (fourth oxide layer) 512b including a second metal oxide, and a fourth upper electrode layer 213, formed above the resistance layer 512. In the resistor 500, a plug 307a connected to the fourth line 219 and a contact hole 318 which is a contact are formed penetrating through the fourth upper electrode layer 213 and the second oxide layer 512b. The third lower electrode layer 111 and the fourth lower electrode layer 211 have the same composition and the same film thickness, the third upper electrode layer 113 and the fourth upper electrode layer 213 have the same composition, the first oxide layer 512a and the first oxide layer 112a have the same composition and the same film thickness, and the second oxide layer 512b and the second oxide layer 112b have the same composition and the same film thickness.

The non-volatile memory device according to this embodiment is described in detail below.

The current steering element parameter generation circuit 20b is formed to include integrated reference cells 21b, and includes a plurality of third lines 203, a plurality of fourth lines 219, a plurality of resistors 500, and a plurality of second current steering elements 242

Unlike each of the memory cells 11 in each of FIGS. 3A, 3B, and 3C, each of the reference cells 21b shown in each of FIGS. 30A and 30B is formed to include a contact hole 318 penetrating through the third upper electrode layer 113 and the second oxide layer 112b and a plug 307a which is electrically connected to the first oxide layer 112a.

Unlike each of the memory cells 11 in each of FIGS. 3A, 3B, and 3C, each of the memory cells 11 shown in each of FIGS. 30A and 30B is formed to include a contact hole 418 and a plug 407a between the fourth line 219 and the variable resistance element 141.

The reference cell 21b includes the second current steering element 242 and the resistor 500 including the fourth lower electrode layer 211, the resistance layer 512, and the fourth upper electrode layer 213. The resistance layer 512 includes the first oxide layer 512a and the second oxide layer 512b.

Unlike each of the reference cells 21 in each of FIGS. 3A, 3B, and 3C, each of the reference cells 21b shown in FIG. 30A and FIG. 30B is formed to include the resistor 500 formed between the fourth line 219 and the second current steering element 242. Furthermore, this reference cell further includes: a contact hole 318 which penetrates through the fourth upper electrode layer 213 and the second oxide layer 512b to reach the first oxide layer 512a; and a plug 307a which is filled in the contact hole 318, and electrically connects the fourth line 219 and the first oxide layer 512a.

The fourth lower electrode layer 211 is formed in the same process in which the third lower electrode layer 111 is formed, and has the same composition and film thickness as those of the third lower electrode layer 111. The fourth upper electrode layer 213 is formed in the same process in which the third upper electrode layer 113 is formed, and has the same composition as that of the third upper electrode layer 113.

The resistance layer 512 is formed in the same process in which the variable resistance layer 112 is formed, and has the same composition and film thickness as those of the variable resistance layer 112. Thus, the first oxide layer 512a is formed in the same process in which the first oxide layer 112a is formed, and has the same composition and film thickness as those of the first oxide layer 112a. Similarly, the second oxide layer 512b is formed in the same process in which the second oxide layer 112b is formed, and has the same composition and film thickness as those of the second oxide layer 112b. In this way, the fourth line 219 is connected to the first oxide layer 512a which has an electrically low resistance in the reference cell 21b. Thus, the resistance layer 512 has a resistance value which is sufficiently lower than that of the variable resistance layer 112 included in the variable resistance layer 141. Therefore, the resistance layer 512 does not perform any variable resistance operation even when a voltage causing the variable resistance element 141 to operate is applied to the resistance layer 512. Accordingly, the resistor 500 is a fixed resistance element having a low resistance value.

The second current steering element 242 included in the reference cell 21b and the first current steering element 142 included in the memory cell 11 are formed in the same process, and thus are in the same layer and have the same form.

For example, in the case of using a tantalum oxide as an oxygen-deficient metal oxide, it is possible to set the resistance value of the resistor 500 to 10 kΩ or below because each of the first oxide layer 112a which is a layer having a low oxygen content atomic percentage (a high oxygen-deficient layer) and the resistance layer 512a (TaO$_x$) has an oxygen content atomic percentage from 44.4 atm % to 55.5 atom % (0.8≤x≤1.9). When the first current steering element 142 has a characteristic of requiring a voltage of 1 V to flow a current of 1 μA, each memory cell 11 includes the variable resistance layer 112 including a second oxide layer 112b (TaO$_y$) (2.1≤y≤2.5) which is a layer having a high oxygen content atomic percentage from 67.7 atm % to 71.4 atm %, thus the initial resistance value of the variable resistance element 141 is 10 MΩ or more. Therefore, it is difficult to detect the current steering characteristics of the memory cell 11. On the other hand, the resistance layer 512 in each reference cell 21b has a resistance value of 10 kΩ which is sufficiently low. Thus, it is possible to fully detect the current steering characteristics of the memory cell 11. In this way, it is possible to detect the current steering characteristics of the memory cell 11 by determining the current steering characteristics of the reference cell 21b without directly determining the current steering characteristics of the memory cell 11.

As described above, the non-volatile memory device according to this embodiment is stable for the same reason as in Embodiment 1.

Next, a description is given of a method for manufacturing the aforementioned non-volatile memory device, specifically, a method for manufacturing a memory cell array 10 and a current steering element parameter generation circuit 20b.

Each of FIG. 31 to FIG. 40 is a cross-sectional view for explaining the method for forming the memory cell array 10 and the current steering element parameter generation circuit 20b according to this embodiment. Here, in general, a large number of memory cells 11 and reference cells 21b are formed above the substrate 100. For simplification, in each of FIG. 31 and FIG. 40, two memory cells 11 are formed, and one reference cell 21b is formed. In addition, for easy understanding, the structure is partly magnified.

The non-volatile memory device manufacturing method according to this embodiment is intended to form a contact hole 318 penetrating through a second upper electrode layer 313 and a second oxide layer 312b in an area in which the second current steering element 242 has been formed in a process of forming a second line 119 and a fourth line 219, and then to form, in the contact hole 318, a plug 307a which is to be connected to the fourth line 219 electrically connected to the second current steering element 242.

The method for manufacturing the non-volatile memory device according to this embodiment is described in detail below.

Figure 31:
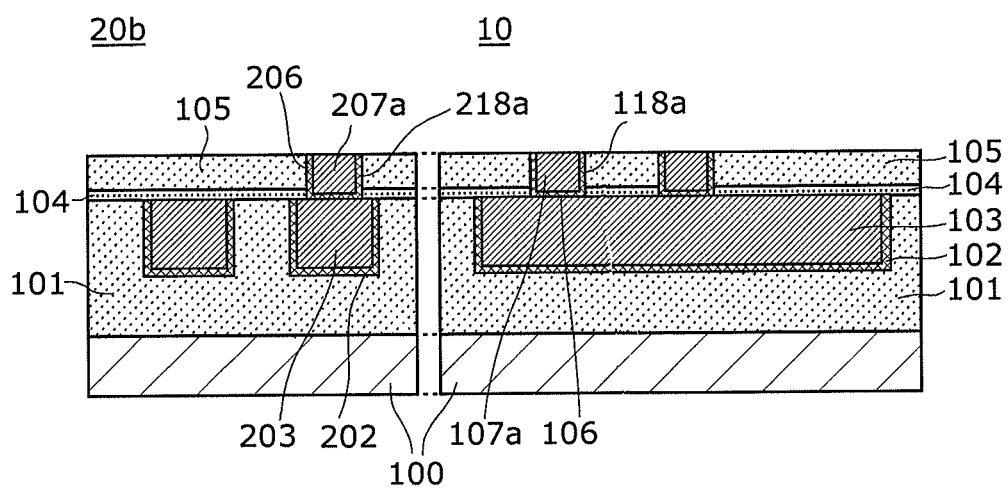
[FIG.31]

First, as shown in FIG. 31, a first line 103 and a third line 203 are formed above the substrate 100 on which transistors are formed in advance, and plugs 107a and 207a are formed above the first line 103 and the third line 203 so as to be connected to the first line 103 and the third line 203. More specifically, processes similar to the processes as known from FIG. 5 are performed.

Figure 32:
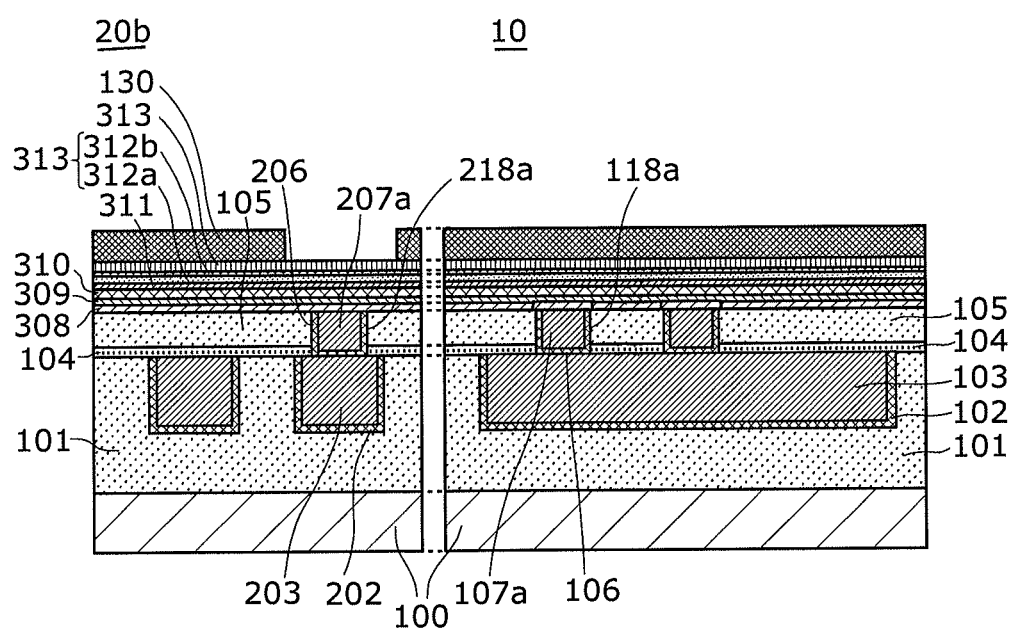
[FIG.32]

Next, as shown in FIG. 32, a first lower electrode layer 308, a current steering layer 309, and a first upper electrode layer 310 are sequentially deposited above the second interlayer dielectric 105 including the plugs 107a and 207a, using a sputtering method. Next, the following are sequentially deposited above the first upper electrode layer 310 using a sputtering method or the like: a second lower electrode layer 311, a first oxide layer 312a, a second oxide layer 312b, and a second upper electrode layer 313. Next, a first resist mask pattern 130 is formed above the second upper electrode layer 313 using photolithography. The first resist mask pattern 130 is for forming a reference cell 21b and thus has an opening in an area in which the reference cell 21b is formed, and is for selectively removing an upper part of the second upper electrode layer 313 in the area.

Figure 33:
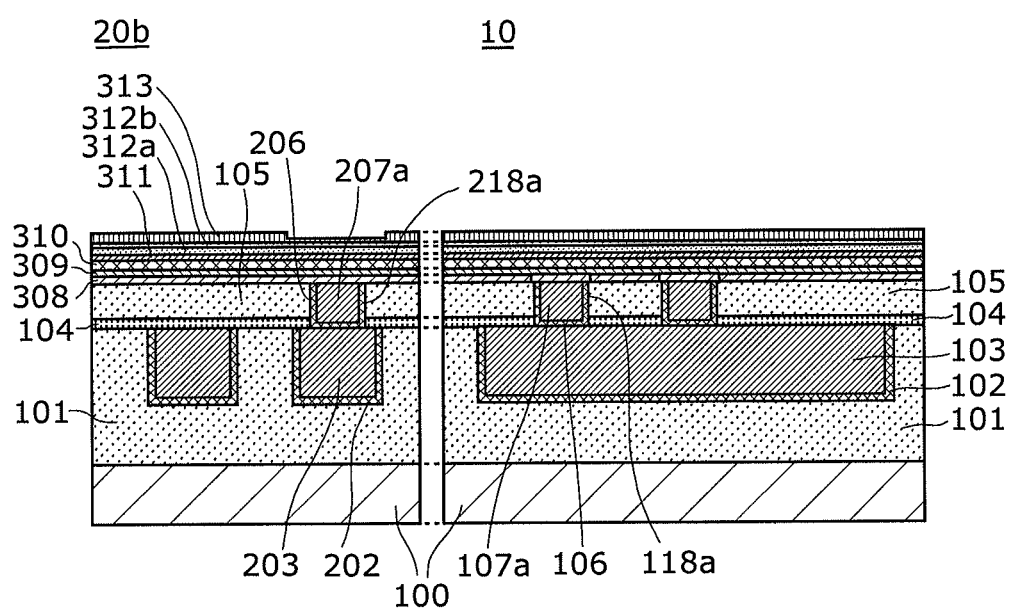
[FIG.33]
Figure 34:
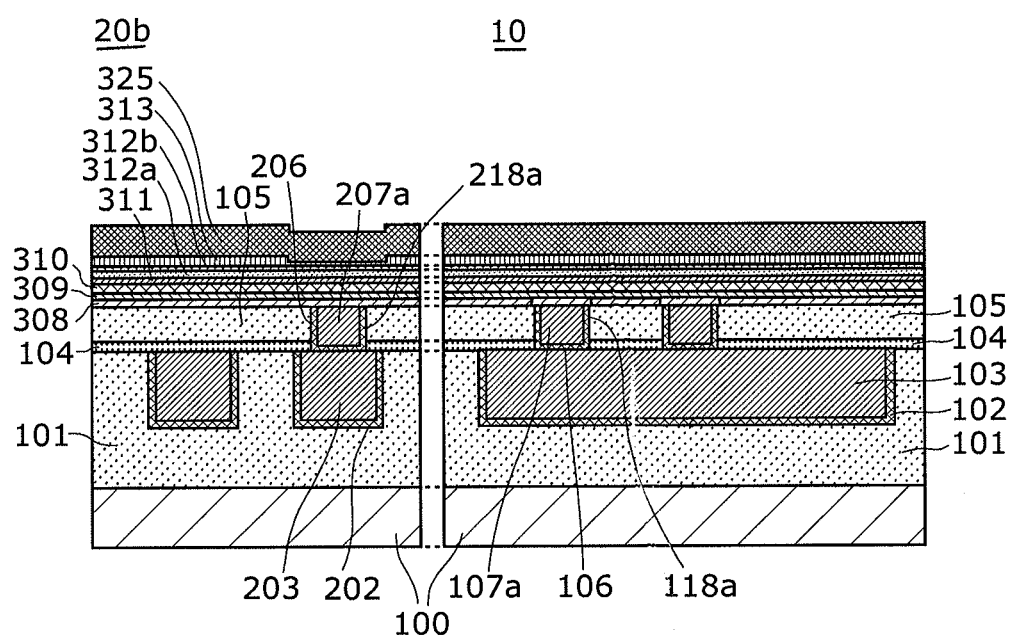
[FIG.34]

Next, as shown in FIG. 33, dry etching is selectively performed on the upper part of the second upper electrode layer 313 using the first resist mask pattern 130 until the second upper electrode layer 313 is partially removed to have a film thickness which is sufficient for allowing a later-formed contact hole 318 to penetrate therethrough. Here, as an example, patterning by etching of the second upper electrode layer 313 is performed until the film thickness of the second upper electrode layer 313 is reduced to 10 nm. Next, the first resist mask pattern 130 is removed.

Next, above the second upper electrode layer 313, a hard mask layer 325 is deposited as a hard mask in dry etching using a sputtering method or the like.

Figure 35:
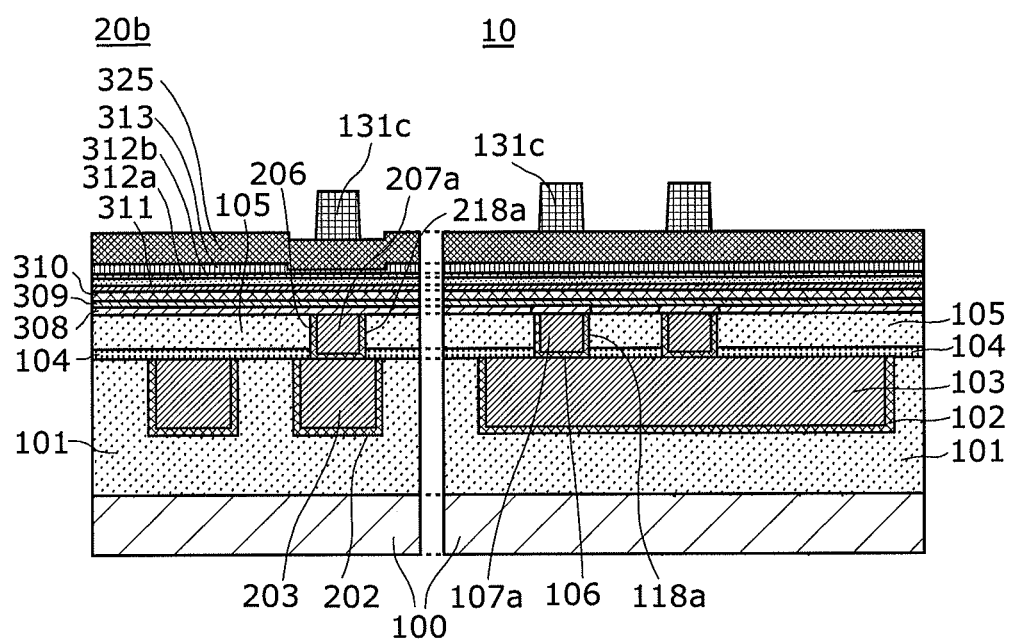
[FIG.35]

Next, as shown in FIG. 35, a dot-shaped second resist mask patterns 131c are formed using photolithography. This second resist mask patterns 131c are for simultaneously forming (i) a variable resistance element 141 and a first current steering element 142 and (ii) a resistor 500 and a second current steering element 242. At this time, the second resist mask patterns 131c forming the first current steering element 142 and the second current steering element 242 may have a same size.

Figure 36:
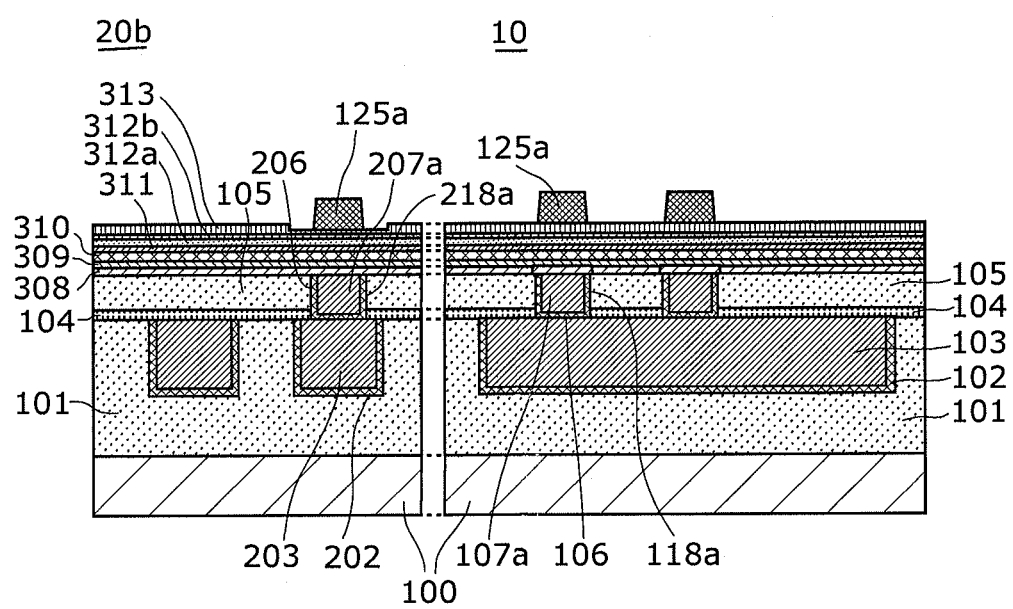
[FIG.36]

Next, as shown in FIG. 36, the hard mask layer 325 is patterned using the second resist mask pattern 131c to form a hard mask layer 125a. Next, the second resist mask pattern 131c is removed by performing an ashing process.

Figure 37:
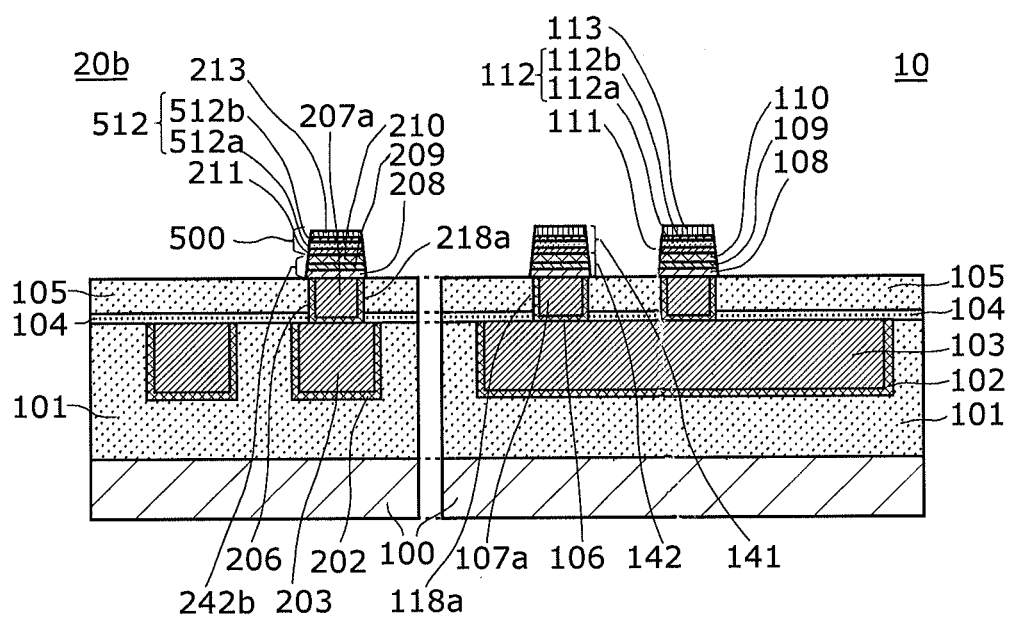
[FIG.37]

Next, as shown in FIG. 37, the variable resistance element 141 and the resistor 500 are simultaneously formed by patterning, with dry etching, the second upper electrode layer 313, the second oxide layer 312b, the first oxide layer 312a, and the second lower electrode layer 311, using the hard mask layer 125a. By sequentially patterning, with dry etching, the first upper electrode layer 310, the current steering layer 309, and the first upper electrode layer 308, a first current steering element 142 and a second current steering element 242 are formed at the same time. Next, the hard mask layer 125a is removed by etching or the like. Here, the hard mask layer 125a does not always need to be removed, and may be maintained as necessary. In this way, it is possible to form the second current steering element 242 having the same form and the same current steering characteristics as those of the first current steering element 142 included in each memory cell 11, in the layer in which the first current steering element 142 is formed.

Figure 38:
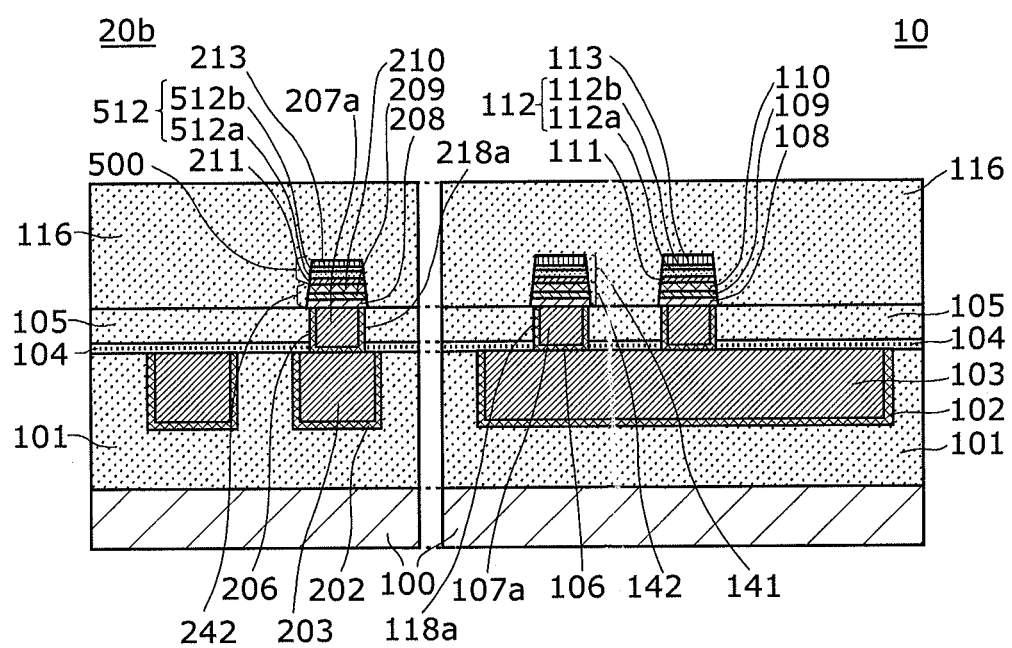
[FIG.38]
Figure 39:
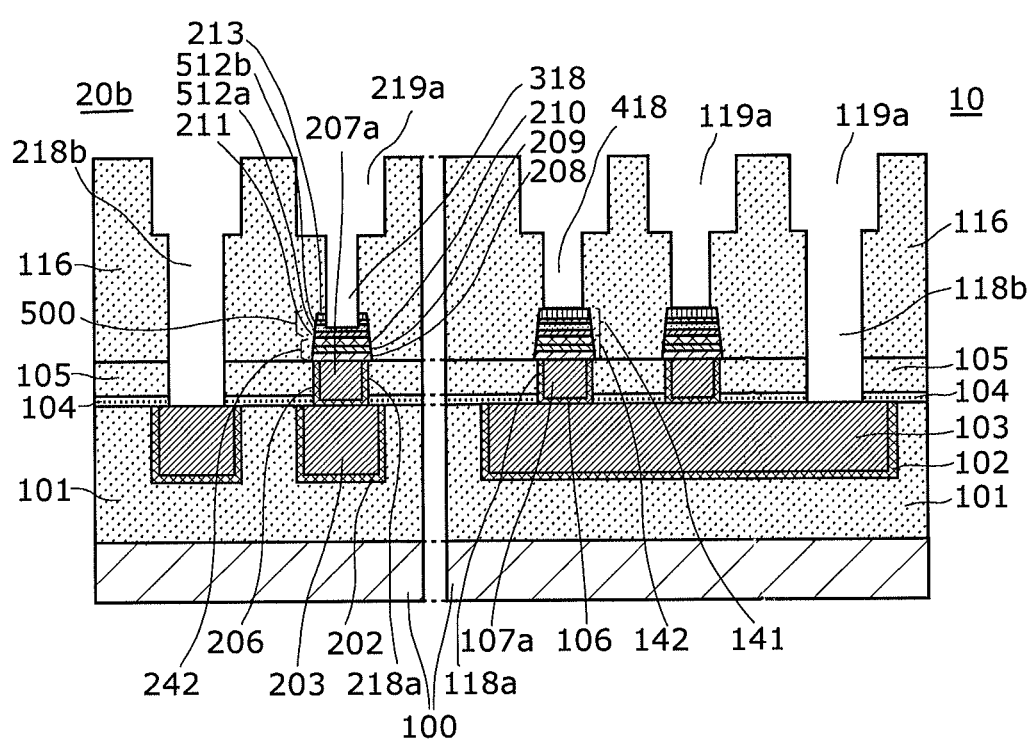
[FIG.39]

Next, as shown in FIGS. 38 and 39, a third interlayer dielectric 116 is formed to cover the variable resistance element 141, the first current steering element 142, the resistor 500, and the second current steering element 242. Next, wiring gutters 119a and 219a and contact holes 218b, 118b, 318, and 418 are formed in the third interlayer dielectric 116. The wiring gutters 119a and 219a are for forming a second line 119 and a fourth line 219 which are connected to the upper electrode layer 113 included in the variable resistance element 141 and the first oxide layer 512a included in the resistor 500

More specifically, as shown in FIG. 38, the third interlayer dielectric 116 for embedding the second line 119 and the fourth line 219 are deposited to cover the variable resistance element 141, the first current steering element 142, the second current steering element 242, and the resistor 500. Next, as shown in FIG. 39, wiring gutters 119a and 219a for embedding the second line 119 and the fourth line 219 are formed in the third interlayer dielectric 116 by photolithography and dry etching. Along with this, contact holes 318 and 418 are formed by photolithography and dry etching. The contact hole 318 is for embedding a plug 307a which is connected to the resistor 500, and the contact hole 418 is for embedding a plug 407a which is connected to the variable resistance element 141. Alternatively, it is good to form the contact hole 318 in a photolithography and dry etching process different from the photolithography and dry etching process for the other contact holes. Furthermore, contact holes 118b and 218b are formed at predetermined positions by photolithography and dry etching. The contact holes 118b and 218b are for forming plugs 107b and 207b which are connected to the first line 103 and the third line 203, and the predetermined positions are positions in which the memory cells 11 and the reference cell 21 above the first line 103 and the third line 203 are not formed.

As a general example, the contact holes 118b, 218b, 318 and 418 for plugs 107b, 207b, 307a, and 407a as drawing contacts are formed first by first photolithograph and dry etching, and the wiring gutters 119a and 219a for the second line 119 and the fourth line 219 are formed by second photolithograph and dry etching. However, there is no inconvenience to form the wiring gutters 119a and 219a first.

Figure 40:
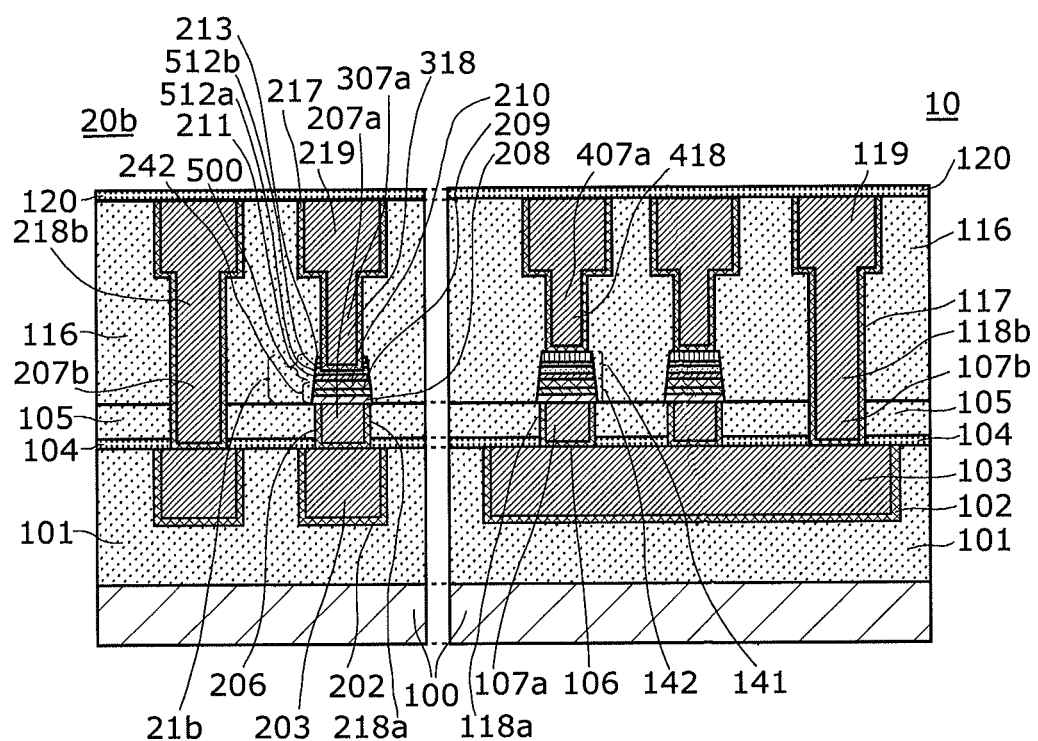
[FIG.40]

Next, as shown in FIG. 40, third barrier metal layers 117 and 217 and cupper (50 nm to 300 nm) for a material for wiring are deposited using a sputtering method in the contact holes 118b, 218b, 318 and 418 and the wiring gutters 119a and 219a. Conditions used here are the same as those in the process for embedding the first line 103 and the third line 203 as shown in FIG. 5. Next, by further depositing cupper as a seed using an electroplating method or the like, the contact holes 118b, 218b, 318 and 418, and the wiring gutters 119a and 219a are fully filled with the cupper as the material for wiring and the third barrier metal layers 117 and 217. Next, by removing unnecessary part of the cupper on the surface and unnecessary part of the third barrier metal layers 117 and 217 using a CMP method, the second line 119 and the fourth line 219 are formed to have a flat surface which is flush with the surface of the third interlayer dielectric 116. Next, a second liner layer 120 is formed above the second line 119, the fourth line 219, and the third interlayer dielectric 116, so as to cover the second line 119 and the fourth line 219.

As described above, the use of the manufacturing method according to this embodiment makes it possible to manufacture a stable non-volatile memory device.

The present invention is not limited to the above-described non-limiting embodiments, and can be improved or modified in various ways within the spirit and scope of the present invention. For example, arbitrary ones of the structural elements in the above embodiments may be combined. Each of the embodiments relates to a structure in which plugs are formed in the lower part of the variable resistance element and the current steering element. However, it is also possible to apply the present invention to a structure in which such plugs are formed only in an upper part thereof or a structure in which such plugs are formed in an upper part and an lower part thereof (a variable resistance element and a current steering element are formed between the plugs formed in the upper and lower parts). These application examples also provide the same advantageous effects which are provided by the above-described embodiments.

Each of the memory cell array and the reference cells are formed in the single layer in each of the embodiments. However, when each of the memory cell arrays is formed in plural layers, reference cells may be formed in the plural layers. In this case, current steering characteristics of the memory cells in each of the layers in each of the memory cell arrays are detected based on current steering characteristics of the reference cells in the corresponding one of the layers.

The reference cells are formed apart from the memory cell array in each of the embodiments, but the reference cells may be formed near the memory cell array. In this case, it is possible to detect current steering characteristics of the memory cells with a high accuracy, based on current steering characteristics of the reference cells.

INDUSTRIAL APPLICABILITY

The present invention is applicable to non-volatile memory devices and methods for manufacturing the same, and particularly to various kinds of electronic devices such as digital home appliances, memory cards, mobile phones, and personal computers.

REFERENCE SIGNS LIST

10 Memory cell array
11 Memory cell
21, 21a, 21b Reference cell
20, 20a, 20b Current steering element parameter generation circuit
100 Substrate
101 First interlayer dielectric
102, 202 First barrier metal layer
103 First line
104 First liner layer
105 Second interlayer dielectric
106, 206 Second barrier metal layer
107, 107b, 207a, 207b, 307a, 407a Plug
108, 308 First lower electrode layer
109 First current steering layer
110, 310 First upper electrode layer
111 Third lower electrode layer
112 Variable resistance layer
112a, 312a, 512a First oxide layer
112b, 312b, 512b Second oxide layer
113 Third upper electrode layer
116 Third interlayer dielectric
117, 217 Third barrier metal layer
118a, 118b, 218a, 218b, 318, 418 Contact hole
119 Second line
119a, 219a Wiring gutter
120 Second liner layer
125, 125a, 325 Hard mask layer
130, 131a First resist mask pattern
131b, 131c Second resist mask pattern
141 Variable resistance element
142 First current steering element
203 Third line
208, 311 Second lower electrode layer
209 Second current steering layer
210, 313, 413 Second upper electrode layer
211 Fourth lower electrode layer
213 Fourth upper electrode layer
219 Fourth line
242 Second current steering element
300, 400, 500 Resistor
309 Current steering layer
312, 512 Resistance layer

The invention claimed is:

1. A non-volatile memory device comprising:
a memory cell array comprising a plurality of memory cells each having a stack structure in which a first current steering element and a variable resistance element are connected in series; and
a current steering element parameter generation circuit (i) comprising a second current steering element for determining a current steering characteristic of the first current steering element, (ii) electrically connected to the memory cell array, and (iii) causing the memory cells to operate,
wherein a first stack is formed in an area including an area in which the memory cell array is formed and an area in which the current steering element parameter generation circuit is formed, the first stack (i) comprising a current steering element lower electrode layer, a current steering layer, and a current steering element upper electrode layer, and (ii) functioning as the first current steering element and as the second current steering element,
a second stack is formed above the first stack, the second stack (i) comprising a variable resistance element lower electrode layer, a first oxide layer comprising a first metal oxide of an oxygen deficient type, a second oxide layer comprising a second metal oxide having a small oxygen deficiency and a high resistance value compared to the first metal oxide, and a variable resistance element upper electrode layer, and (ii) functioning as the variable resistance element, and a part of the second stack is removed to allow the second current steering element and a layer positioned above the second current steering element to be connected in the area in which the current steering element parameter generation circuit is formed without the second oxide layer being interposed therebetween.

2. The non-volatile memory device according to claim 1, further comprising a substrate, wherein the memory cell array comprises:

an interlayer dielectric formed above the substrate;

a plurality of first lines arranged parallel to each other above the substrate between the substrate and the interlayer dielectric;

a plurality of second lines arranged parallel to each other above the interlayer dielectric, and the plurality of second lines three-dimensionally cross the plurality of first lines; and the plurality of memory cells arranged at cross-points of the plurality of first lines and the plurality of second lines in the interlayer dielectric, the current steering element parameter generation circuit comprises:

a third line placed between the substrate and the interlayer dielectric;

a fourth line placed above the interlayer dielectric; and the second current steering element placed between the third line and the fourth line and connected to the third line and the fourth line without the second oxide layer being interposed therebetween, and the first current steering element and the second current steering element have a same non-linear current steering characteristic.

3. The non-volatile memory device according to claim 1, further comprising:

a control circuit;

a write circuit which applies, to one or more predetermined memory cells among the plurality of memory cells, a voltage for writing information to the one or more predetermined memory cells; and a read circuit which applies, to the one or more predetermined memory cells, a voltage for reading the information from the one or more predetermined memory cells, the current steering element parameter generation circuit obtains a non-linear current steering characteristic parameter indicating a non-linear current steering characteristic of the second current steering element, and outputs a non-linear current steering characteristic parameter signal corresponding to the non-linear current steering characteristic parameter to the control circuit, the control circuit generates a control signal for controlling the write circuit and the read circuit based on the non-linear current steering characteristic parameter signal, and outputs the control signal to at least one of the write circuit and the read circuit, and the at least one of the write circuit and the read circuit determines the voltage to be applied to the one or more predetermined memory cells based on the control signal.

4. The non-volatile memory device according to claim 1, wherein a first current steering layer included in the first current steering element and a second current steering layer included in the second current steering element have a same composition and a same film thickness.

5. The non-volatile memory device according to claim 4, wherein the first current steering layer and the second current steering layer are formed in a single process.

6. The non-volatile memory device according to claim 1, wherein each of the memory cells has a structure in which the first current steering element and the variable resistance element are connected in series.

7. The non-volatile memory device according to claim 6, wherein the first current steering element comprises:

a first current steering element lower electrode layer;

a first current steering layer formed above the first current steering element lower electrode layer; and a first current steering element upper electrode layer formed above the first current steering layer, the second current steering element comprises:

a second current steering element lower electrode layer;

a second current steering layer formed above the second current steering element lower electrode layer; and a second current steering element upper electrode layer formed above the second current steering layer, the first current steering element lower electrode layer and the second current steering element lower electrode layer have a same composition and a same film thickness, the first current steering layer and the second current steering layer have a same composition and a same film thickness, and the first current steering element upper electrode layer and the second current steering element upper electrode layer have a same composition and a same film thickness.

8. The non-volatile memory device according to claim 7, wherein the variable resistance element comprises:

a first variable resistance element lower electrode layer formed above the first current steering element upper electrode layer;

a variable resistance layer formed as a stack of a first oxide layer comprising a first metal oxide of an oxygen deficient type formed above the first variable resistance lower electrode layer and a second oxide layer comprising a second metal oxide having a small oxygen deficiency and a high resistance value compared to the first metal oxide; and a first variable resistance element upper electrode layer formed above the variable resistance layer.

9. The non-volatile memory device according to claim 8, wherein the first variable resistance element upper electrode layer comprises a noble metal comprising iridium, platinum, or palladium.

10. The non-volatile memory device according to claim 8, wherein each of the first metal oxide and the second metal oxide comprises a tantalum oxide $TaO_x$ ($0 < x < 2.5$), a hafnium oxide $HfO_x$ ($0 < x < 2.0$), or a zirconium oxide $ZrO_x$ ($0 < x < 2.0$).

11. The non-volatile memory device according to claim 8, wherein the current steering element parameter generation circuit comprises a resistor formed between the second current steering element and the fourth line, the resistor comprises:

a second variable resistance element lower electrode layer formed above the second current steering element upper electrode layer;

a resistance layer formed above the second variable resistance element lower electrode layer, comprising the first metal oxide, and not comprising the second metal oxide; and a second variable resistance element upper electrode layer formed above the resistance layer, the first variable resistance element lower electrode layer and the second variable resistance element lower electrode layer have a same composition and a same film thickness, and the first variable resistance element upper electrode layer and the second variable resistance element upper electrode layer have a same composition.

12. The non-volatile memory device according to claim 8, wherein the current steering element parameter circuit comprises a resistor formed between the second current steering element and the fourth line, the resistor comprises:

a second variable resistance element lower electrode layer formed above the second current steering element upper electrode layer; and a second variable resistance element upper electrode layer formed above the second variable resistance element lower electrode layer and in contact with the second variable resistance element lower electrode layer, the first variable resistance element lower electrode layer and the second variable resistance element lower electrode layer have a same composition, and the first variable resistance element upper electrode layer and the second variable resistance element upper electrode layer have a same composition.

13. The non-volatile memory device according to claim 8, wherein the current steering element parameter generation circuit comprises a resistor formed between the second current steering element and the fourth line, the resistor comprises:

a second variable resistance element lower electrode layer formed above the second current steering element upper electrode layer;

a resistance layer formed as a stack of a third oxide layer comprising the first metal oxide formed above the second variable resistance element lower electrode layer and a fourth oxide layer comprising the second metal oxide; and a second variable resistance element upper electrode layer formed above the resistance layer, the resistor further comprises a contact connected to the fourth line, the contact penetrating through the second variable resistance element upper electrode layer and the fourth oxide layer, the first variable resistance element lower electrode layer and the second variable resistance element lower electrode layer have a same composition and a same film thickness, the first variable resistance element upper electrode layer and the second variable resistance element upper electrode layer have a same composition, the third oxide layer and the first oxide layer have a same composition and a same film thickness, and the fourth oxide layer and the second oxide layer have a same composition and a same film thickness.

14. A method for manufacturing a non-volatile memory device, wherein the non-volatile memory device comprises:

a memory cell array comprising a plurality of memory cells each having a stack structure in which a first current steering element and a variable resistance element are connected in series; and a current steering element parameter generation circuit (i) comprising a second current steering element for determining a current steering characteristic of the first current steering element, (ii) electrically connected to the memory cell array, and (iii) causing the memory cells to operate, the method for manufacturing the non-volatile memory device comprising:

forming a first stack in an area including an area in which the memory cell array is formed and an area in which the current steering element parameter generation circuit is formed, the first stack (i) comprising a current steering element lower electrode layer, a current steering layer, and a current steering element upper electrode layer, and (ii) being for forming the first current steering element and the second current steering element;

forming a second stack above the first stack in the area including the area in which the memory cell array is formed and the area in which the current steering element parameter generation circuit is formed, the second stack (i) comprising a variable resistance element lower electrode layer, a first oxide layer comprising a first metal oxide of an oxygen deficient type, a second oxide layer comprising a second metal oxide having a small oxygen deficiency and a high resistance value compared to the first metal oxide, and a variable resistance element upper electrode layer, and (ii) being for forming the variable resistance element; and removing a part of or an entirety of the second stack to allow the second current steering element and a layer positioned above the second current steering element to be connected in an area in which the second current steering element is formed without the second oxide layer being interposed therebetween.

15. The method for manufacturing a non-volatile memory device, according to claim 14, the method comprising:

forming the current steering element lower electrode layer above the substrate;

forming the current steering layer above the current steering element lower electrode layer;

forming the current steering element upper electrode layer above the current steering layer;

forming the variable resistance element lower electrode layer above the current steering element upper electrode layer;

forming the first oxide layer above the variable resistance element lower electrode layer, and forming the second oxide layer above the first oxide layer;

forming the variable resistance element upper electrode layer above the second oxide layer;

forming the variable resistance element by patterning the variable resistance element upper electrode layer, the first oxide layer, the second oxide layer, and the variable resistance element lower electrode layer, and subsequently forming, at the same time, (i) the first current steering element formed below to be in contact with the variable resistance element, and (ii) the second current steering element isolated from the variable resistance element, by patterning the current steering element upper electrode layer, the current steering layer, and the current steering element lower electrode layer; and forming a line electrically connected to the first current steering element and the variable resistance element and a line electrically connected to the second current steering element, wherein in the forming by patterning of the first current steering element and the second current steering element, a same mask is used in patterning for forming the variable resistance element and in patterning for forming the first current steering element, and the second oxide layer is selectively removed in the area in which the second current steering element is formed, in any one of the forming of the variable resistance element upper electrode layer, the forming by patterning of the first current steering element and the second current steering element, and the forming of lines.

16. The method for manufacturing a non-volatile memory device, according to claim 15, wherein in the forming by patterning of the first current steering element and the second current steering element, the variable resistance element upper electrode layer, the first oxide layer, and the second oxide layer in the area in which the second current steering element is formed are removed when the variable resistance element is formed.

17. The method for manufacturing a non-volatile memory device, according to claim 15, wherein in the forming of the variable resistance element upper electrode layer, the variable resistance element upper electrode layer and the second oxide layer are sequentially removed in the area in which the second current steering element is formed, and the variable resistance element upper electrode layer is re-formed above the variable resistance element upper electrode layer and the first oxide layer which has been exposed by the removal.

18. The method for manufacturing a non-volatile memory device, according to claim 15, wherein in the forming of the variable resistance element upper electrode layer, the variable resistance element upper electrode layer, the second oxide layer, and the first oxide layer are sequentially removed in the area in which the second current steering element is formed, and the variable resistance element upper electrode layer is re-formed above the variable resistance element upper electrode layer and the variable resistance element lower electrode layer which has been exposed by the removal.

19. The method for manufacturing a non-volatile memory device, according to claim 17, wherein in the forming of the variable resistance element upper electrode layer, the variable resistance element upper electrode layer before the removal has a film thickness smaller than a film thickness of the variable resistance element upper electrode layer which is formed above the variable resistance element upper electrode layer after the removal.

20. The method for manufacturing a non-volatile memory device, according to claim 15, wherein in the forming of lines, a contact hole is formed penetrating through the variable resistance element upper electrode layer and the second oxide layer in the area in which the second current steering element has been formed, and a plug is formed in the contact hole and connected to the line electrically connected to the second current steering element.

21. The method for manufacturing a non-volatile memory device, according to claim 18, wherein in the forming of the variable resistance element upper electrode layer, the variable resistance element upper electrode layer before the removal has a film thickness smaller than a film thickness of the variable resistance element upper electrode layer which is formed above the variable resistance element upper electrode layer after the removal.

* * * * *